(12) United States Patent
Naitou et al.

(10) Patent No.: US 11,433,420 B2
(45) Date of Patent: Sep. 6, 2022

(54) SOLUTION SUPPLY APPARATUS AND SOLUTION SUPPLY METHOD

(71) Applicant: Tokyo Electron Limited, Tokyo (JP)

(72) Inventors: Ryouichirou Naitou, Koshi (JP); Masato Hayashi, Koshi (JP); Hideo Shite, Koshi (JP); Hiroyuki Ide, Koshi (JP); Yosuke Kameda, Koshi (JP); Seiya Totsuka, Koshi (JP); Atsumu Maita, Koshi (JP); Takami Satoh, Koshi (JP); Hirofumi Araki, Koshi (JP); Kentaro Yoshihara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/768,216

(22) PCT Filed: Dec. 7, 2018

(86) PCT No.: PCT/JP2018/045152
§ 371 (c)(1),
(2) Date: May 29, 2020

(87) PCT Pub. No.: WO2019/117043
PCT Pub. Date: Jun. 20, 2019

(65) Prior Publication Data
US 2020/0290080 A1 Sep. 17, 2020

(30) Foreign Application Priority Data

Dec. 12, 2017 (JP) .............................. JP2017-237555
Dec. 4, 2018 (JP) .............................. JP2018-227332

(51) Int. Cl.
*B05C 19/06* (2006.01)
*B05C 11/10* (2006.01)
*H01L 21/67* (2006.01)

(52) U.S. Cl.
CPC .......... *B05C 19/06* (2013.01); *B05C 11/1005* (2013.01); *H01L 21/6715* (2013.01)

(58) Field of Classification Search
USPC ......... 118/52, 612, 302, 319, 320, 712, 663, 118/665; 427/240
See application file for complete search history.

(56) References Cited

U.S. PATENT DOCUMENTS

| 5,565,034 A * | 10/1996 | Nanbu .............. H01L 21/67173 |
| | | 118/668 |
| 6,861,371 B2 * | 3/2005 | Kamikawa ................ B08B 3/02 |
| | | 438/747 |
| 2003/0180471 A1 * | 9/2003 | Takekuma .......... H01L 21/6715 |
| | | 430/271.1 |

FOREIGN PATENT DOCUMENTS

| JP | 2004-327747 A | 11/2004 |
| JP | 2005-051008 A | 2/2005 |

(Continued)

OTHER PUBLICATIONS

International Search Report of the International Searching Authority dated Feb. 26, 2019 for the corresponding International patent application No. PCT/JP2018/045152 (and English translation).

*Primary Examiner* — Yewebdar T Tadesse
(74) *Attorney, Agent, or Firm* — Posz Law Group, PLC

(57) ABSTRACT

A solution supply apparatus is for supplying a treatment solution to a treatment solution discharger which discharges the treatment solution to a treatment object. The solution supply apparatus includes: a supply pipe line connected to the treatment solution discharger; a filter provided on the supply pipe line which filters the treatment solution to remove foreign substances; and a controller. The controller performs a determination of a state of the treatment solution to be supplied to a primary side of the filter and, when the state of the treatment solution is determined to be bad, (Continued)

outputs a control signal for restricting supply of the treatment solution to the primary side of the filter.

20 Claims, 33 Drawing Sheets

(56) References Cited

FOREIGN PATENT DOCUMENTS

| | | | |
|---|---|---|---|
| JP | 2013-211525 | A | 10/2013 |
| JP | 2014-140029 | A | 7/2014 |
| JP | 2015-230899 | * | 12/2015 |
| JP | 2015-230899 | A | 12/2015 |
| JP | 2016-103590 | A | 6/2016 |
| JP | 2017-191821 | A | 10/2017 |

* cited by examiner ical Field

This disclosure relates to a solution supply apparatus and a solution supply method.

BACKGROUND ART

Patent Document 1 discloses a solution treatment apparatus including a treatment solution container which stores a treatment solution, a discharge nozzle which discharges the treatment solution to a substrate to be treated, a supply pipe line which connects the treatment solution container and the discharge nozzle, and a filter which is provided on the supply pipe line and filters the treatment solution. In this apparatus, a part of the treatment solution passing through the filter is discharged from the discharge nozzle, and the remaining treatment solution is returned to the supply pipe line on the primary side of the filter and combined with the treatment solution from the treatment solution container, and the discharge of the treatment solution and the filtration by the filter are performed.

PRIOR ART DOCUMENT

Patent Document

Patent Document 1: JP 2014-140029

DISCLOSURE OF THE INVENTION

Problems to be Solved by the Invention

The technique according to this disclosure enables supply of a treatment solution having cleanliness suitable for manufacture of a micro semiconductor device.

Means for Solving the Problems

An aspect of this disclosure is a solution supply apparatus for supplying a treatment solution to a treatment solution discharger configured to discharge the treatment solution to a treatment object, the solution supply apparatus including: a supply pipe line connected to the treatment solution discharger; a filter provided on the supply pipe line and configured to filter the treatment solution to remove foreign substances; and a controller configured to perform a determination of a state of the treatment solution to be supplied to a primary side of the filter and, when the state of the treatment solution is determined to be bad, to output a control signal for restricting supply of the treatment solution to the primary side of the filter.

Effect of the Invention

According to this disclosure, it is possible to supply a treatment solution having cleanliness suitable for manufacture of a micro semiconductor device.

EMBODIMENTS FOR CARRYING OUT THE INVENTION

Figure 1:
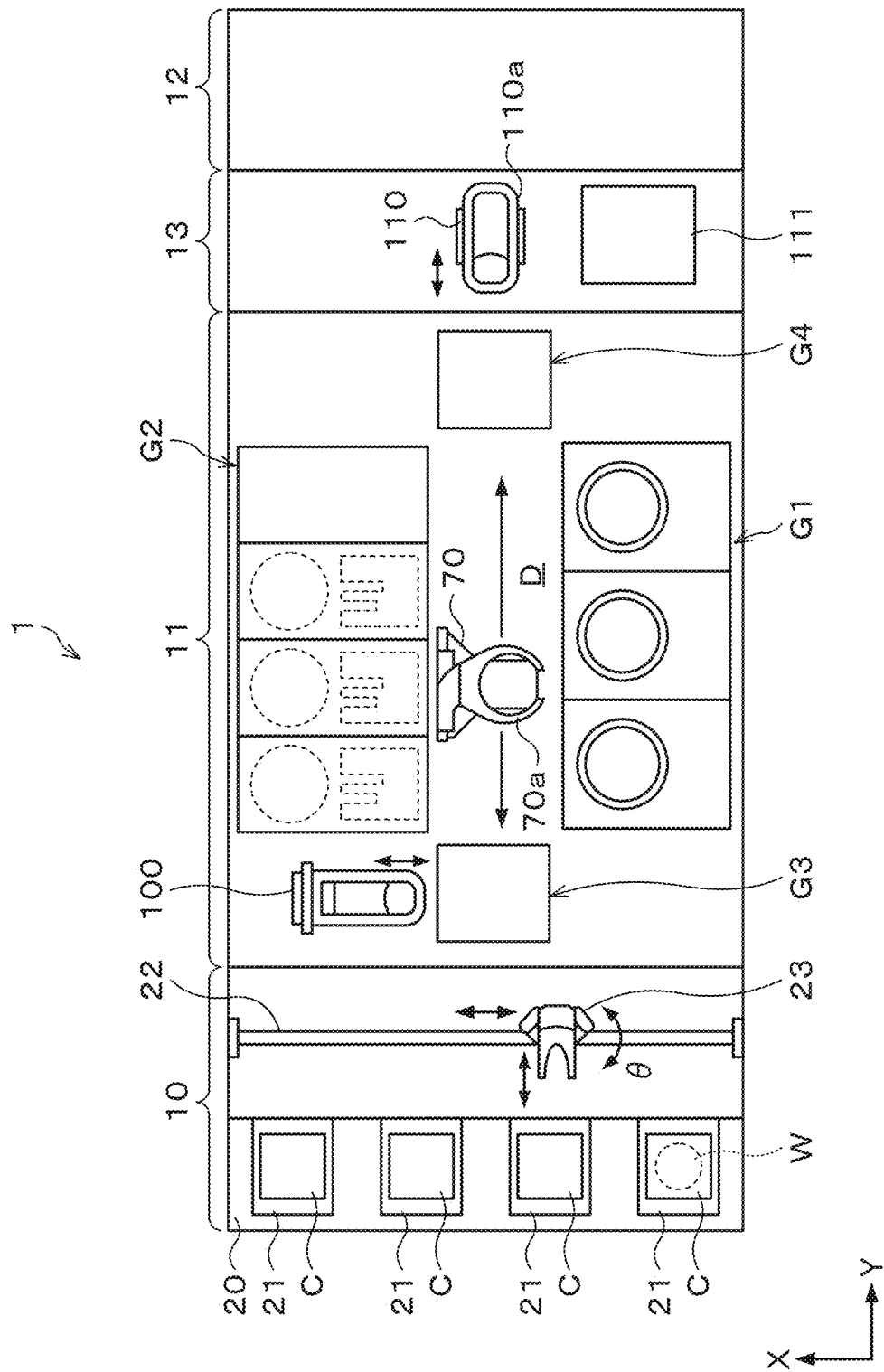
FIG. 1 is a plan view illustrating the outline of a configuration of a substrate treatment system according to an embodiment.

At the photolithography step in the manufacturing process of a semiconductor device or the like, a coating solution such as a resist solution is used for forming a coating film such as an anti-reflection film or a resist film on a semiconductor wafer (hereinafter, referred to as a "wafer") as a treatment object. Further, at the photolithography step, not only the coating solution for forming the coating film but also a developing solution, a rinse solution and the like are used as treatment solutions for the wafer. Note that the treatment solution is stored, for example, in a solution supply source, supplied from the solution supply source to a discharge nozzle by a solution supply apparatus, and discharged from the discharge nozzle onto the wafer.

In the treatment solution, foreign substances (particles) are contained in some cases. Besides, even if no particle exists in the original treatment solution, but when particles adhere to a pump, a valve, and a pipe of the solution supply apparatus, the particles may be mixed into a treatment solution to be supplied. Therefore, a supply pipe line connecting the solution supply source of the solution supply apparatus and the discharge nozzle is provided with a filter, so that the filter filters the treatment solution to remove the particles therein.

Regarding the above solution supply apparatus, Patent Document 1 discloses an apparatus which returns the treatment solution from which the particles have been removed by the filter as explained above to a portion on the primary side of the filter on the supply pipe line.

Incidentally, further miniaturization of the semiconductor device is required, and the size of the particles which should be removed from the treatment solution is very small. Further, the sensitivity of detecting the particles on the wafer increases. For example, fine particles of 20 nm or less can be detected. Further, for further miniaturization, new kinds of coating solutions which have not conventionally been used are increasingly used, so that it is predicted that particles unexpected in the conventional coating solutions become problems.

As a result of earnest study by the present inventors based on the above background, it has been found that even the treatment solution filtered by the filter contains foreign substances, if the treatment solution has stayed in the solution supply apparatus. In particular, it has been found that when the coating solution filtered by the filter as stated in Patent Document 1 is returned to the primary side of the supply pipe line, the number of fine particles contained in the coating solution discharged from the nozzle changes with the lapse of the operation time. Therefore, the solution supply apparatus having the configuration of returning the coating solution filtered by the filter to the primary side (solution supply source side) of the supply pipe line has room to further clean the coating solution.

Further, as a result of earnest study by the present inventors based on the above background, the following has been found. When the coating solution such as a resist solution composed of a polymer solution containing polymer is supplied as the treatment solution, a coating solution bottle is used as the solution supply source. Even if the quality of the coating solution bottle is guaranteed by its manufacturer, fine particles may be contained in the coating solution in the bottle. It has been found that when such coating solution having cleanliness not enough to manufacture the micro semiconductor device is made to flow through the solution supply apparatus, the coating solution possibly influences the cleanliness in the apparatus. When the cleanliness in the solution supply apparatus deteriorates, the cleanliness of the treatment solution to be supplied from the solution supply apparatus also deteriorates and thus influences the yield of products.

Besides, in the case of supplying, as the treatment solution, a developing solution or the like composed of a non-polymer solution not containing polymer, the treatment solution is additionally supplied to the solution supply apparatus via an external pipe line laid in a factory where the solution supply apparatus is installed. Also in the aspect where the treatment solution is additionally supplied to the solution supply apparatus via the external pipe line as in the above manner, particles may be contained in the treatment solution to be additionally supplied, and influence the yield of products also in this case.

Hence, the technique according to this disclosure enables supply of a treatment solution having cleanliness suitable for manufacture of a micro semiconductor device.

Hereinafter, a solution supply apparatus and a solution supply method according to this embodiment will be explained referring to the drawings. Note that the same codes are given to components having substantially the same functional configurations in the description and the drawings to omit duplicated explanation.

First Embodiment

A solution supply apparatus according to this embodiment is configured as a coating solution supply apparatus which supplies a coating solution (for example, a resist solution) composed of a polymer solution as a treatment solution.

(Verification Test 1)

In order to supply a cleaner solution as the coating solution, in the case where the coating solution supply apparatus has a function of returning the coating solution filtered by the filter to the coating solution supply source side of the supply pipe line, the present inventors carried out a verification test about the influence of the function exerted on the cleanliness of the coating solution. More specifically, in the case where the coating solution supply apparatus has a function of returning the coating solution, which has been filtered by the filter and not discharged but remains, to the buffer tank, the verification test was carried out about the influence of the function exerted on the cleanliness of the coating solution. In the verification test, the coating solution supply apparatus was operated under later-explained four operation conditions (1) to (4) different from one another. Note that a later-explained "dummy dispense" means an operation intended to discard the coating solution which exists in the discharge nozzle and a coating solution supply line connected to the discharge nozzle and has a composition unsuitable for treatment or the coating solution which has stayed for a long period. Specifically, the "dummy dispense" means an operation of discharging a predetermined amount of the coating solution from the discharge nozzle toward a place different from the substrate to be treated. Besides, a dummy dispense interval, namely, the time period from the finish of the latest coating solution discharge operation from the discharge nozzle to the performance of the dummy dispense is set by a user. Besides, a later-explained "pump ventilation" means an operation of draining a fixed amount of the coating solution from a pump to a drainage line in order to remove air bubbles contained in the coating solution in the pump. Note that the configuration of the coating solution supply apparatus used in this verification test is different in that the coating solution supply apparatus does not have a foreign substance detector 208, from the configuration of a later-explained resist solution supply apparatus 200 in FIG. 6, and is substantially the same in the other configuration.

In the case of the operation condition (1), namely, in the case of operating with the dummy dispense interval set to 5 minutes and disabling a loop function, the number of particles contained in the coating solution from the discharge nozzle did not change even after a lapse of the operation time and was small at all times. The loop function is a function of returning the coating solution, which has been fed from the pump to the drainage line, to the buffer tank during the pump ventilation.

On the other hand, in the case of the operation condition (2), namely, in the case of operating with the dummy dispense interval set to 5 minutes and enabling the loop function, the number of particles contained in the coating solution from the discharge nozzle did not change even after a lapse of the operation time. Further, the number of particles was stable at a value smaller than that under the operation condition (1).

Besides, in the case of the operation condition (3), namely, in the case of operating with the dummy dispense interval set to 30 minutes and disabling the loop function, the number of particles contained in the coating solution from the discharge nozzle was small sometimes but not stable.

Further, in the case of the operation condition (4), namely, in the case of operating with the dummy dispense interval set to 30 minutes and enabling the loop function, the number of particles contained in the coating solution from the discharge nozzle was large and apt to increase with the lapse of the operation time.

From the result of the above verification test, the following points are predicted. In the case where the dummy dispense interval is short and the time of staying in the coating solution supply apparatus of the coating solution is short as in the operation condition (2), the influence by the staying is small. Therefore, it is predicted that when the coating solution filtered by the filter is returned to the buffer tank, the coating solution is filtered again by the filter, so that the number of particles decreases with the operation time.

On the other hand, in the case where the dummy dispense interval is long and the time of staying in the coating solution supply apparatus of the coating solution is short as in the operation condition (4), the coating solution filtered by the filter is contaminated due to the staying. It is predicted that when the contaminated coating solution is returned to the buffer tank, the whole inside of the coating solution supply apparatus is contaminated, so that the number of particles increases with the operation time.

In other words, it is predicted that even the coating solution filtered by the filter may contain foreign substances if the coating solution stays in the coating solution supply apparatus.

Note that a conceivable reason why the coating solution contains foreign substances when the coating solution stays is as follows. Specifically, the filter has a filtering medium which filters the coating solution to remove particles and a support material which reinforces/protects the filtering medium, and a support member is composed of a low-molecular weight material. Further, a high-molecular material is used for a solvent for a new kind of coating solution developed accompanying the miniaturization of the semiconductor device, and it is conceivable that a support solvent composed of the low-molecular material dissolves in the solvent composed of the high-molecular material.

A first embodiment explained below is based on the result of the above study.

Figure 2:
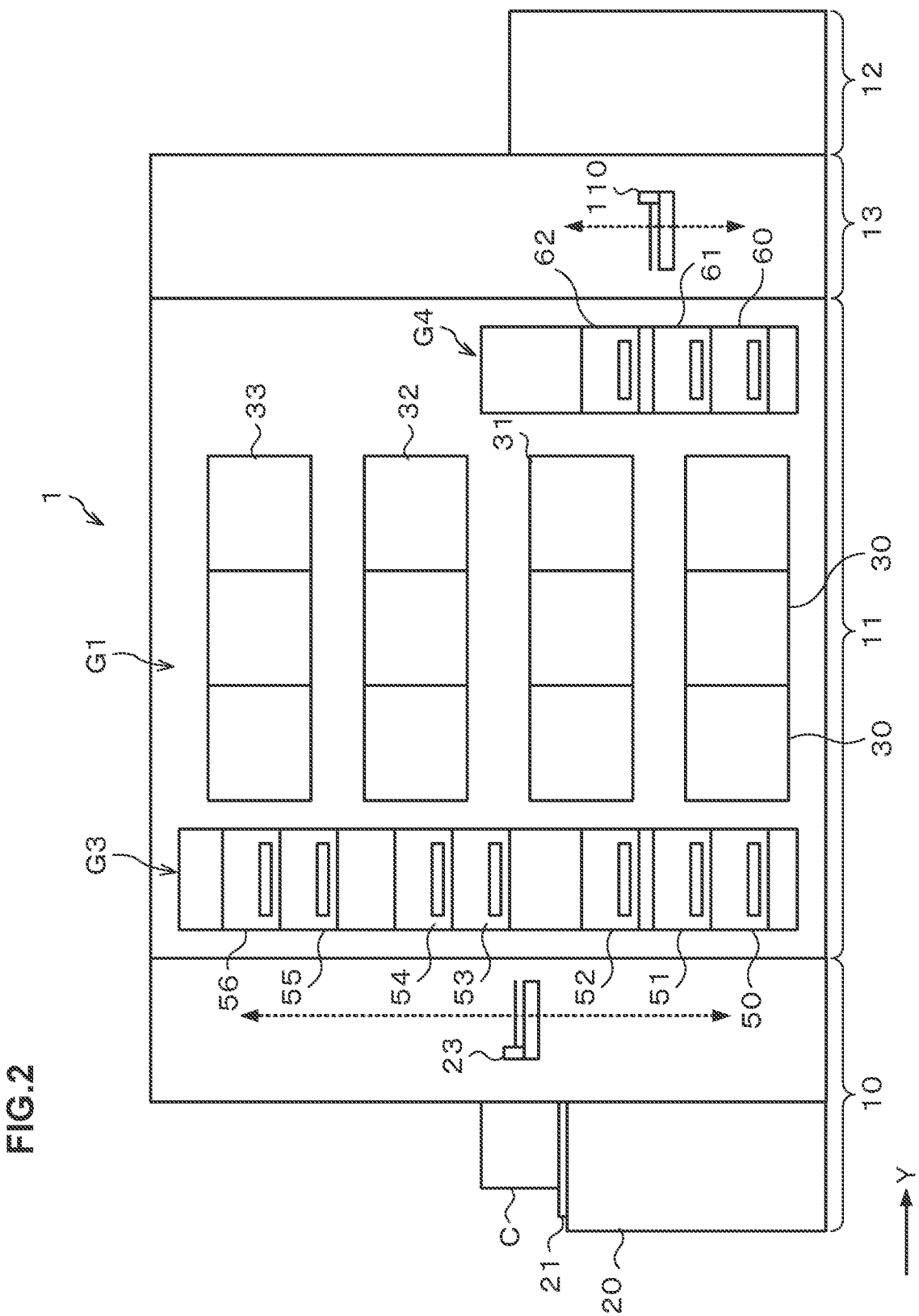
FIG. 2 is a front view illustrating the outline of the configuration of the substrate treatment system according to the embodiment.
Figure 3:
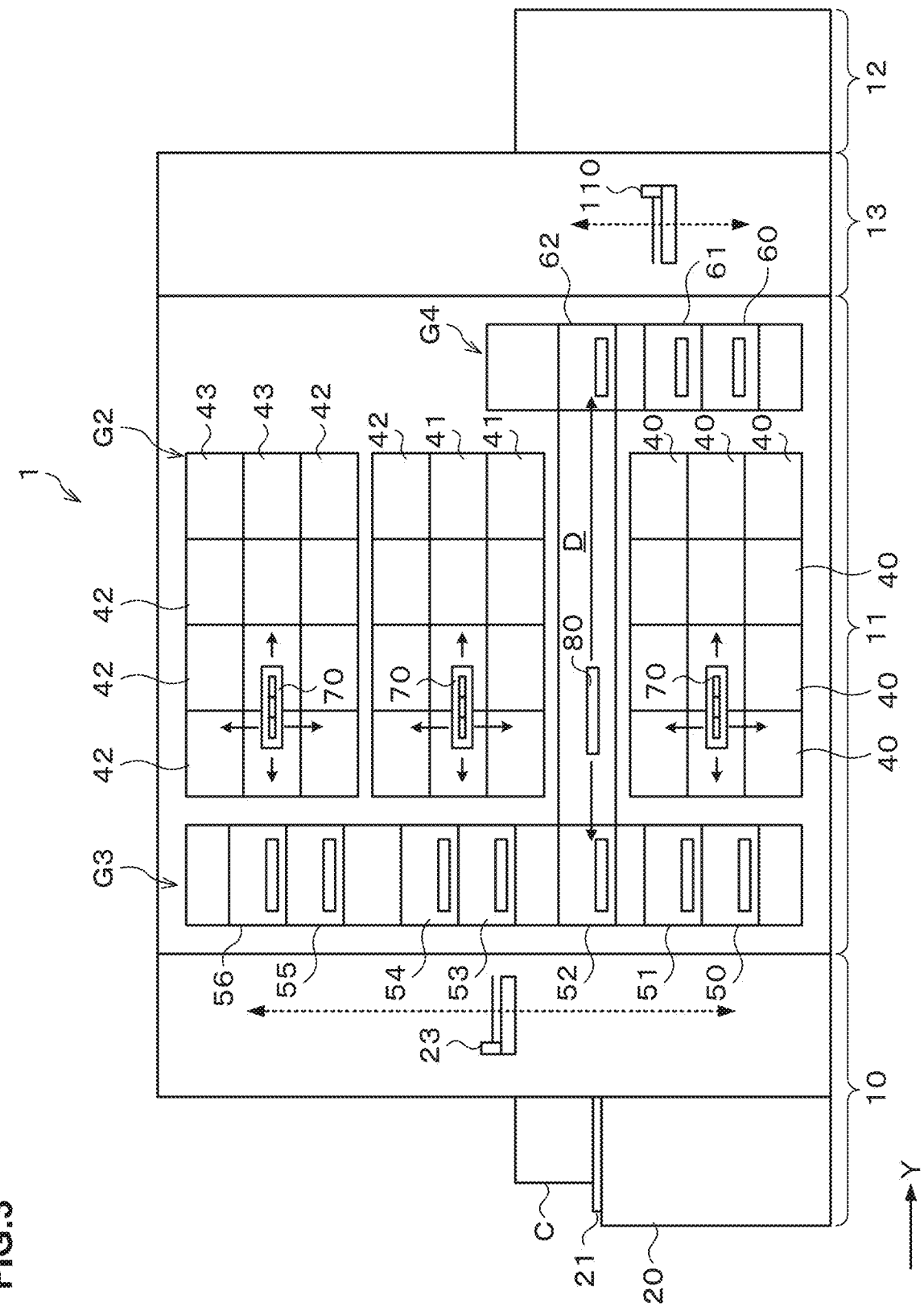
FIG. 3 is a rear view illustrating the outline of the configuration of the substrate treatment system according to the embodiment.

FIG. 1 is an explanatory view illustrating the outline of a configuration of a substrate treatment system 1 equipped with a resist solution supply apparatus as a coating solution supply apparatus according to the first embodiment. FIG. 2 and FIG. 3 are a front view and a rear view schematically illustrating the outline of the internal configuration of the substrate treatment system 1, respectively. Note that in this description and the drawings, the same codes are attached to components having substantially the same functional configurations to omit duplicated explanation.

The substrate treatment system 1 includes, as illustrated in FIG. 1, a cassette station 10 into/out of which a cassette C housing a plurality of wafers W is transferred, and a treatment station 11 including a plurality of various treatment apparatuses which perform predetermined treatments on the wafer W. Further, the substrate treatment system 1 has a configuration in which the cassette station 10, the treatment station 11, and an interface station 13 which delivers the wafer W to/from an exposure apparatus 12 adjacent to the treatment station 11, are integrally connected.

In the cassette station 10, a cassette stage 20 is provided. On the cassette stage 20, a plurality of cassette stage plates 21 on each of which the cassette C is mounted when the cassette C is transferred in/out from/to the outside of the substrate treatment system 1 are provided.

In the cassette station 10, a wafer transfer apparatus 23 is provided which is movable on a transfer path 22 extending in an X-direction as illustrated in FIG. 1. The wafer transfer apparatus 23 is movable also in an up-down direction and around a vertical axis (in a θ-direction), and can transfer the wafer W between the cassette C on each of the cassette stage plates 21 and a later-explained delivery apparatus in a third block G3 in the treatment station 11.

In the treatment station 11, a plurality of, for example, four blocks G1, G2, G3, G4 each including various apparatuses are provided. For example, the first block G1 is provided on the front side (an X-direction negative direction side in FIG. 1) in the treatment station 11, and the second block G2 is provided on the rear side (an X-direction positive direction side in FIG. 1) in the treatment station 11. Further, the third block G3 is provided on the cassette station 10 side (a Y-direction negative direction side in FIG. 1) in the treatment station 11, and the fourth block G4 is provided on the interface station 13 side (a Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution to the wafer W to form a resist film, and upper anti-reflection film forming apparatuses 33 each of which forms an anti-reflection film (hereinafter, referred to as an "upper anti-reflection film") at an upper layer of the resist film of the wafer W, are arranged in this order from the bottom.

For example, three pieces of each of the developing treatment apparatus 30, the lower anti-reflection film forming apparatus 31, the resist coating apparatus 32, and the upper anti-reflection film forming apparatus 33 are arranged side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In the solution treatment apparatuses such as the developing treatment apparatus 30, the lower anti-reflection film forming apparatus 31, the resist coating apparatus 32, and the upper anti-reflection film forming apparatus 33, for example, spin coating of applying a predetermined treatment solution onto the wafer W is performed. In the spin coating, the treatment solution is discharged, for example, from a discharge nozzle onto the wafer W and rotation of the wafer W is performed to diffuse the treatment solution over the surface of the wafer W.

For example, in the second block G2, as illustrated in FIG. 3, thermal treatment apparatuses 40 to 43 each of which performs thermal treatments such as heating and cooling on the wafer W are provided side by side in the up-down direction and in the horizontal direction. The numbers and the arrangement of the thermal treatment apparatuses 40 to 43 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm 70a movable, for example, in the Y-direction, the X-direction, the θ-direction, and the up-down direction. The wafer transfer apparatus 70 can move in the wafer transfer region D to transfer the wafer W to a predetermined apparatus in the first block G1, the second block G2, the third block G3, and the fourth block G4 located therearound.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent on the X-direction positive direction side of the third block G3. The wafer transfer apparatus 100 has a transfer arm movable, for example, in the X-direction, the θ-direction, and the up-down direction. The wafer transfer apparatus 100 can move up and down while supporting the wafer W to transfer the wafer W to each of the delivery apparatuses in the third block G3.

In the interface station 13, a wafer transfer apparatus 110 and a delivery apparatus 111 are provided. The wafer transfer apparatus 110 has a transfer arm 110a movable, for example, in the Y-direction, the θ-direction, and the up-down direction. The wafer transfer apparatus 110 can transfer the wafer W between each of the delivery apparatuses in the fourth block G4, the delivery apparatus 111, and the exposure apparatus 12, for example, while supporting the wafer W by the transfer arm 110a.

Next, the outline of a wafer treatment performed using the substrate treatment system 1 configured as described above will be explained. First, the cassette C housing a plurality of wafers W is transferred into the cassette station 10 of the substrate treatment system 1 and the wafers W in the cassette C are successively transferred by the wafer transfer apparatus 23 to the delivery apparatus 53 in the treatment station 11.

Then, the wafer W is transferred by the wafer transfer apparatus 70 to the thermal treatment apparatus 40 in the second block G2 and subjected to a temperature regulation treatment. The wafer W is thereafter transferred by the wafer transfer apparatus 70, for example, to the lower anti-reflection film forming apparatus 31 in the first block G1, in which a lower anti-reflection film is formed on the wafer W. The wafer W is then transferred to the thermal treatment apparatus 41 in the second block G2 and subjected to a heat treatment.

The wafer W is then transferred by the wafer transfer apparatus 70 to the thermal treatment apparatus 42 in the second block G2 and subjected to a temperature regulation treatment. The wafer W is thereafter transferred by the wafer transfer apparatus 70 to the resist coating apparatus 32 in the first block G1, in which a resist film is formed on the wafer W. The wafer W is then transferred to the thermal treatment apparatus 43 and subjected to a pre-baking treatment.

The wafer W is then transferred to the upper anti-reflection film forming apparatus 33 in the first block G1, in which an upper anti-reflection film is formed on the wafer W. The wafer W is thereafter transferred to the thermal treatment apparatus 43 in the second block G2 and subjected to a heat treatment. The wafer W is thereafter transferred by the wafer transfer apparatus 70 to the delivery apparatus 56 in the third block G3.

Then, the wafer W is transferred by the wafer transfer apparatus 100 to the delivery apparatus 52, and transferred by the shuttle transfer apparatus 80 to the delivery apparatus 62 in the fourth block G4. The wafer W is thereafter transferred by the wafer transfer apparatus 110 in the interface station 13 to the exposure apparatus 12 and subjected to exposure processing in a predetermined pattern.

The wafer W is then transferred by the wafer transfer apparatus 70 to the thermal treatment apparatus 40 and subjected to a post-exposure baking treatment. This causes a deprotection reaction by an acid generated at an exposed portion of the resist film. The wafer W is thereafter transferred by the wafer transfer apparatus 70 to the developing treatment apparatus 30 and subjected to a developing treatment.

Figure 4:
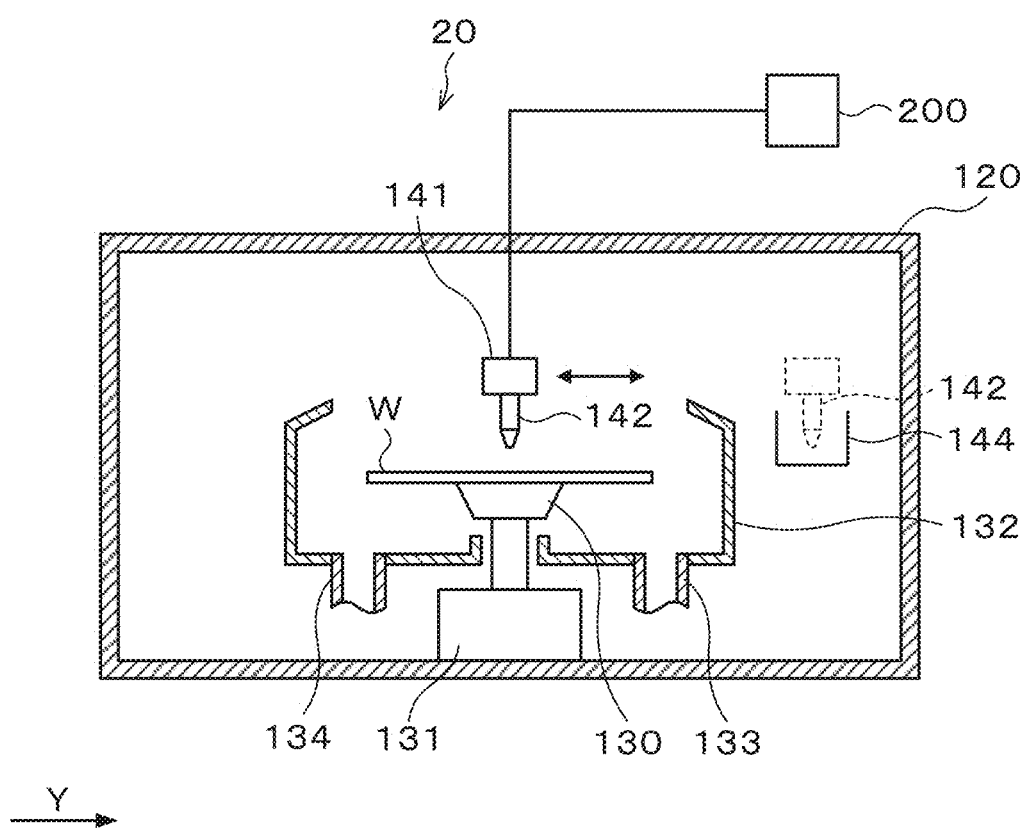
FIG. 4 is a longitudinal sectional view illustrating the outline of a configuration of a resist coating apparatus.
Figure 5:
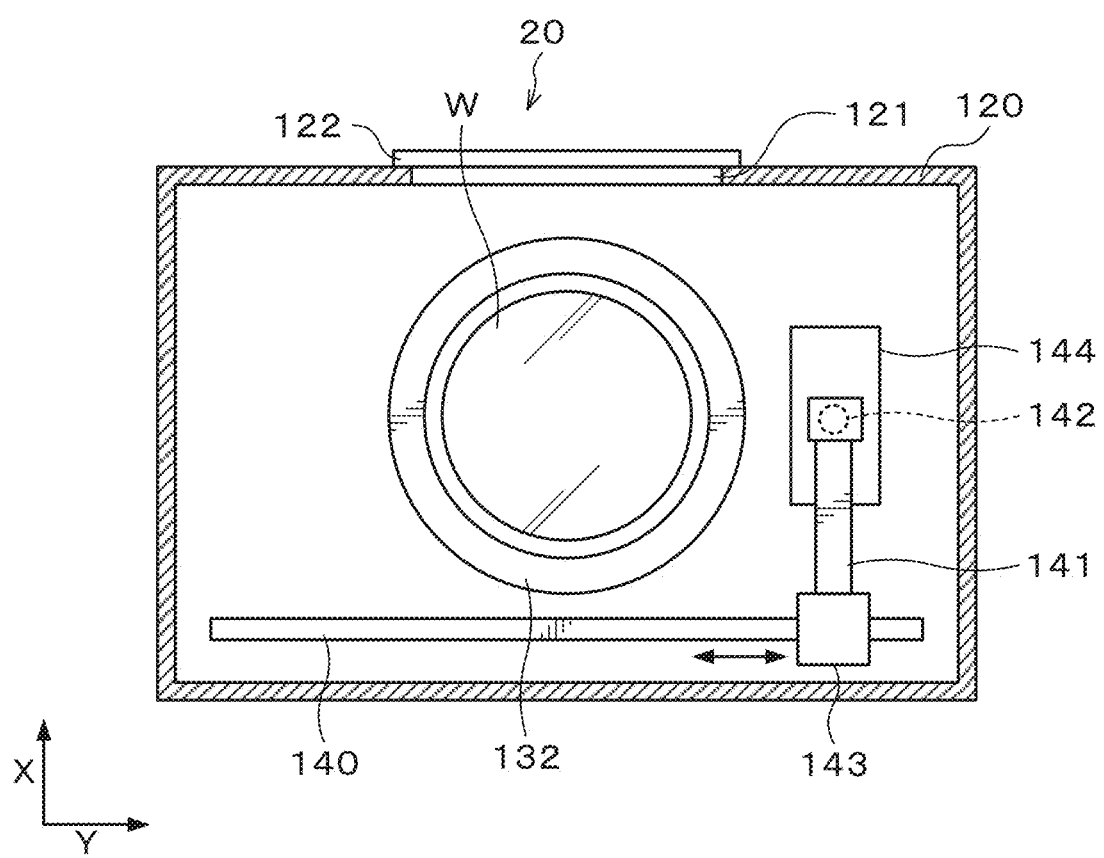
FIG. 5 is a transverse sectional view illustrating the outline of the configuration of the resist coating apparatus.

Next, the configuration of the aforementioned resist coating apparatus 32 will be explained. FIG. 4 is a longitudinal sectional view illustrating the outline of a configuration of the resist coating apparatus 32, and FIG. 5 is a transverse sectional view illustrating the outline of the configuration of the resist coating apparatus 32.

The resist coating apparatus 32 has a treatment container 120 whose inside is closable as illustrated in FIG. 4. A side surface of the treatment container 120 is formed with a transfer-in/out port 121 for the wafer W and an opening and closing shutter 122 is provided at the transfer-in/out port 121 as illustrated in FIG. 5.

At a center portion in the treatment container 120, a spin chuck 130 which holds and rotates the wafer W is provided as illustrated in FIG. 4. The spin chuck 130 has a horizontal upper surface, and the upper surface is provided with, for example, a suction port (not illustrated) for sucking the wafer W. By suction through the suction port, the wafer W can be suction-held on the spin chuck 130.

The spin chuck 130 has a chuck drive mechanism 131 including, for example, a motor and the like, and can rotate at a predetermined speed by the chuck drive mechanism 131. Further, the chuck drive mechanism 131 is provided with a raising and lowering drive source such as a cylinder so that the spin chuck 130 can freely move up and down.

Around the spin chuck 130, a cup 132 is provided which receives and collects liquid splashing or dropping from the wafer W. A drain pipe 133 which drains the collected liquid and an exhaust pipe 134 which exhausts the atmosphere in the cup 132 are connected to the lower surface of the cup 132.

As illustrated in FIG. 5, on an X-direction negative direction (lower direction in FIG. 5) side of the cup 132, a rail 140 is formed which extends along a Y-direction (a right-left direction in FIG. 5). The rail 140 is formed, for example, from a Y-direction negative direction (left direction in FIG. 5) side outer position to a Y-direction positive direction (right direction in FIG. 5) side outer position of the cup 132. To the rail 140, an arm 141 is attached.

On the arm 141, a discharge nozzle 142 which discharges the resist solution is supported as illustrated in FIG. 4 and FIG. 5. The arm 141 is movable on the rail 140 by a nozzle drive 143 illustrated in FIG. 5. This allows the discharge nozzle 142 to move from a waiting section 144 provided at a Y-direction positive direction side outer position of the cup 132 to a position above a center of the wafer W in the cup 132 and further move in a radial direction of the wafer W above the surface of the wafer W. Further, the arm 141 is movable up and down by the nozzle drive 143, and is able to adjust the height of the discharge nozzle 142. The discharge nozzle 142 is connected to a resist solution supply apparatus 200 which supplies the resist solution as illustrated in FIG. 4.

Figure 6:
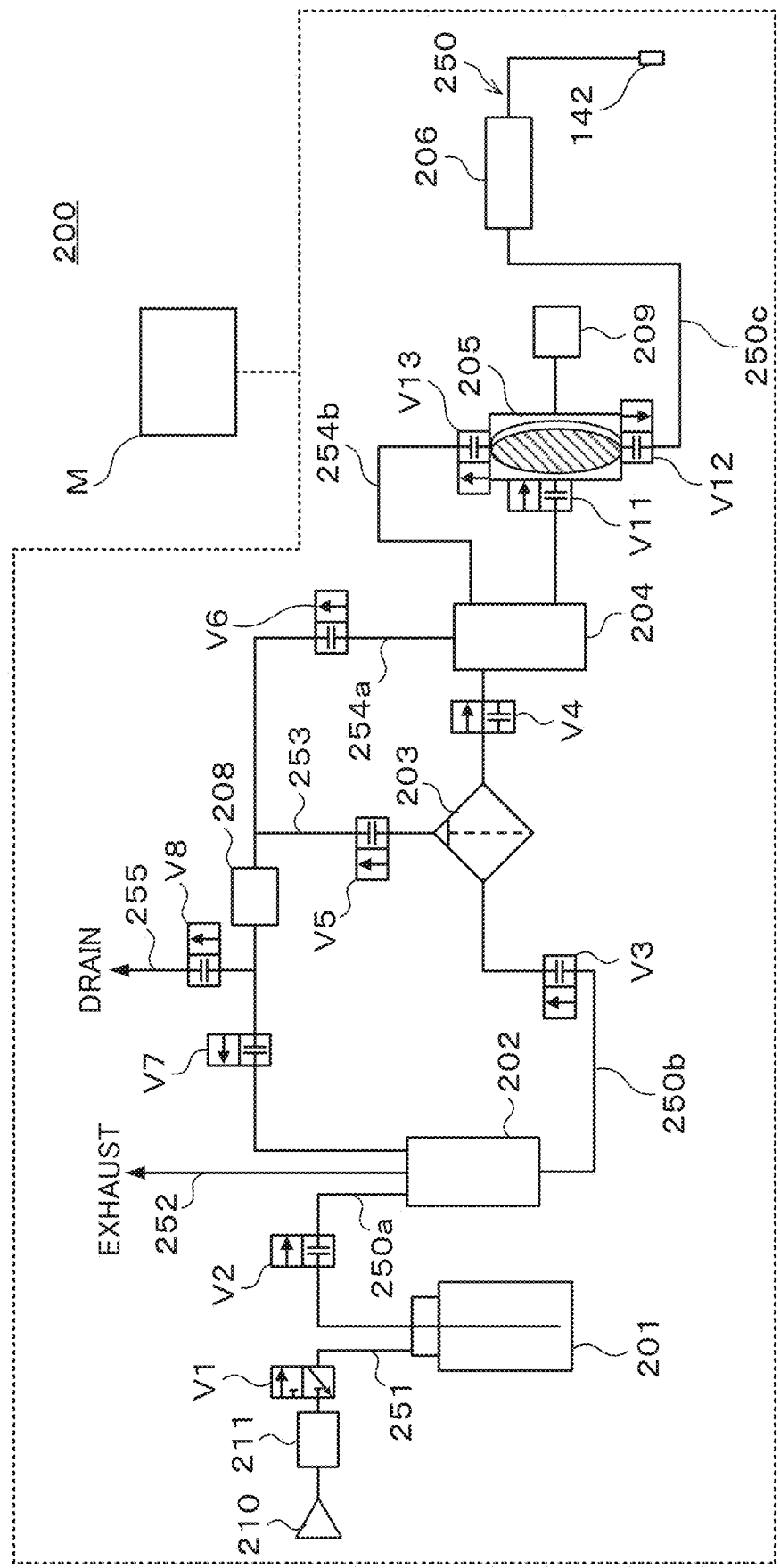
FIG. 6 is an explanatory view illustrating the outline of a configuration of a resist solution supply apparatus according to a first embodiment.

Next, the configuration of the resist solution supply apparatus 200 which supplies the resist solution as the coating solution to the discharge nozzle 142 as a treatment solution discharger in the resist coating apparatus 32 will be explained. FIG. 6 is an explanatory view illustrating the outline of the configuration of the resist solution supply apparatus 200. Note that the resist solution supply apparatus 200 is provided, for example, in a not-illustrated chemical box. The chemical box is intended to supply various kinds of treatment solutions to solution treatment apparatuses.

The resist solution supply apparatus 200 in FIG. 6 includes a coating solution supply pipe line 250 as a supply pipe line connected to the discharge nozzle 142. In this embodiment, the coating solution supply pipe line 250 connects a resist solution bottle 201 as a solution supply source which stores the resist solution therein and the discharge nozzle 142. In other words, the coating solution supply pipe line 250 is connected, at its end part on the side opposite to the discharge nozzle 142, to the resist solution bottle 201 as the solution supply source.

The resist solution bottle 201 is replaceable, and a gas supply pipe line 251 provided with an opening/closing valve V1 is provided at the top of the resist solution bottle 201. The gas supply pipe line 251 is intended to connect the gas supply source 210 as a supply source of an inert gas such as a nitrogen gas and the resist solution bottle 201, and has an electropneumatic regulator 211 for regulating pressure provided on the upstream side of the opening/closing valve V1.

The coating solution supply pipe line 250 is provided with a buffer tank 202, a filter 203, a trap tank 204, and a pump 205 in this order from the upstream side.

The coating solution supply pipe line 250 includes a first supply pipe line 250a which connects the resist solution bottle 201 and the buffer tank 202, a second supply pipe line 250b which connects the buffer tank 202 and the pump 205 and is provided with the filer 203 and the trap tank 204, and a third supply pipe line 250c which connects the pump 205 and the discharge nozzle 142.

The first supply pipe line 250a is provided with an opening/closing valve V2.

The second supply pipe line 250b is provided with an opening/closing valve V3 between the buffer tank 202 and the filter 203, and an opening/closing valve V4 between the filter 203 and the trap tank 204.

The third supply pipe line 250c is provided with a supply control valve 206 including an opening/closing valve and a suck-back valve.

The buffer tank 202 is a temporary storage which temporarily stores the resist solution transported from the resist solution bottle 201. The buffer tank 202 is provided with a liquid level sensor (not illustrated) which detects a storage remaining amount so that the opening/closing valves V1, V2 are opened and closed according to the detection result by the liquid level sensor to start/stop the supply of the resist solution from the resist solution bottle 201 to the buffer tank 202. Further, at an upper part of the buffer tank 202, an exhaust pipe line 252 is provided which releases the inert gas staying at the upper part of the buffer tank 202 to the atmosphere.

The filter 203 is intended to filter the resist solution to thereby remove particles therein. The filter 203 is provided with a drainage sub-pipe line 253 for draining the resist solution drained from the inside of the filter 203 at the time of filter ventilation. The drainage sub-pipe line 253 is provided with an opening/closing valve V5, and the drainage sub-pipe line 253 is connected, at its end part on the side opposite to the filter 203, between a foreign substance detector 208 and an opening/closing valve V6 on a later-explained return pipe line 254a.

The trap tank 204 is intended to collect and remove air bubbles in the resist solution, and is provided with the first return pipe line 254a for draining the resist solution from the trap tank 204. The first return pipe line 254a is provided with opening/closing valves V6, V7 in this order from the upstream side.

Further, the first return pipe line 254a has a branch point between the opening/closing valves V6 and V7. The first return pipe line 254a is connected to a drainage main-pipe line 255 which branches off from the branch point and reaches a place different from the coating solution supply pipe line 250, more specifically, a drainage path (not illustrated). The drainage main-pipe line 255 is provided with an opening/closing valve V8.

Further, the foreign substance detector 208 is provided on the upstream side of the branch point on the first return pipe line 254a, more specifically, between the branch point and the opening/closing valve V6 on the first return pipe line 254a.

The foreign substance detector 208 is intended to detect foreign substances contained in the treatment solution such as a coating solution. The foreign substance detector 208 includes, for example, an irradiator (not illustrated) which applies light to fluid flowing through a flow path provided with the foreign substance detector 208, and a light receiver (not illustrated) which receives light applied by the irradiator and passed through the fluid flowing through the flow path. The foreign substance detector 208 detects the foreign substances in the fluid in the flow path based on a light reception result by the light receiver.

The pump 205 is intended to suck and feed the resist solution, and is composed of, for example, a diaphragm pump being a variable displacement pump. The pump 205 is partitioned into not-illustrated pump chamber and operating chamber by a diaphragm being a flexible member. The pump chamber is connected to the second supply pipe line 250b via an opening/closing valve V11 and sucks the resist solution from the second supply pipe line 250b. Further, the pump chamber is connected to the third supply pipe line 250c via the opening/closing valve V12 and discharges the resist solution to the third supply pipe line 250c. Further, the pump chamber is connected to a second return pipe line 254b via an opening/closing valve V23 and discharges the resist solution to the second first return pipe line 254b. The second return pipe line 254b is connected, at its end part on the side opposite to the pump 205, to the trap tank 204. The second return pipe line 254b and the first return pipe line 254a constitute a return pipe line according to this embodiment. The return pipe line according to this embodiment is a pipe line which connects a portion on the secondary side of the filter 203 on the coating solution supply pipe line 250 and a portion on the primary side of the filter 203 on the coating solution supply pipe line 250.

To the aforementioned operating chamber of the pump 205, a driver 209 is connected which controls the depressurization and pressurization of gas in the operating chamber.

The resist solution supply apparatus 200 further includes a controller M. The controller M is, for example, a computer and includes a program storage (not illustrated). The program storage stores a program for controlling the treatments in the resist solution supply apparatus 200. Note that the program may be the one that is recorded in a computer-readable storage medium and installed from the storage medium into the controller M. A part or all of the program may be realized by a dedicated hardware (circuit board).

For each of the valves provided in the resist solution supply apparatus 200, an electromagnetic valve or an air-operated valve controllable by the controller M is used, and each of the valves and the controller M are electrically connected with each other. Further, the controller M is electrically connected to the foreign substance detector 208, the driver 209, and the electropneumatic regulator 211. This configuration enables a series of treatments in the resist solution supply apparatus 200 to be automatically performed under control of the controller M.

Next, the operation of the resist solution supply apparatus 200 will be explained based on FIG. 7 to FIG. 13. Note that in the following drawings, thick lines are used to illustrate pipes through which the resist solution flows to thereby omit the explanation of the open/closed states of some of the valves.

(Additional Supply to the Buffer Tank 202)

Figure 7:
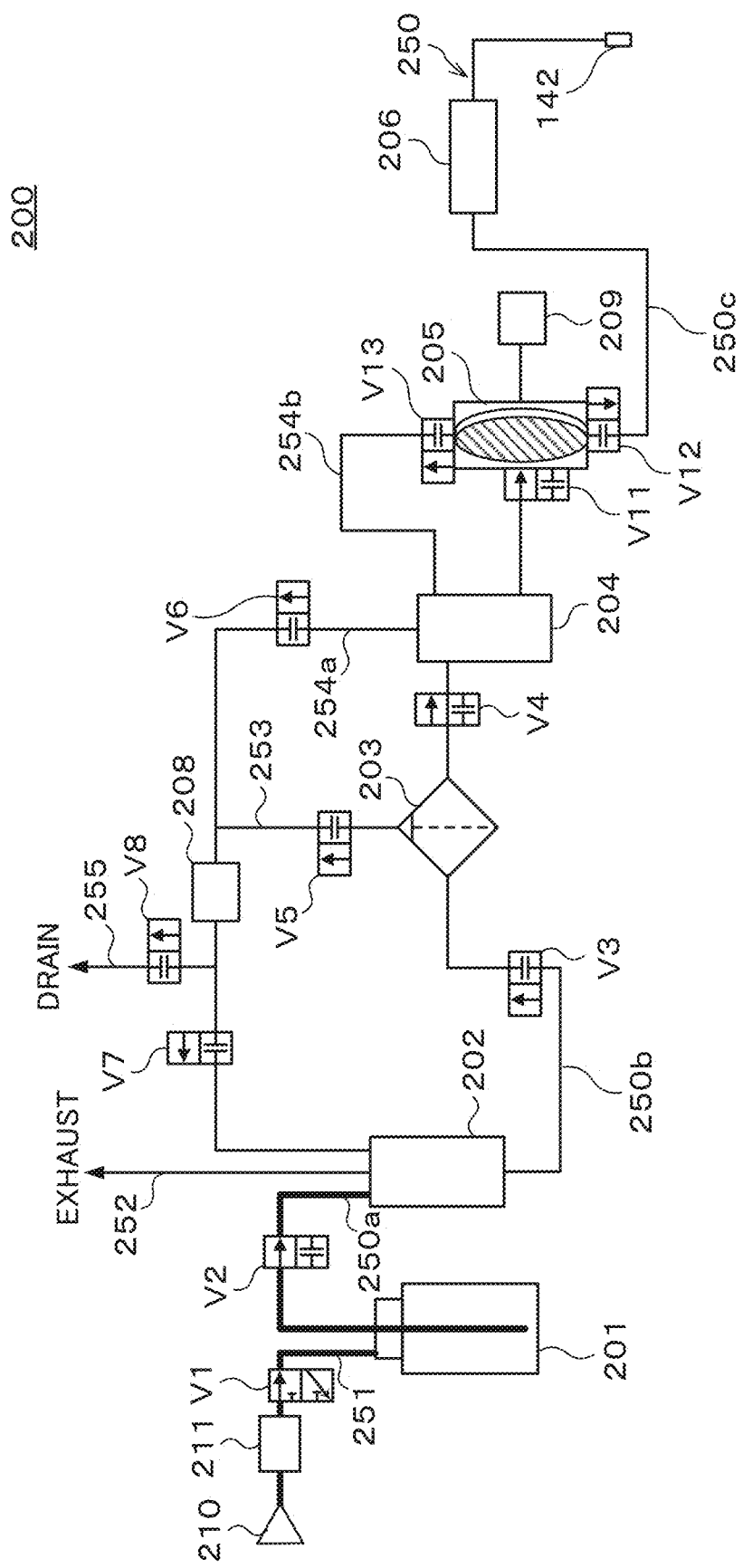
FIG. 7 illustrates a piping system for explaining the outline of the configuration of the resist solution supply apparatus and is an explanatory view of a step of additional supply to a buffer tank.

As illustrated in FIG. 7, based on a control signal from the controller M, the opening/closing valve V1 provided on the gas supply pipe line 251 and the opening/closing valve V2 provided on the first supply pipe line 250a are brought into an open state. Then, the resist solution is supplied and additionally supplied to the buffer tank 202 by the pressure of the nitrogen gas supplied from the gas supply source 210 into the resist solution bottle 201.

(Additional Supply to the Pump 205)

Figure 8:
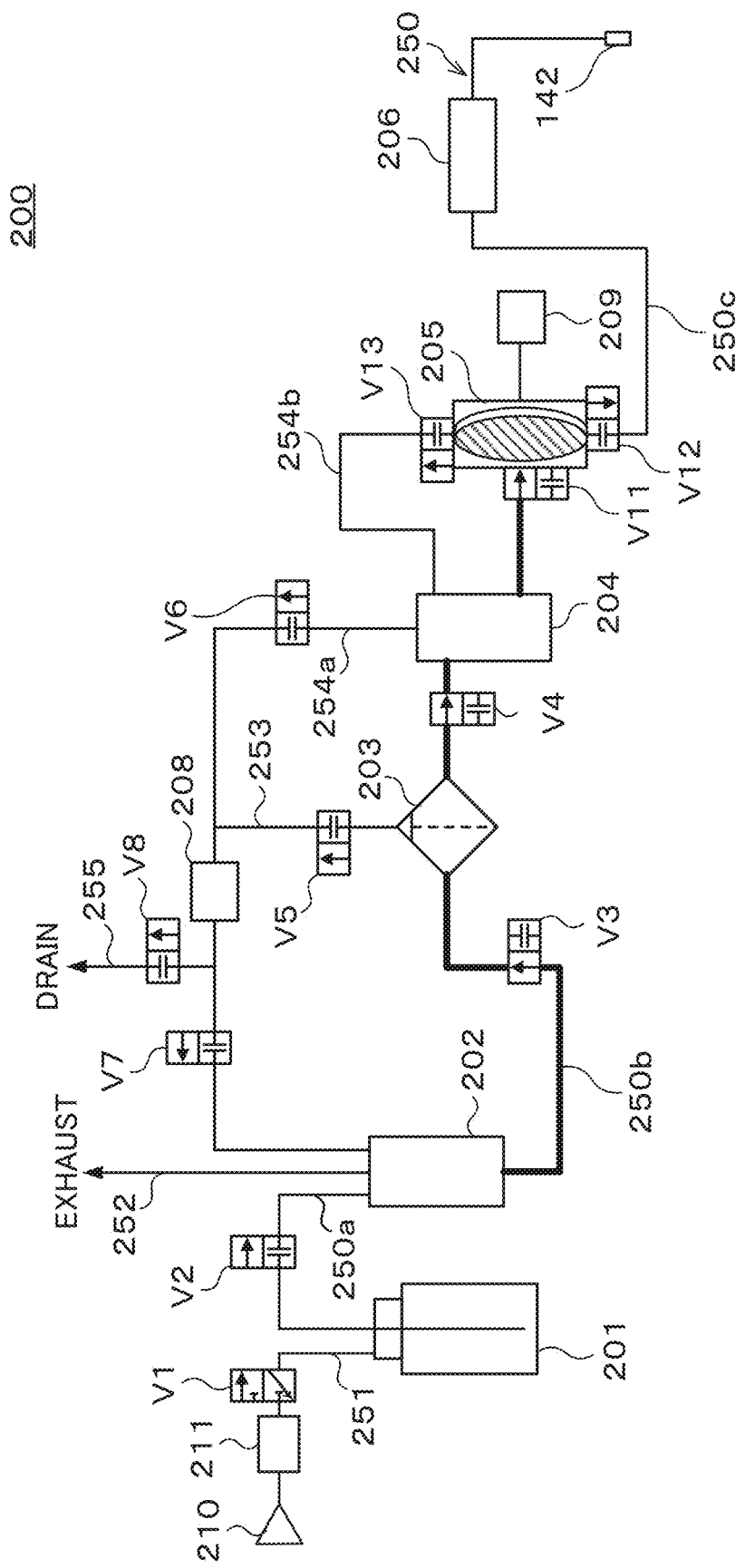
FIG. 8 illustrates the piping system for explaining the outline of the configuration of the resist solution supply apparatus and is an explanatory view of a step of additional supply to a pump.

Once a predetermined amount of the resist solution is additionally supplied into the buffer tank 202, the opening/closing valves V1, V2 are brought into a closed state as illustrated in FIG. 8. In this event, the opening/closing valve V11 of the pump 205 is brought into an open state, and the opening/closing valves V12, V13 are brought into a closed state. Then, the driver 209 starts an exhaust operation in the operating chamber of the pump 205, and the opening/closing valves V3, 4 provided on the second supply pipe line 250b are brought into an open state. This makes the resist solution in the buffer tank 202 pass through the filter 203 and pass through the trap tank 204, and is then transported to the pump 205.

(Discharge)

Figure 9:
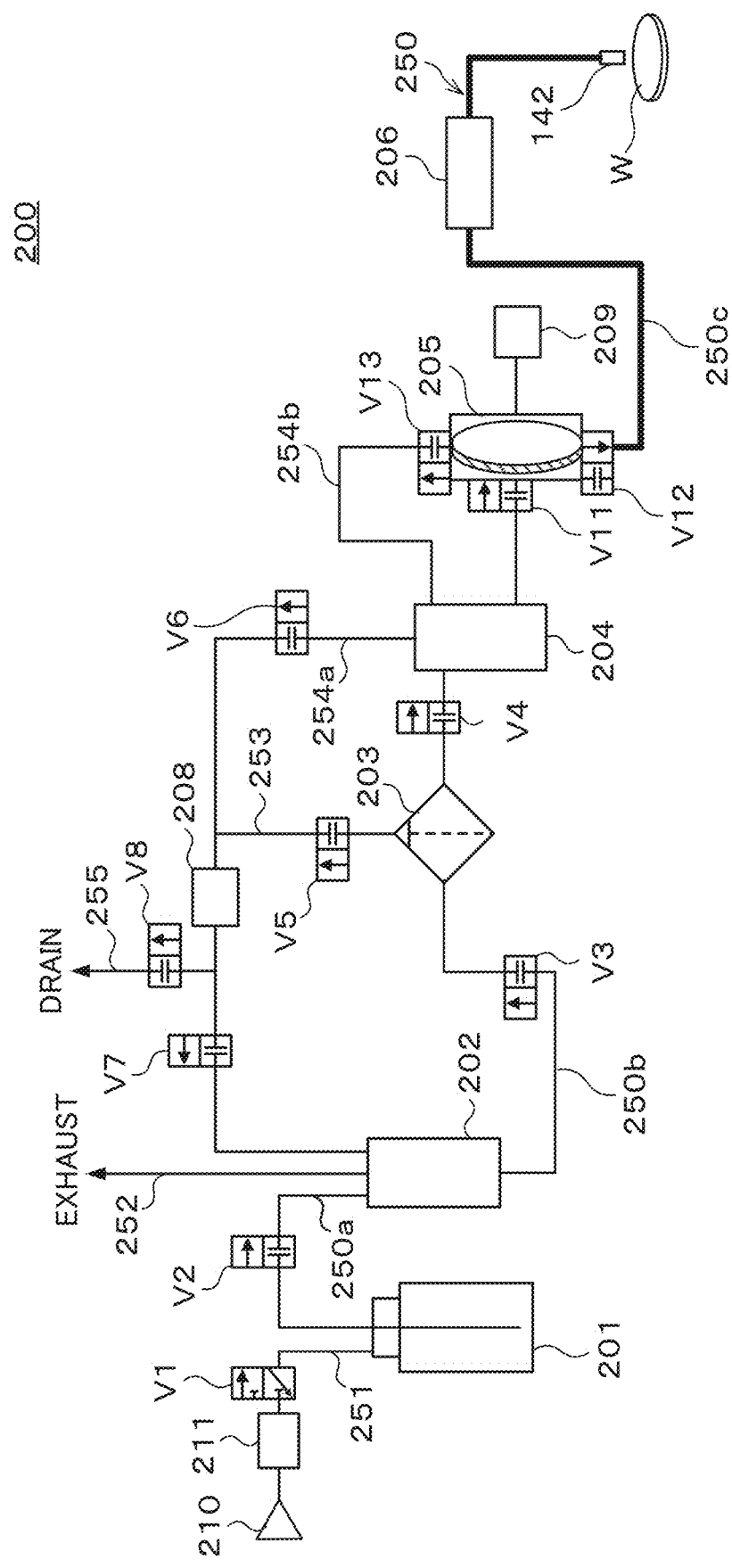
FIG. 9 illustrates the piping system for explaining the outline of the configuration of the resist solution supply apparatus and is an explanatory view of a discharge step.

Once a predetermined amount of the resist solution is supplied/additionally supplied into the pump 205, the opening/closing valves V3, V4, V11 are brought into a closed state, and the opening/closing valve V12 of the pump and the supply control valve 206 provided on the third supply pipe line 250c are brought into an open state as illustrated in FIG. 9. In addition to the above, the driver 209 starts the pressurizing operation in the operating chamber of the pump 205 to pressure-feed the resist solution from the pump 205 to the third supply pipe line 250c. This discharges a part (for example, one-fifth) of the resist solution transported to the pump 205, to the wafer W via the discharge nozzle 142.

During normal operation, the above steps are repeated.

(Dummy Dispense)

A dummy dispense interval of the resist solution supply apparatus 200 is set by the user as stated above. In the dummy dispense, the above-explained step of additional supply to the buffer tank 202, step of additional supply to the pump 205, and discharge step are repeated until after the predetermined amount of the coating solution is discharged from the discharge nozzle 142.

(Pump Ventilation)

The resist solution supply apparatus 200 performs pump ventilation of draining a predetermined amount of resist solution from the pump 205 to a drainage line in order to remove air bubbles contained in the resist solution in the pump 205. The execution timing of the pump ventilation is set by the user and, for example, the pump ventilation is performed every time the discharge operation from the discharge nozzle 142 is performed n times (for example, 100 times).

Figure 10:
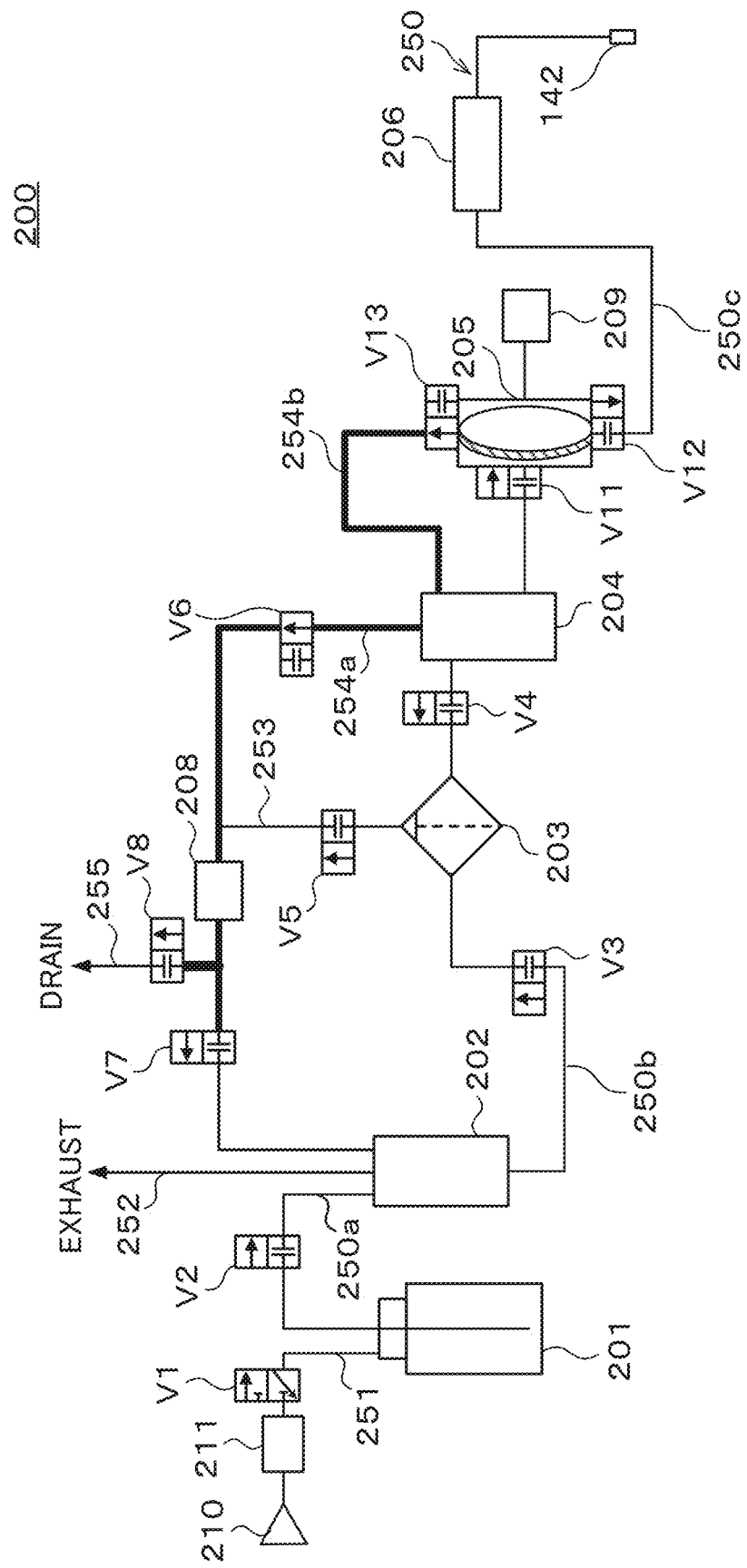
FIG. 10 illustrates the piping system for explaining the outline of the configuration of the resist solution supply apparatus and is an explanatory view of a pump ventilation step.

Once the operation of discharge from the discharge nozzle 142 at the n-th time set by the user ends, the opening/closing valve V12 of the pump 205 and the supply control valve 206 provided on the third supply pipe line 250c are brought into a closed state as illustrated in FIG. 10. Further, the opening/closing valve V13 of the pump 205 and the opening/closing valve V6 provided on the first return pipe line 254a are brought into an open state. In this event, the inside of the operating chamber of the pump 205 is kept in a pressurized state by the driver 209. Therefore, the resist solution is pressure-fed from the pump 205 to the second return pipe line 254b. This feeds the resist solution, which has been filtered by the filter 203 but remains in the pump 205, the trap tank 204, and the second supply pipe line 250b, to the first return pipe line 254a provided with the foreign substance detector 208.

Then, the controller M determines the state of the resist solution in the first return pipe line 254a based on the detection result by the foreign substance detector 208.

Figure 11:
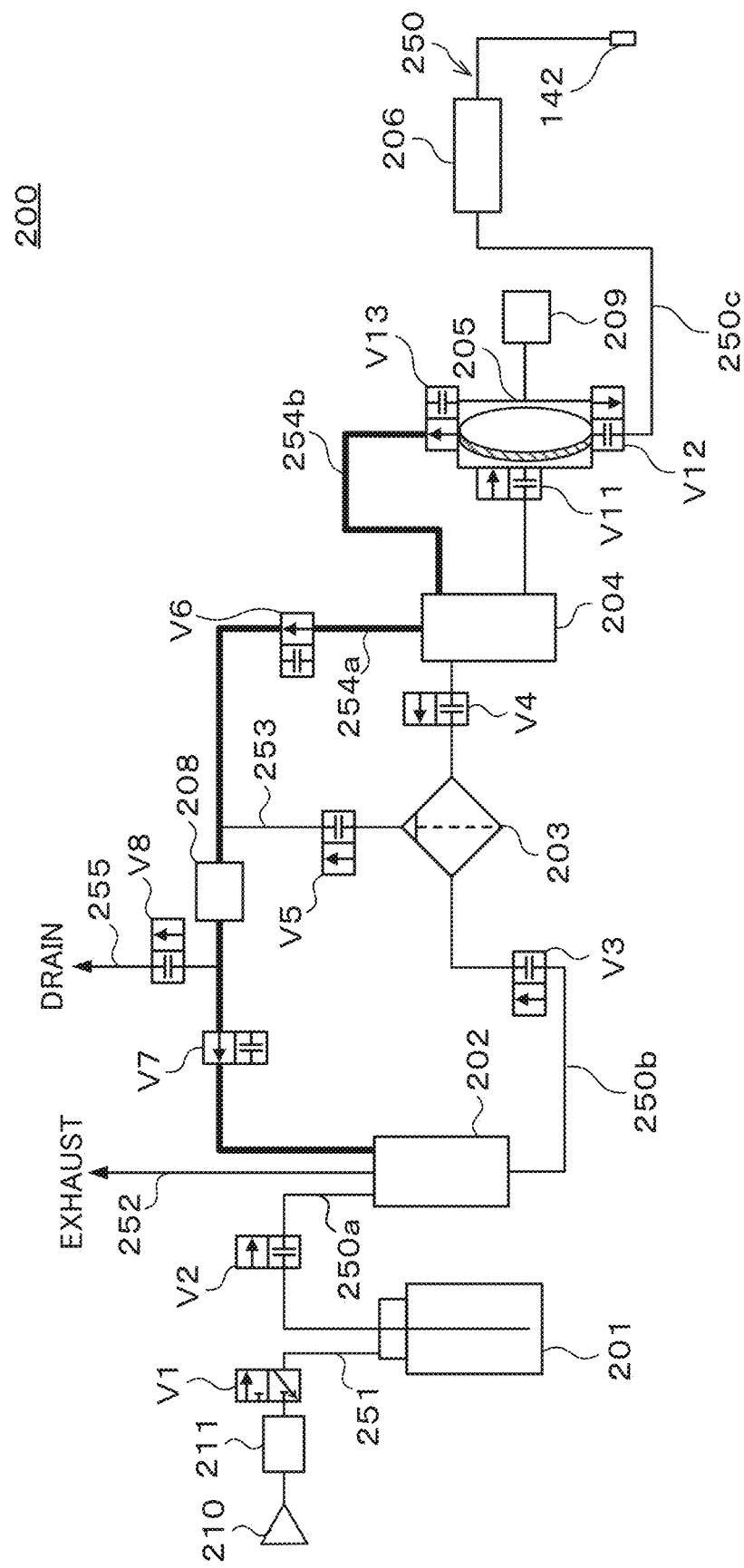
FIG. 11 illustrates the piping system for explaining the outline of the configuration of the resist solution supply apparatus and is another explanatory view of the pump ventilation step.

For example, when the number of foreign substances detected by the foreign substance detector 208 is less than a predetermined value and the state of the resist solution in the first return pipe line 254a is determined to be good as a result of the above determination, the opening/closing valve V7 provided on the first return pipe line 254a is brought into an open state as illustrated in FIG. 11. This returns the resist solution in the first return pipe line 254a to a portion on the primary side of the filter 203 on the coating solution supply pipe line 250, more specifically, the buffer tank 202.

Figure 12:
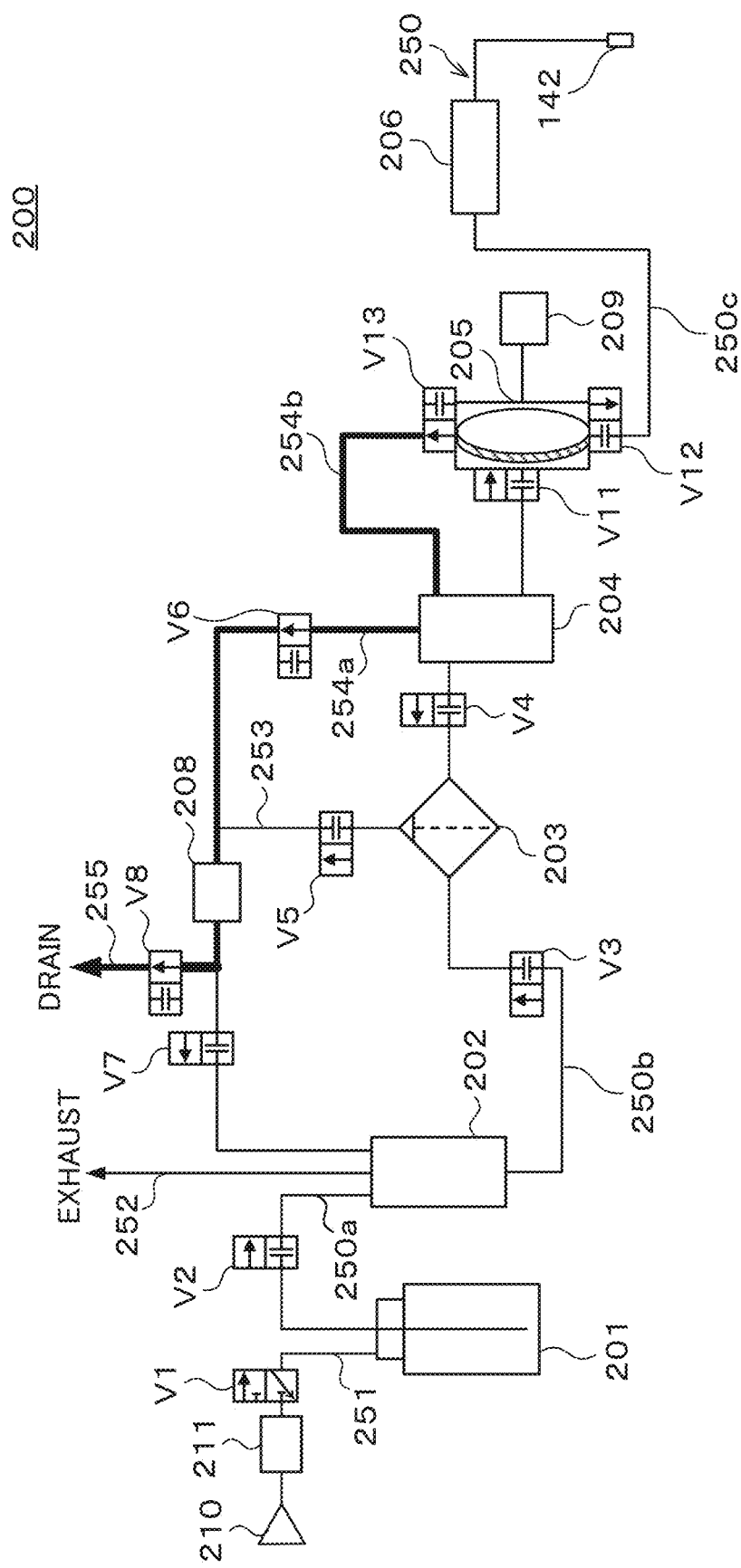
FIG. 12 illustrates the piping system for explaining the outline of the configuration of the resist solution supply apparatus and is another explanatory view of the pump ventilation step.

On the other hand, for example, when the number of foreign substances detected by the foreign substance detector 208 is equal to or more than the predetermined value and the state of the resist solution in the first return pipe line 254a is determined to be bad as the result of the above determination, the opening/closing valve V8 provided on the drainage main-pipe line 255 is brought into an open state as illustrated in FIG. 12. This drains the resist solution in the first return pipe line 254a via the drainage main-pipe line 255.

As in the above manner, when the state of the treatment solution suppliable to the primary side of the filter 203 is determined to be bad, the supply of the treatment solution to the primary side of the filter 203 is restricted in this embodiment.

Note that in the pump ventilation, the number of times of the above determination performed until the pump ventilation is completed may be one or plural. Further, in the case where the determination is performed a plurality of times and when the state of the resist solution in the first return pipe line 254a is determined to be bad even once, it is preferable to bring the opening/closing valve V7 into a closed state and bring the opening/closing valve V8 into an open state to thereby drain the resist solution in the first return pipe line 254a during a period from the determination until after the pump ventilation is completed.

(Filer Ventilation)

The resist solution supply apparatus 200 performs filter ventilation of draining a predetermined amount of resist solution in the filter 203 from the filter 203 to the drainage line in order to remove air bubbles contained in the resist solution before filtration by the filter 203. The execution timing of the filter ventilation is set by the user and, for example, the filter ventilation is performed every time the discharge operation from the discharge nozzle 142 is performed m times (for example, 100 times).

Figure 13:
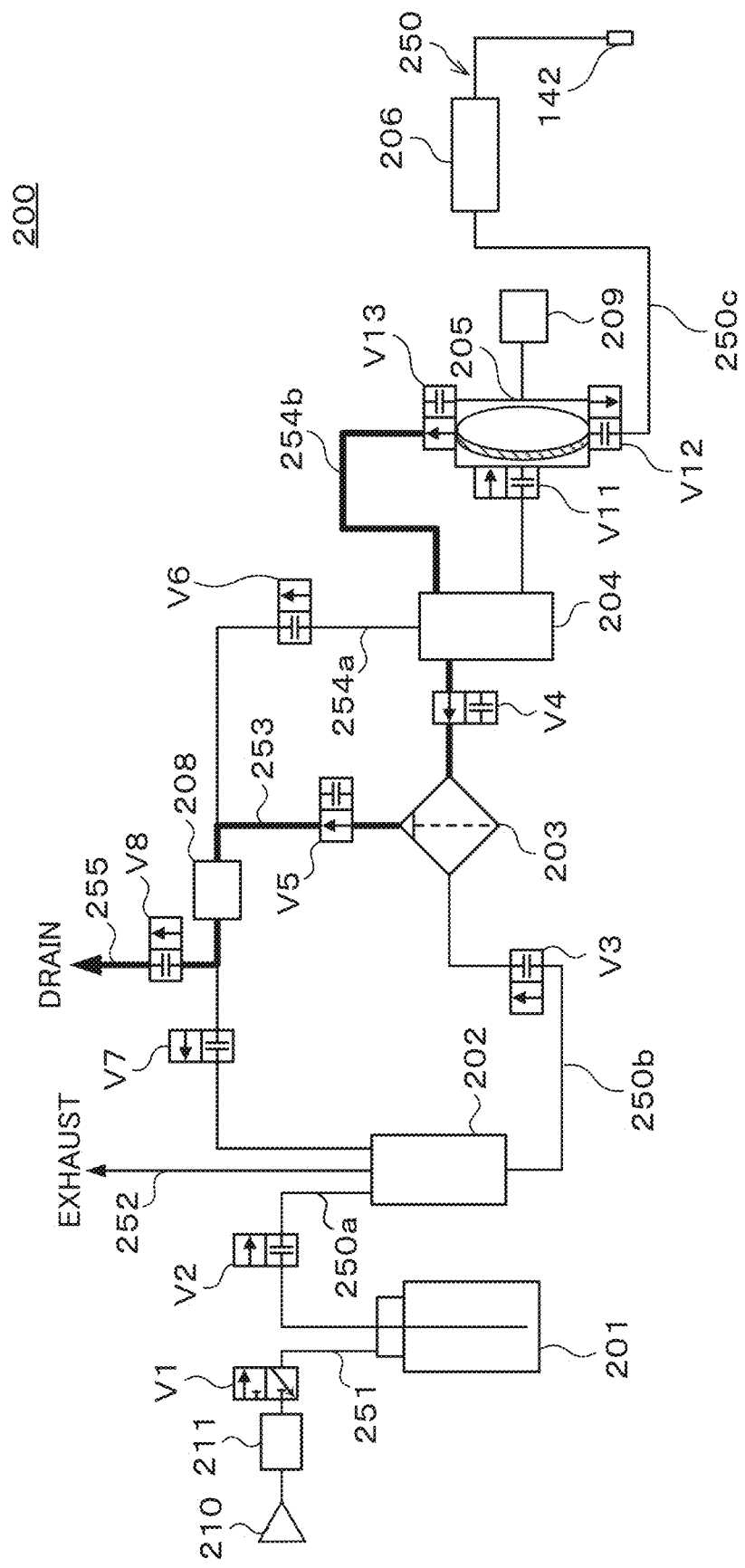
FIG. 13 illustrates the piping system for explaining the outline of the configuration of the resist solution supply apparatus and is another explanatory view of the filter ventilation step.

Once the operation of discharge from the discharge nozzle 142 at the m-th time set by the user ends, the opening/closing valve V12 of the pump 205 and the supply control valve 206 provided on the third supply pipe line 250c are brought into a closed state as illustrated in FIG. 13. Further, the opening/closing valve V13 of the pump 205, the opening/closing valve V4 provided on the second supply pipe line 250b, the opening/closing valve V5 provided on the drainage sub-pipe line 253, and the opening/closing valve V8 provided on the drainage main-pipe line 255 are brought into an open state. In this event, the inside of the operating chamber of the pump 205 is kept in a pressurized state by the driver 209. Therefore, the resist solution is pressure-fed from the pump 205 to the second return pipe line 254b, whereby an unfiltered resist solution in the filter 203 is drained via the drainage sub-pipe line 253, a part of the first return pipe line 154a, and the drainage main-pipe line 255.

In this embodiment, the return pipe line composed of the first return pipe line 254a and the like which can return the resist solution, which has been filtered by the filter 203 but not discharged and remains in the resist solution supply apparatus 200, to the portion on the primary side of the filter 203 on the coating solution supply pipe line 250 as explained above. Further, the drainage main-pipe line 255 branching off from the return pipe line is provided. The controller M outputs a control signal for feeding the resist solution, which has been filtered by the filter 203 but not discharged, to the return pipe line by the pump 205. Further, the controller M determines the state of the resist solution fed to the return pipe line based on the detection result by the foreign substance detector 208 provided on the return pipe line. When the state of the resist solution fed to the return pipe line is good as a result of the determination, the controller M outputs a control signal for returning the resist solution in the return pipe line to the buffer tank 202. Besides, when the state of the resist solution fed to the return pipe line is bad as the result of the determination, the controller M outputs a control signal so that the resist solution in the return pipe line is drained via the drainage main-pipe line 255.

Therefore, according to this embodiment, even if the resist solution filtered by the filter 203 is contaminated due to staying, the contaminated coating solution is never returned to the buffer tank 202. Therefore, it is possible to prevent the inside of the resist solution supply apparatus 200 from being contaminated with the contaminated coating solution. Therefore, according to this embodiment, it is possible to supply a resist solution cleaner than that in the case of feeding the resist solution to the buffer tank 202 irrespective of the state of the remaining resist solution filtered by the filter 203. Further, according to this embodiment, it is possible to make the resist solution to be supplied clean at all times.

Note that the un-filtered resist solution in the filter 203 is drained at all times in the filter ventilation in the above example. Instead of this, the detection by the foreign substance detector 208 is performed as in the pump ventilation also in the filter ventilation and the determination of the state of the resist solution is performed based on the detection result, and when the state of the resist solution is good, the resist solution may be returned to the buffer tank 202.

Second Embodiment

Figure 14:
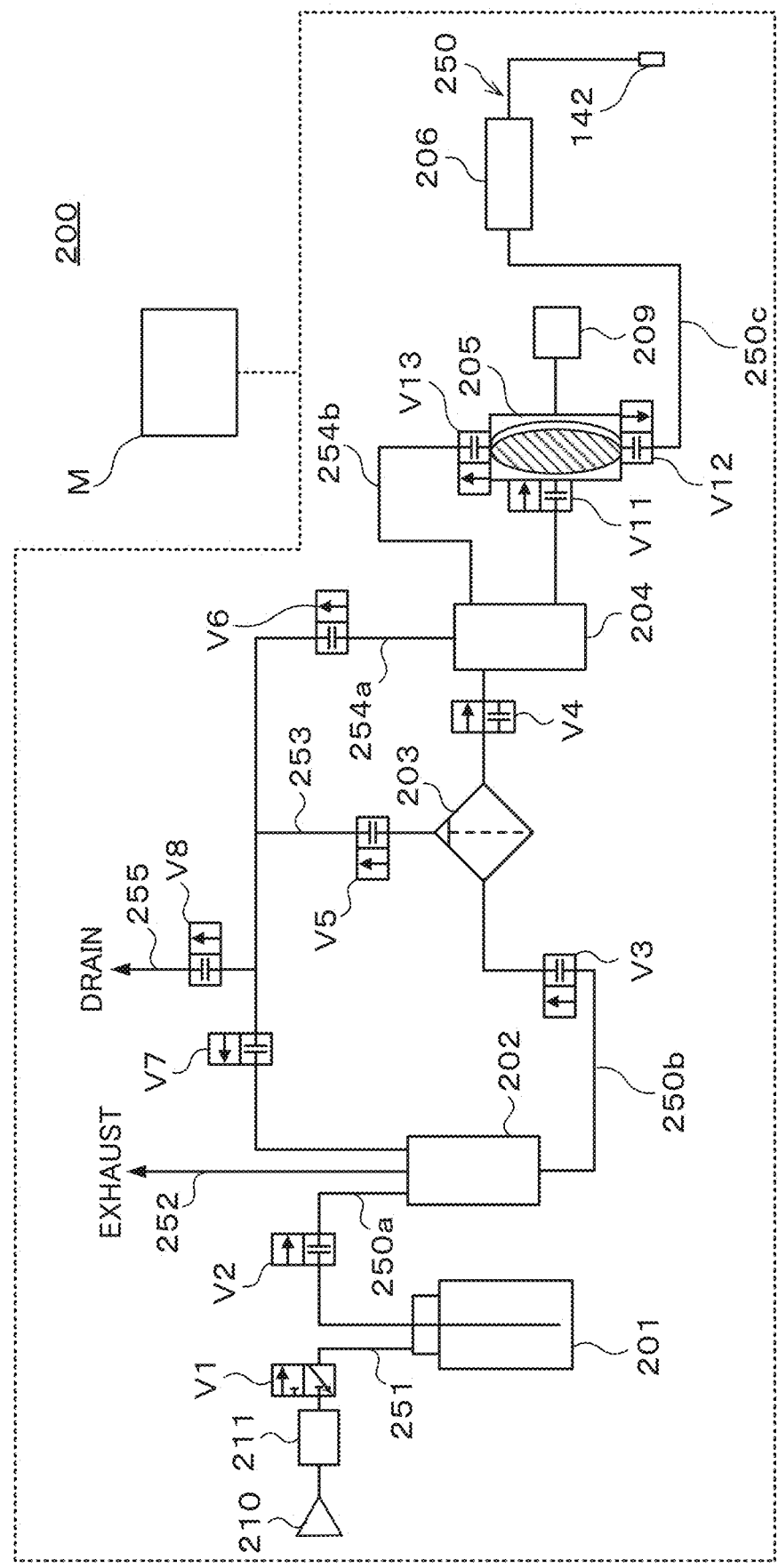
FIG. 14 is an explanatory view illustrating the outline of a configuration of a resist solution supply apparatus according to a second embodiment.

FIG. 14 is an explanatory view illustrating the outline of a configuration of a resist solution supply apparatus according to a second embodiment.

After a lapse of a long time from the performance of the dummy dispense, the likelihood that the resist solution is contaminated increases. Further, as the dummy dispense interval is longer, the likelihood that the resist solution is contaminated further increases even if the lapse time from the performance of the dummy dispense is short.

Therefore, the resist solution supply apparatus according to this embodiment determines the state of the resist solution fed into the return pipe line based on whether the period decided according to the dummy dispense interval has elapsed, unlike the first embodiment. Therefore, the resist solution supply apparatus 200 according to this embodiment is not provided with the foreign substance detector 208 (see FIG. 6) as illustrated in FIG. 14.

In this embodiment, for example, when the dummy dispense interval is 5 minutes, the determination whether the number of times of the discharge operation after the last dummy dispense is performed exceeds X times decided according to the dummy dispense interval at the point in time of the determination, is performed. Then, when the number of times of the discharge operation exceeds X times, the state of the resist solution fed into the return pipe line is determined to be bad, and when the number of times of the discharge operation does not exceed X times, the state of the resist solution is determined to be good. Besides, when the dummy dispense interval is 30 minutes, the determination whether the number of times of the discharge operation after the dummy dispense is performed exceeds Y (>X) times at the point in time of the determination is performed. When the number of times of the discharge operation exceeds Y times, the state of the resist solution fed into the return pipe line is determined to be bad, and when the number of times of the discharge operation does not exceed Y times, the state of the resist solution is determined to be good.

Also in this embodiment, it is possible to prevent the inside of the resist solution supply apparatus 200 from being contaminated with the coating solution contaminated after being filtered by the filter 203 as in the first embodiment.

Therefore, it is possible to supply a cleaner resist solution and make the resist solution to be supplied clean at all times also in this embodiment.

Third Embodiment

A solution supply apparatus according to this embodiment is configured as a coating solution supply apparatus which supplies a coating solution (for example, a resist solution) composed of a polymer solution as a treatment solution as in the solution supply apparatus according to the first embodiment.

(Verification Test 2)

Since the coating solution applied on the wafer sometimes contains many particles immediately after the replacement of the coating solution bottle or the like, the present inventors carried out a verification test about the coating solution bottle. In this verification test, particularly, verification was carried out about the difference between bottles in number of particles contained in the coating solution in the coating solution bottle and about the influence of the difference between bottles exerted on the quality of the coating solution to be supplied from the solution supply apparatus. Note that in the verification test, an EUV resist solution was used as the coating solution, and the same coating solution supply apparatus as a later-explained resist solution supply apparatus 200 in FIG. 15 was used. However, the resist solution supply apparatus used in this verification test is provided with neither a three-way valve V21 nor a drainage pipe line 256.

When one resist solution bottle was installed in the resist solution supply apparatus in the verification test, the foreign substance detector provided on the primary side of the filter on the coating solution supply pipe line of the resist solution supply apparatus detected 500 to 600 particles/ml. Further, when a surface foreign substance inspection apparatus carried out an inspection, 5 to 7 particles per wafer were observed in the resist solution supplied from the resist solution supply apparatus, in which the one resist solution bottle was installed, and discharged onto the wafer via the discharge nozzle.

Further, when another resist solution bottle was installed in the resist solution supply apparatus in the verification test, the foreign substance detector provided on the primary side of the filter on the coating solution supply pipe line of the resist solution supply apparatus detected 700 to 800 particles/ml. Further, when the surface foreign substance inspection apparatus carried out an inspection, 7 to 9 particles per wafer were observed in the resist solution supplied from the resist solution supply apparatus, in which the another resist solution bottle was installed, and discharged onto the wafer via the discharge nozzle.

From the result of the verification test, the following points were verified. It was verified that even if the quality of the resist solution bottle was guaranteed by the manufacturer of the resist solution, particles were contained in the resist solution in the resist solution bottle installed in the resist solution supply apparatus, and that the number of particles contained was different in each resist solution bottle. Further, it was verified that even when the resist solution was discharged after filtration by the filter, particles according to the number of particles in the resist solution to be supplied from the resist solution bottle were observed on the wafer.

Further, from the result of the above verification test, it is predicted that when particles as many as the number equal to or more than a threshold value are contained in the resist solution in the resist solution bottle, the filter cannot decrease the number of particles contained in the resist solution down to an allowable range.

Note that a conceivable reason why many particles are sometimes contained in the resist solution in the resist solution bottle even if its quality is guaranteed by the manufacturer of the resist solution is, for example, as follows. Specifically, it is conceivable that a particle detection apparatus is evolved accompanying the miniaturization of the semiconductor device and thus increases in sensitivity of detecting particles, and most of the manufacturers of the resist solution cannot secure the inspection environment according to the evolution of the detection apparatus. It is also conceivable that the miniaturization proceeds and new kinds of resist solutions different from the conventional one are increasingly used and therefore fine particles may occur in the new kinds of resist solutions even in the environment (transport environment and storage environment) which cause no problem for the conventional resist.

A third embodiment explained below is based on the result of the above study.

Figure 15:
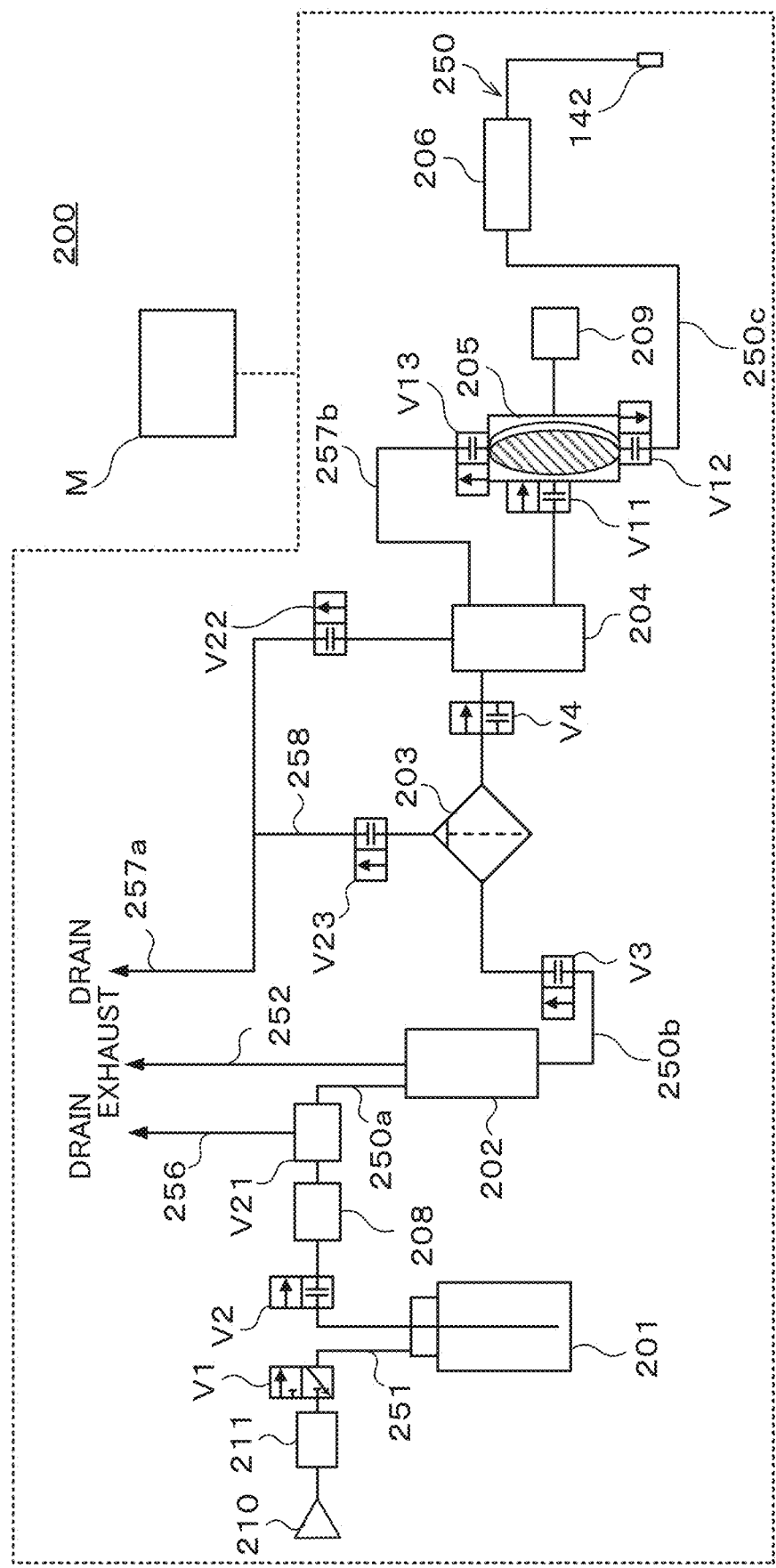
FIG. 15 is an explanatory view illustrating the outline of a configuration of a resist solution supply apparatus according to a third embodiment.

FIG. 15 is an explanatory view illustrating the outline of a configuration of a resist solution supply apparatus according to a third embodiment.

In a resist solution supply apparatus 200 according to this embodiment, the first supply pipe line 250a located on the primary side of the filter 203 on the coating solution supply pipe line 250 is provided with the opening/closing valve V2, the foreign substance detector 208, and the three-way valve V21 in this order from the upstream side. One of three fluid ports of the three-way valve V21 leads to the upstream side of the first supply pipe line 250a, another of the three fluid ports leads to the downstream side of the first supply pipe line 250a, and the remaining one of the three fluid ports leads to a drainage pipe line 256. In other words, the three-way valve V21 is provided on a branch point to the drainage pipe line 256 on the first supply pipe line 250a, and the foreign substance detector 208 is provided on the upstream side of the branch point on the first supply pipe line 250a.

Next, operations of the resist solution supply apparatus 200 in FIG. 15 different from those of the above-described embodiment will be explained based on FIG. 16 to FIG. 18.

(Additional Supply to the Buffer Tank 202)

Figure 16:
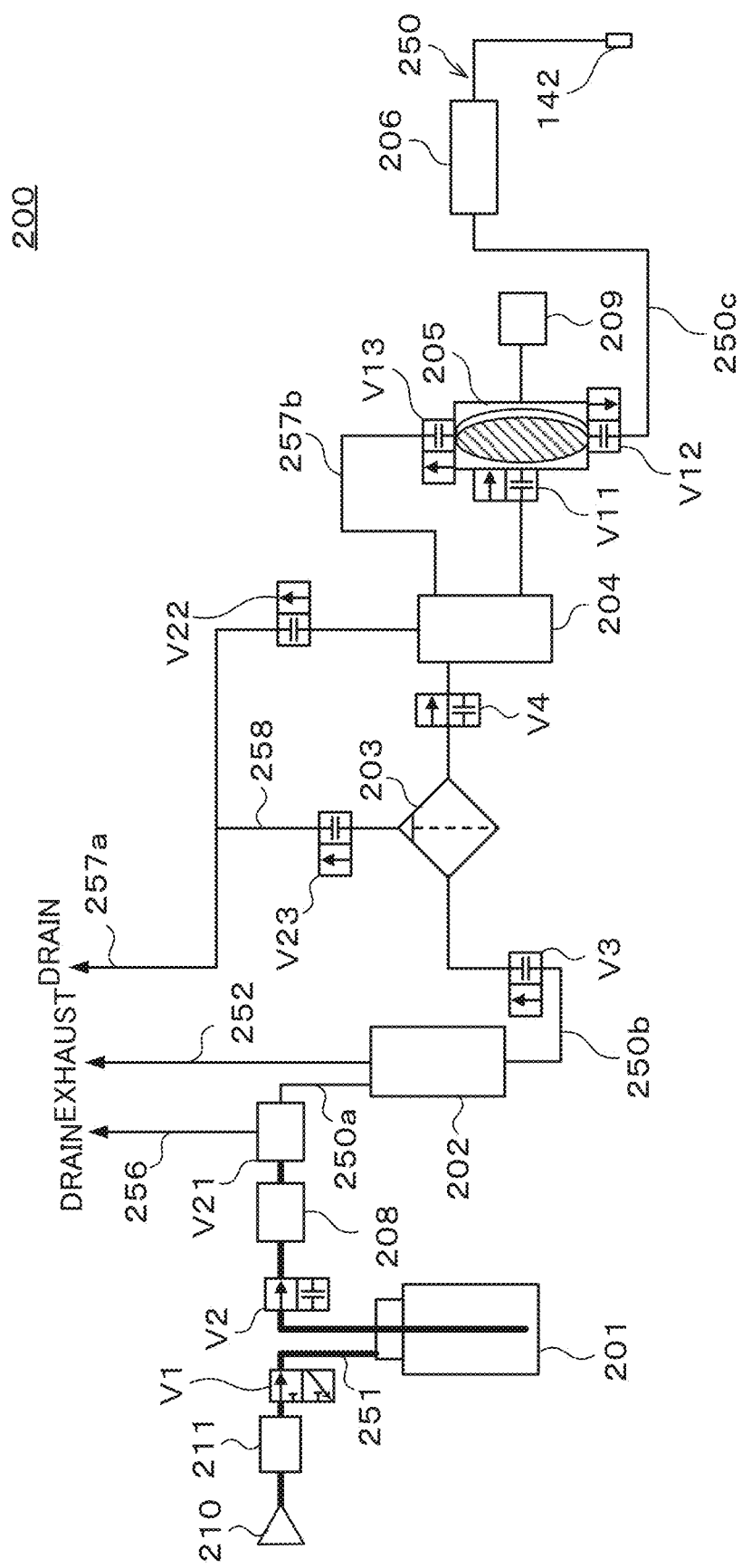
FIG. 16 illustrates a piping system for explaining the outline of the configuration of the resist solution supply apparatus and is an explanatory view of a step of additional supply to a buffer tank.

As illustrated in FIG. 16, based on a control signal from the controller M, the opening/closing valve V1 provided on the gas supply pipe line 251 and the opening/closing valve V2 provided on the first supply pipe line 250a are brought into an open state. Then, the resist solution in the resist solution bottle 201 is fed into the first supply pipe line 250a by the pressure of the nitrogen gas supplied from the gas supply source 210 into the resist solution bottle 201. In this event, the three-way valve V21 is in a state where a portion on the upstream side of the first supply pipe line 250a leads neither to a downstream side portion of the first supply pipe line 250a nor to the drainage pipe line 256.

Then, the controller M determines the state of the resist solution in the first supply pipe line 250a based on the detection result by the foreign substance detector 208.

Figure 17:
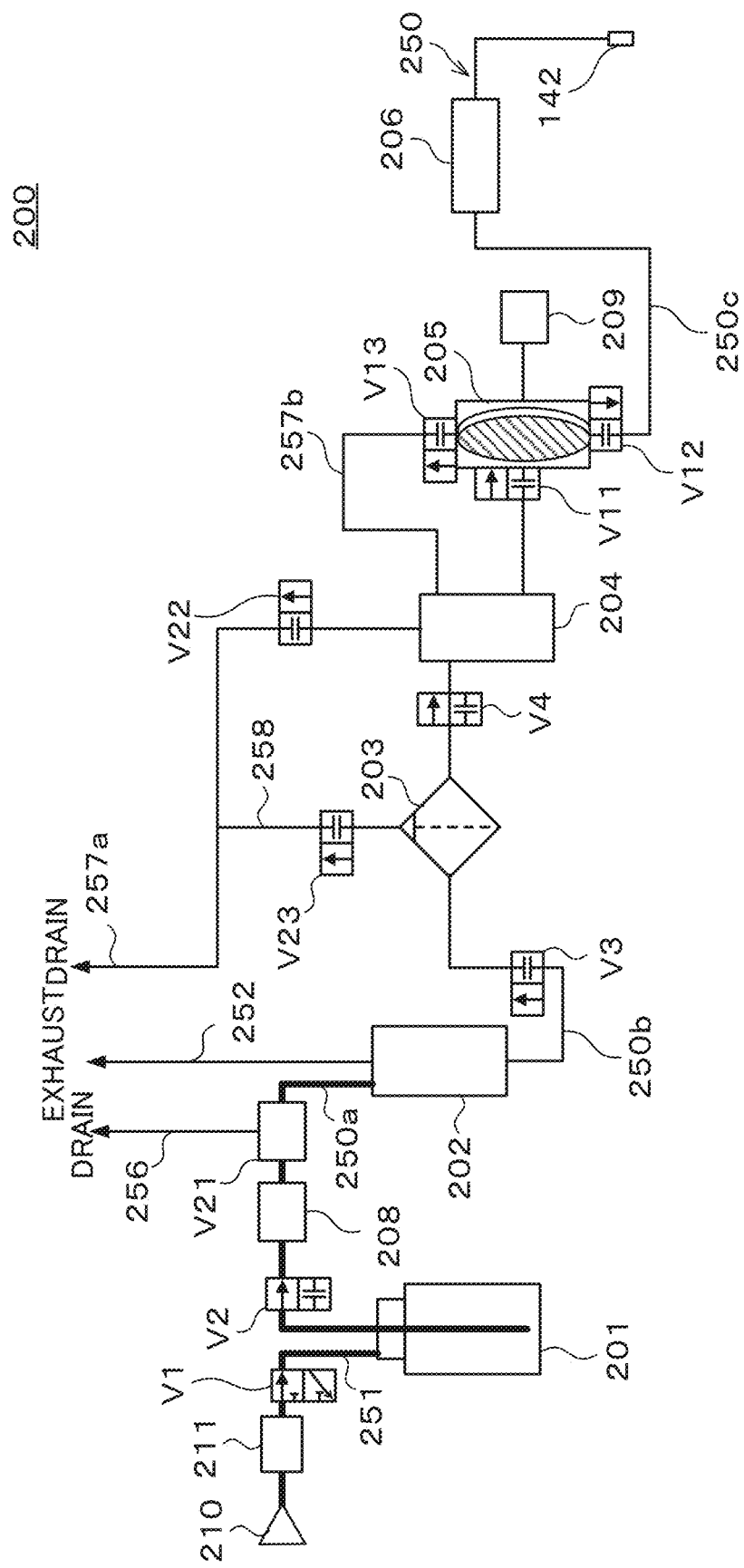
FIG. 17 illustrates the piping system for explaining the outline of the configuration of the resist solution supply apparatus and is another explanatory view of the step of additional supply to the buffer tank.

For example, when the number of foreign substances detected by the foreign substance detector 208 is less than a predetermined value and the state of the resist solution in the first supply pipe line 250a, namely, the state of the resist solution bottle 201 is determined to be good as a result of the above determination, the state of the three-way valve V21 is switched as illustrated in FIG. 17. This brings the portion on the upstream side of the first supply pipe line 250a into a state of leading to the portion on the downstream side of the first supply pipe line 250a to thereby supply and additionally supply the resist solution in the resist solution bottle 201 to the buffer tank 202.

Figure 18:
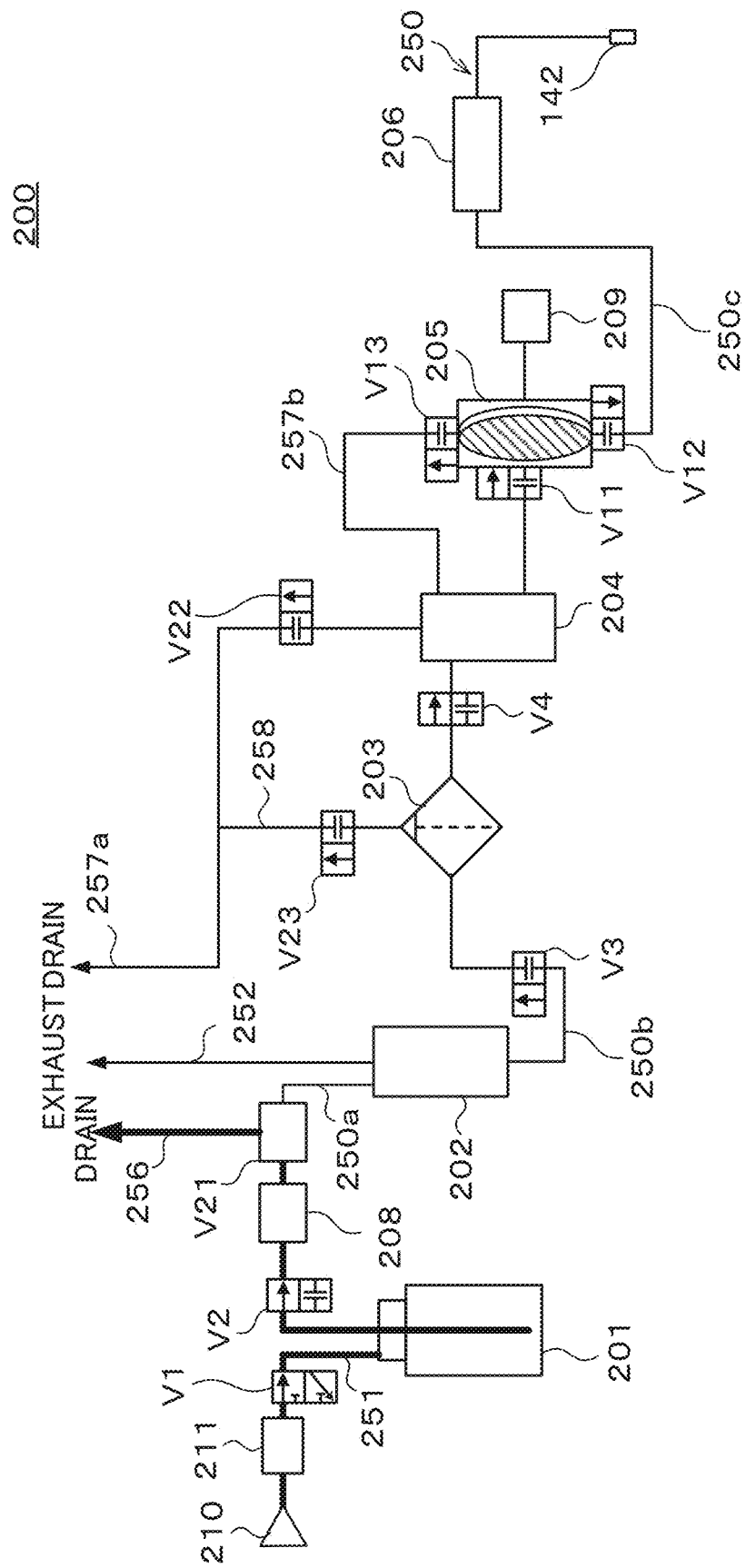
FIG. 18 illustrates the piping system for explaining the outline of the configuration of the resist solution supply apparatus and is another explanatory view of the step of additional supply to the buffer tank.

On the other hand, for example, when the number of foreign substances detected by the foreign substance detector 208 is equal to or more than the predetermined value and the state of the resist solution in the first supply pipe line 250a, namely, the state of the resist solution bottle 201 is determined to be bad as the result of the above determination, the state of the three-way valve V21 is switched as illustrated in FIG. 18. This brings the portion on the upstream side of the first supply pipe line 250a into a state of leading to the drainage pipe line 256 to thereby drain the contaminated resist solution in the resist solution bottle 201 via the drainage pipe line 256.

As in the above manner, when the state of the coating solution in the resist solution bottle 201 suppliable to the primary side of the filter 203 is determined to be bad, the supply of the coating solution to the primary side of the filter 203 is restricted in this embodiment.

Note that when the state of the resist solution bottle 201 is determined to be bad, the resist solution in the resist solution bottle 201 is drained via the drainage pipe line 256 in the above example. However, the draining or the like is not performed, but a notification that the resist solution bottle 201 should be replaced may be made using a display or the like.

In the resist solution supply apparatus 200 in this embodiment, only when the state of resist solution in the resist solution bottle 201 is good, the resist solution in the resist solution bottle 201 is supplied to the buffer tank 202. More specifically, the resist solution supply apparatus 200 in this embodiment is configured such that only when the state of resist solution in the resist solution bottle 201 is good, the resist solution in the resist solution bottle 201 is supplied to the primary side of the filter 203 and the pump 205. Therefore, the buffer tank 202 and the portion on the downstream side of the buffer tank 202 of the resist solution supply apparatus 200 are never contaminated with the contaminated resist solution in the resist solution bottle 201. Therefore, according to this embodiment, it is possible to supply a resist solution cleaner than that in the case of feeding the resist solution to the buffer tank 202 irrespective of the state of the resist solution in the resist solution bottle 201. Further, according to this embodiment, it is possible to make the resist solution to be supplied clean at all times.

Note that in the resist solution supply apparatus 200 in this embodiment, the trap tank 204 is connected to a drainage main-pipe line 257a provided with an opening/closing valve V22. Further, the filter 203 is connected to a drainage sub-pipe line 258 connected to the drainage main-pipe line 257a, and the drainage sub-pipe line 258 is provided with an opening/closing valve V23. Though the resist solution supply apparatus in the first embodiment is provided with the second return pipe line 254b (see FIG. 6), the resist solution supply apparatus 200 in this embodiment is provided with a drainage main-pipe line 257b at the portion where the second return pipe line 254b is provided.

In the pump ventilation in the resist solution supply apparatus 200 in this embodiment, the controller M outputs a control signal so that the resist solution in the pump 205 and the trap tank 204 is drained via the drainage main-pipe lines 257a, 257b.

In the filter ventilation in the resist solution supply apparatus 200 in this embodiment, the controller M outputs a control signal so that the un-filtered resist solution in the filter 203 is drained via the drainage sub-pipe line 258 and the drainage main-pipe line 257a.

Fourth Embodiment

Figure 19:
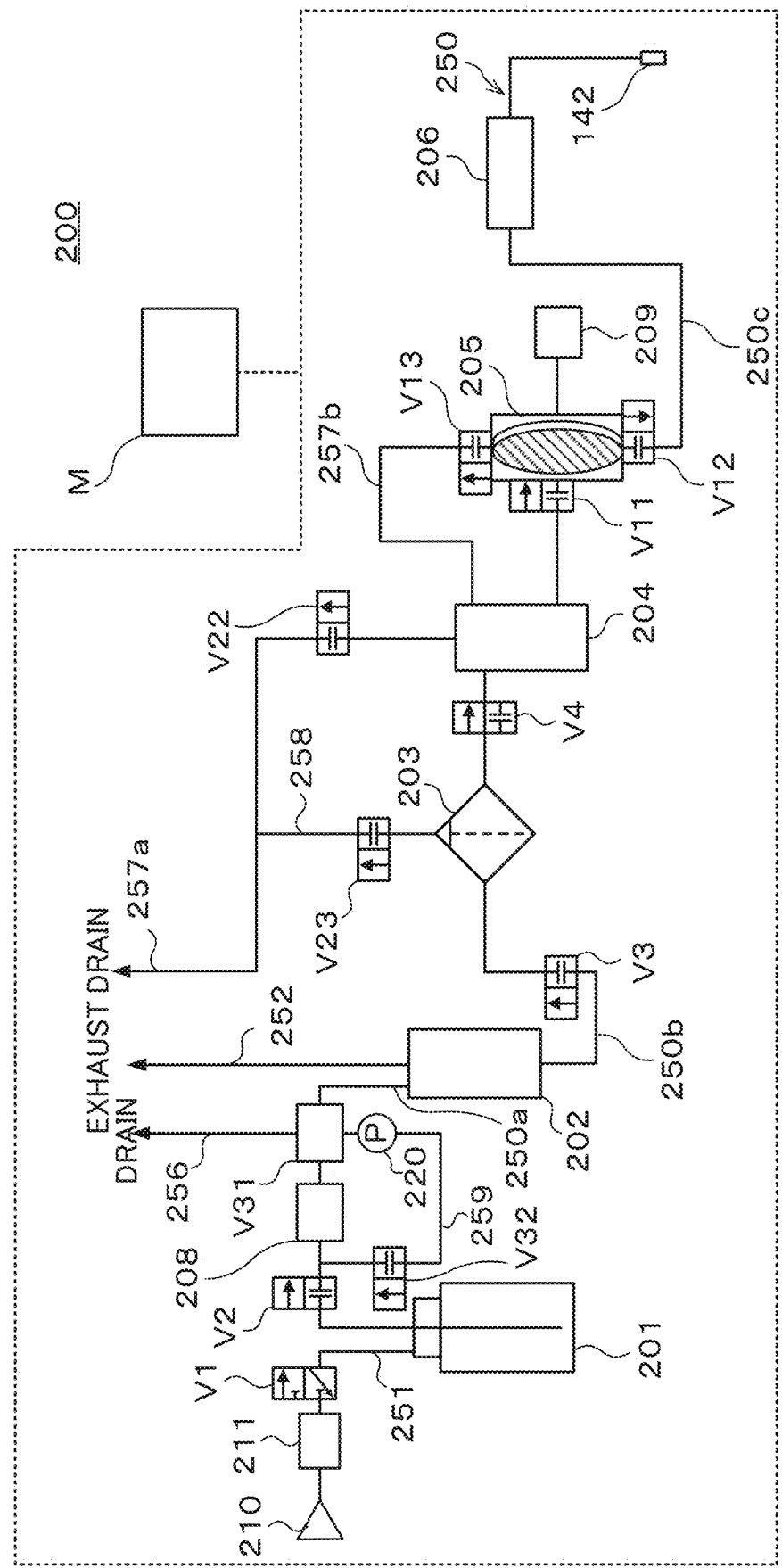
FIG. 19 is an explanatory view illustrating the outline of a configuration of a resist solution supply apparatus according to a fourth embodiment.

FIG. 19 is an explanatory view illustrating the outline of a configuration of a resist solution supply apparatus according to a fourth embodiment.

A resist solution supply apparatus 200 according to this embodiment is provided with, as illustrated in FIG. 19, a four-way valve V31 at a position of the three-way valve V21 in the configuration of the resist solution supply apparatus according to the third embodiment. The resist solution supply apparatus 200 according to this embodiment further includes a return pipe line 259 connecting the four-way valve V31 and a portion between the opening/closing valve V2 and the foreign substance detector 208 on the first supply pipe line 250a. The return pipe line 259 is, in other words, intended to connect the primary side and the secondary side of the foreign substance detector 208 on the first supply pipe line 250a. The return pipe line 259 has a pump 220 and an opening/closing valve V32 in order from the upstream side.

One of four fluid ports of the four-way valve V31 leads to the upstream side of the first supply pipe line 250a, another of the four fluid ports leads to the downstream side of the first supply pipe line 250a, another of the four fluid ports leads to the drainage pipe line 256, and the remaining one of the four fluid ports leads to the return pipe line 259.

Next, operations of the resist solution supply apparatus 200 in FIG. 19 different from those of the above-described embodiments will be explained based on FIG. 20 to FIG. 22.

(Additional Supply to the Buffer Tank 202)

Figure 20:
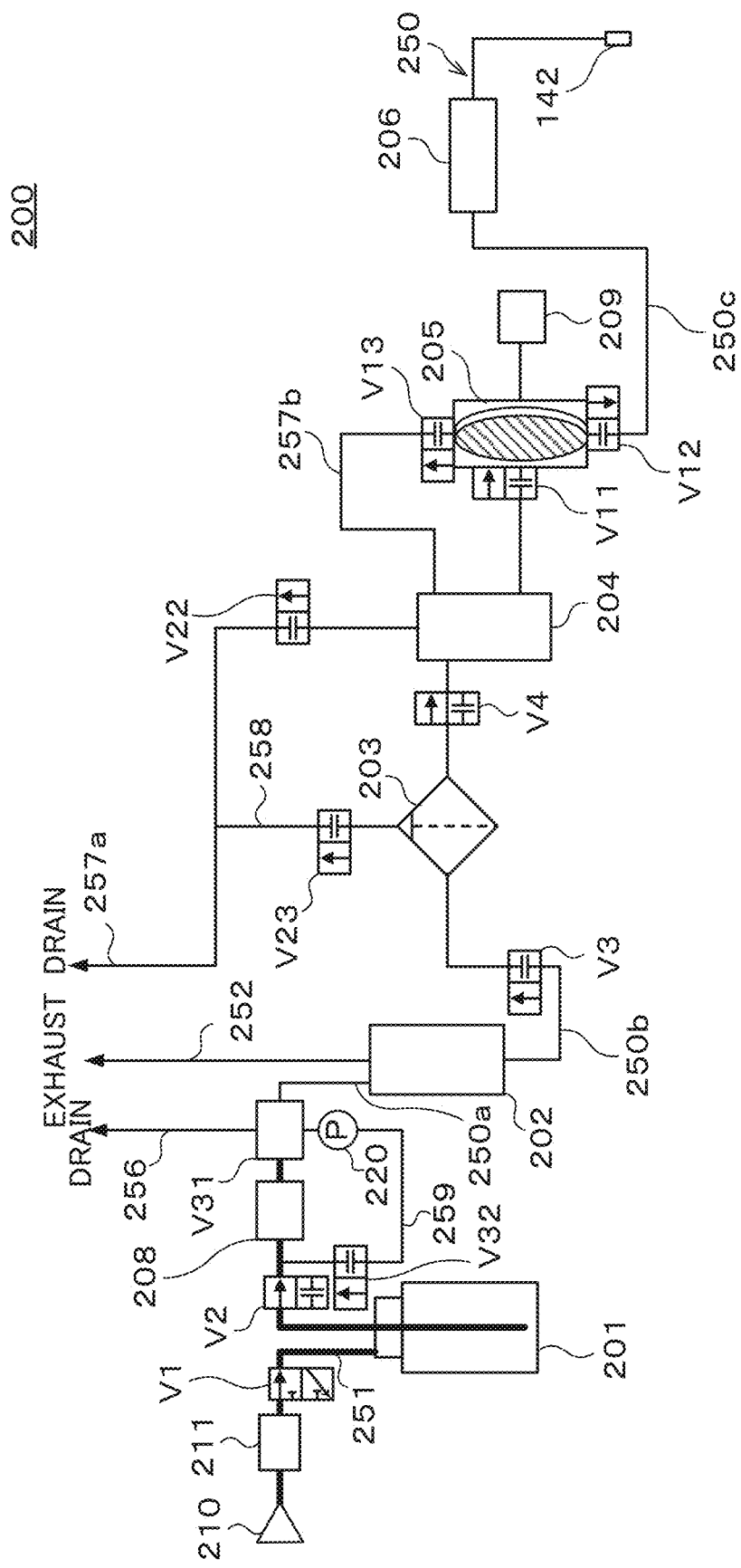
FIG. 20 illustrates a piping system for explaining the outline of the configuration of the resist solution supply apparatus and is an explanatory view of a step of additional supply to a buffer tank.

As illustrated in FIG. 20, based on a control signal from the controller M, the opening/closing valve V1 provided on the gas supply pipe line 251 and the opening/closing valve V2 provided on the first supply pipe line 250a are brought into an open state. Then, the resist solution in the resist solution bottle 201 is fed to the first supply pipe line 250a by the pressure of the nitrogen gas supplied from the gas supply source 210 into the resist solution bottle 201.

Figure 21:
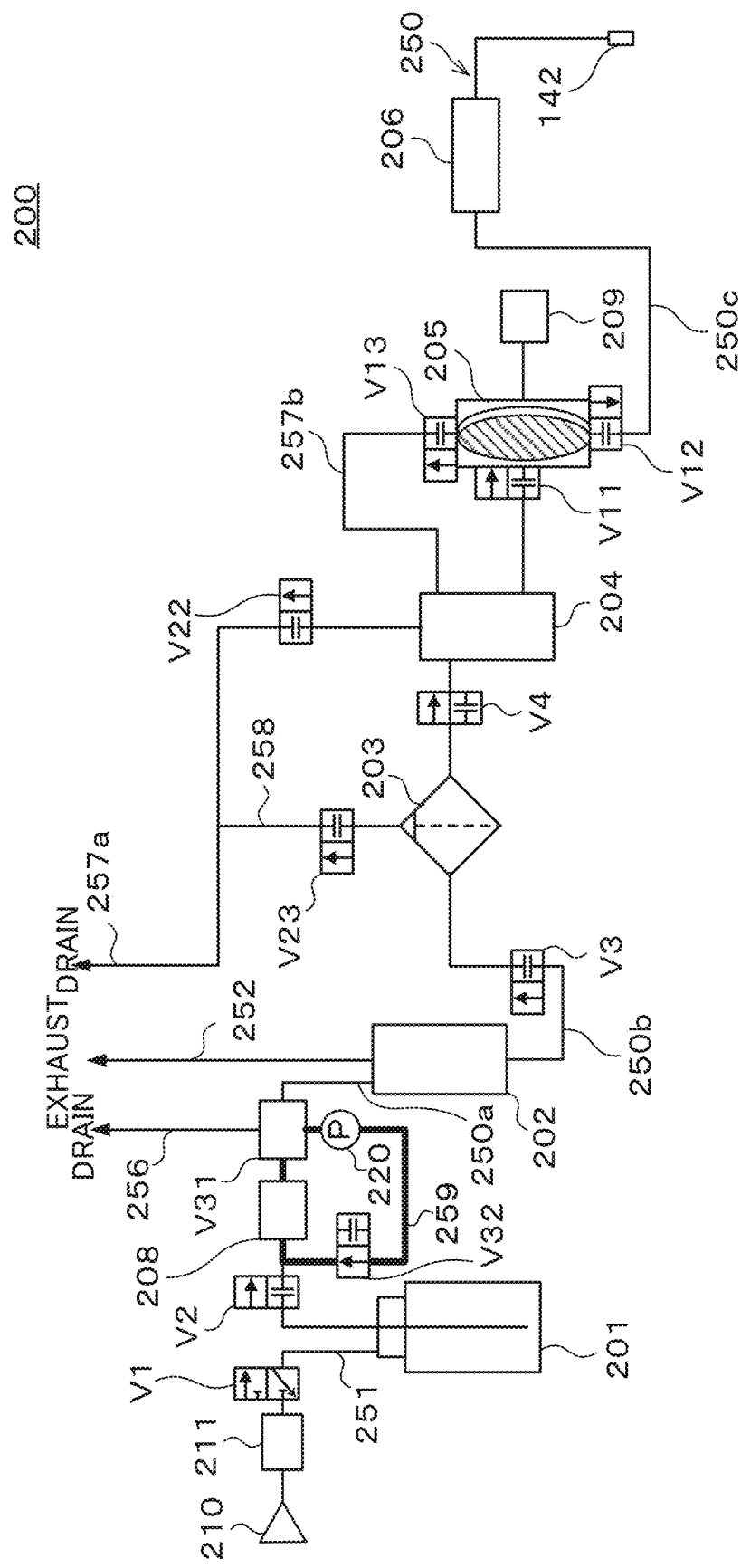
FIG. 21 illustrates the piping system for explaining the outline of the configuration of the resist solution supply apparatus and is another explanatory view of the step of additional supply to the buffer tank.
Figure 22:
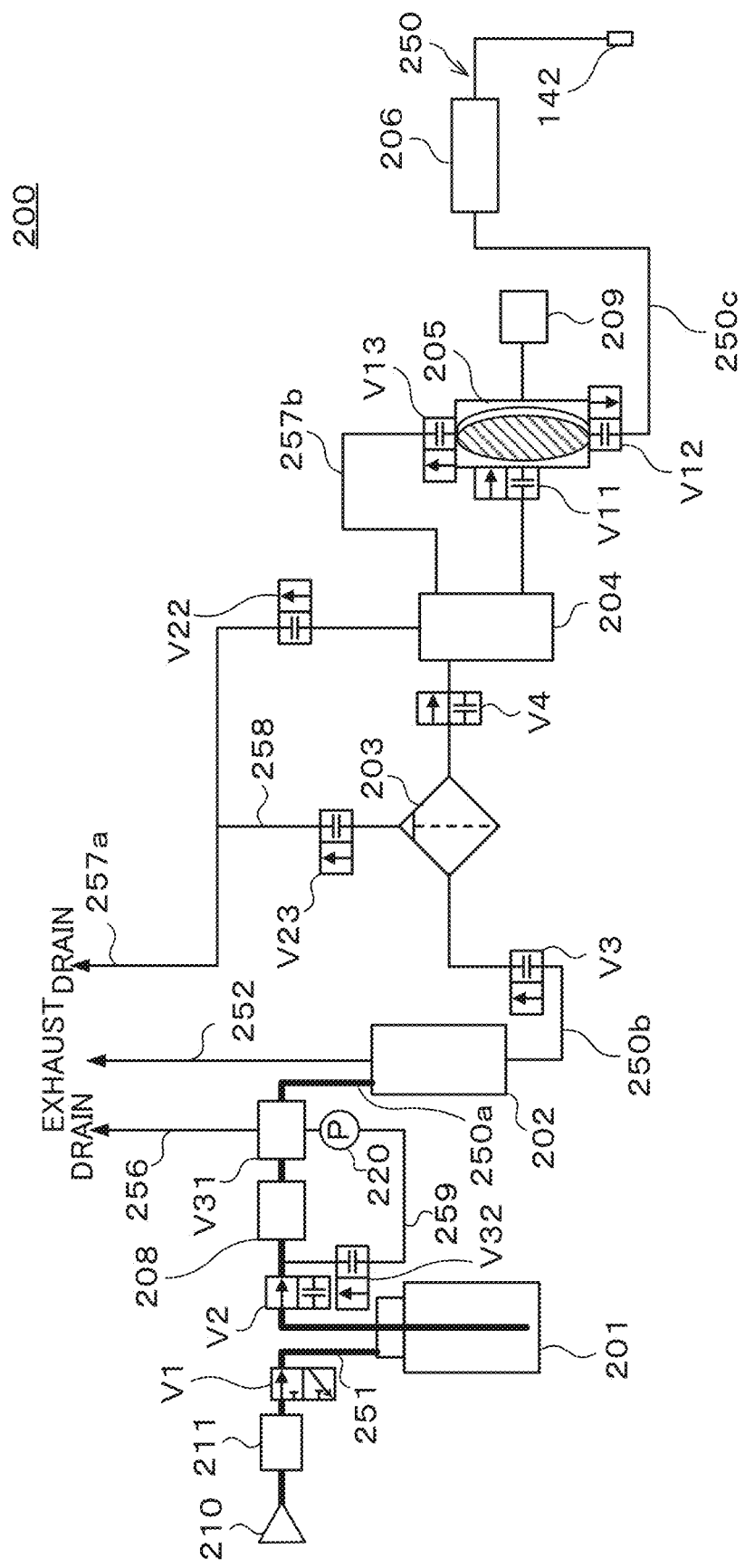
FIG. 22 illustrates the piping system for explaining the outline of the configuration of the resist solution supply apparatus and is another explanatory view of the step of additional supply to the buffer tank.

Then, as illustrated in FIG. 21, the opening/closing valve V2 is brought into a closed state, the opening/closing valve V32 provided on the return pipe line 259 is brought into an open state, and the pump 220 is operated. This circulates the resist solution in a circulation path including the return pipe line 259 and the portion where the foreign substance detector 208 is provided on the first supply pipe line 250a. The return pipe line 259 is subjected to foreign substance detection a plurality of times in the foreign substance detector 208 during the circulation of the resist solution.

Then, the controller M determines the state of the resist solution in the first supply pipe line 250a, namely, the state of the resist solution bottle 201 based on the result of the foreign substance detection performed the plurality of times.

It is assumed that, for example, an average value of the number of foreign substances detected by the foreign substance detector 208 is less than a predetermined value and the state of the resist solution in the first supply pipe line 250a, namely, the state of the resist solution bottle 201 is determined to be good as a result of the above determination. In this case, the controller M brings the opening/closing valves V1, V2 again into an open state, brings the opening/closing valve V32 into a closed state, and switches the state of the four-way valve V31 to establish a state where the portion on the upstream side of the first supply pipe line 250a leads to the portion on the downstream side of the first supply pipe line 250a as illustrated in FIG. 22. Further, the operation of the pump 220 is stopped. This supplies and additionally supplies the resist solution in the resist solution bottle 201 to the buffer tank 202.

Figure 23:
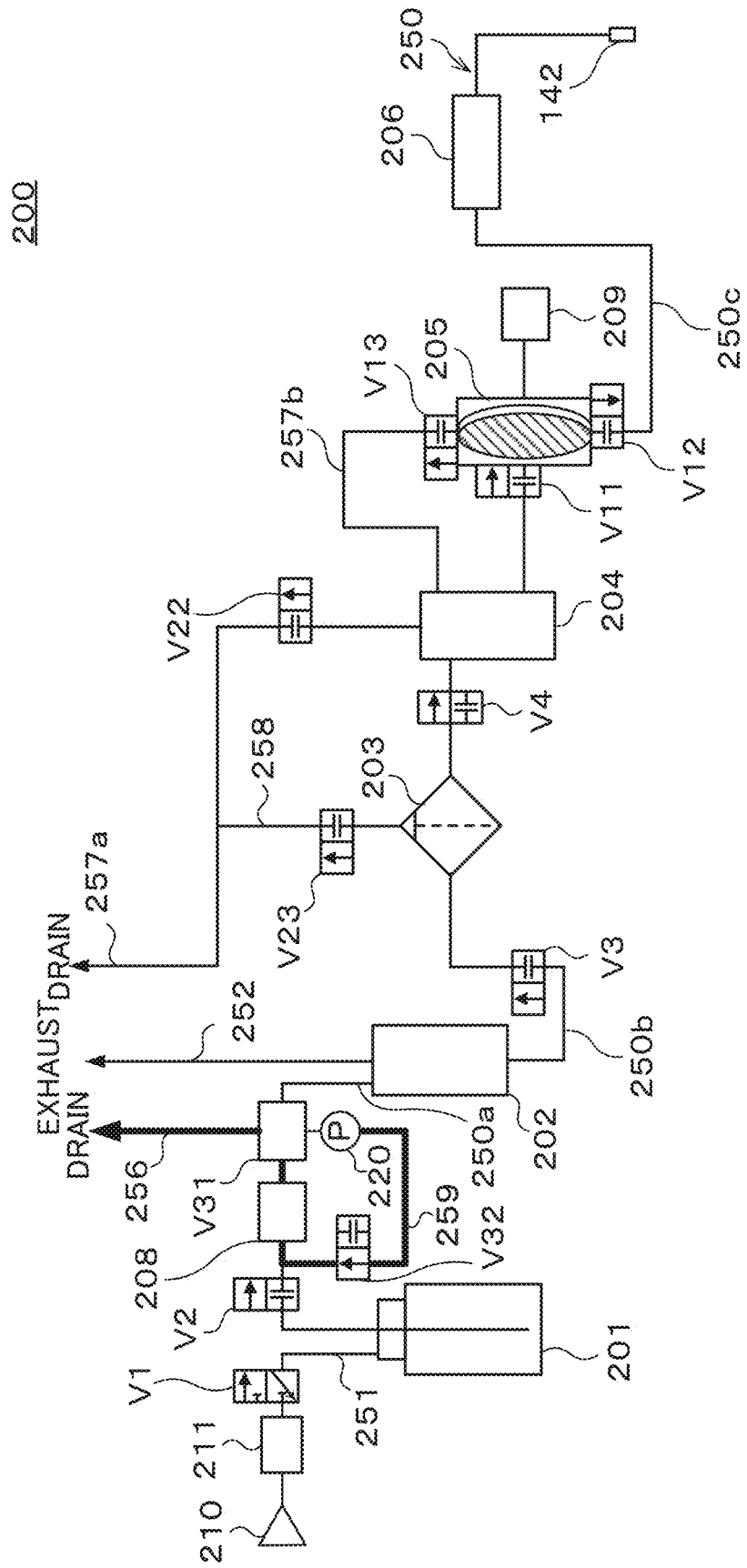
FIG. 23 illustrates the piping system for explaining the outline of the configuration of the resist solution supply apparatus and is another explanatory view of the step of additional supply to the buffer tank.

On the other hand, it is assumed that, for example, the average value of the number of foreign substances detected by the foreign substance detector 208 is equal to or more than the predetermined value and the state of the resist solution in the first supply pipe line 250a, namely, the state of the resist solution bottle 201 is determined to be bad as the result of the above determination. In this case, the four-way valve V31 is switched to establish a state where the portion on the upstream side of the first supply pipe line 250a leads to the drainage pipe line 256 as illustrated in FIG. 23. This drains the resist solution in the aforementioned circulation path including the return pipe line 259 via the drainage pipe line 256. Further, in addition with the drainage, it is preferable to make a notification that the resist solution bottle 201 should be replaced using a display or the like.

Since the state of the resist solution bottle 201 is determined based on the result of the foreign substance detection performed the plurality of times as explained above, the determination can be made more accurately in this embodiment.

Fifth Embodiment

Figure 24:
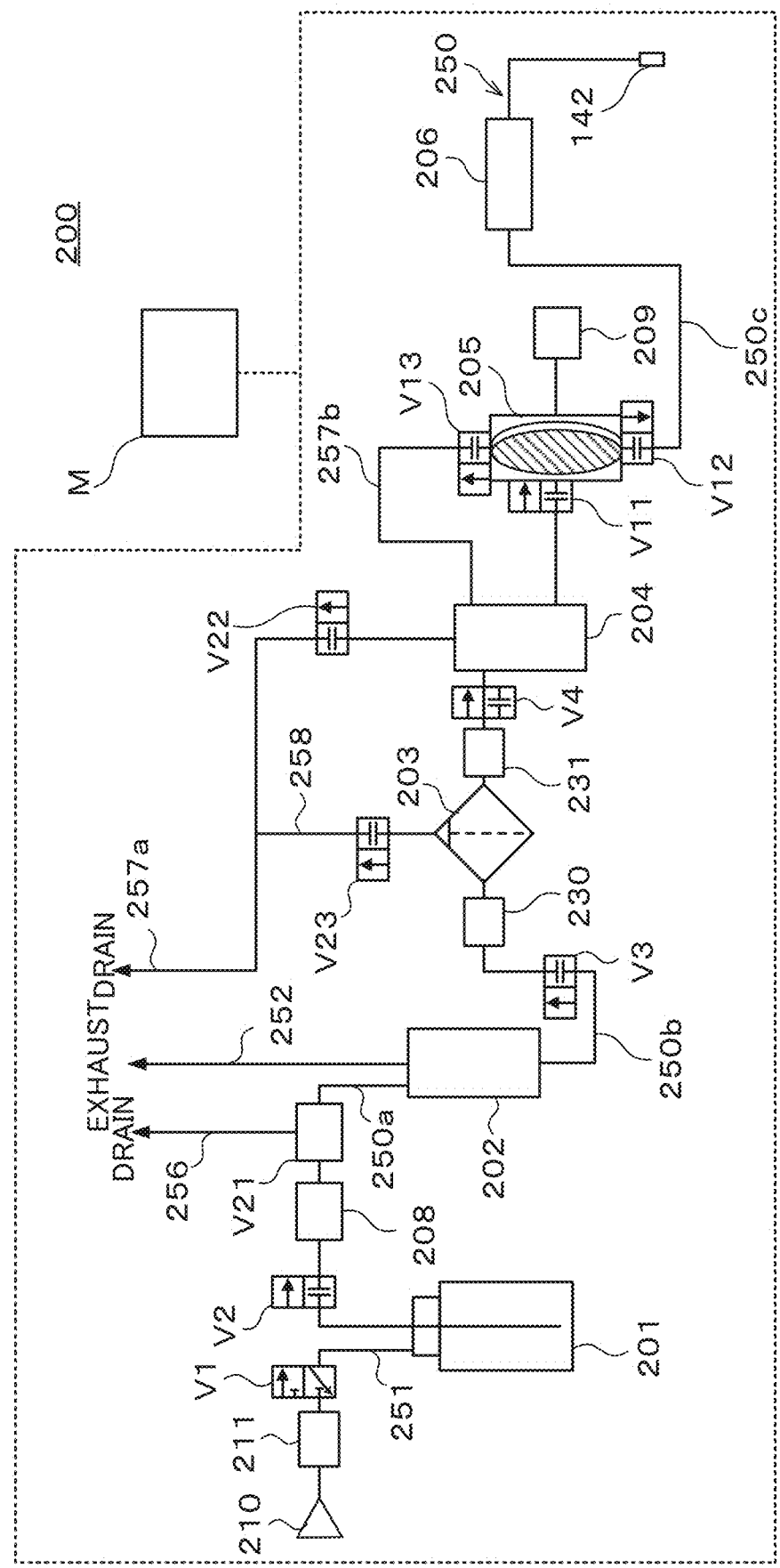
FIG. 24 is an explanatory view illustrating the outline of a configuration of a resist solution supply apparatus according to a fifth embodiment.

FIG. 24 is an explanatory view illustrating the outline of a configuration of a resist solution supply apparatus according to a fifth embodiment.

A resist solution supply apparatus 200 according to this embodiment is provided with, as illustrated in FIG. 24, foreign substance detectors 230, 231 on the primary side and the secondary side of the filter 203 respectively on the second supply pipe line 250b in addition to the configuration of the resist solution supply apparatus according to the third embodiment. The configurations of the foreign substance detectors 230, 231 are the same as that of the foreign substance detector 208.

According to the study by the present inventors, when the resist solution is filtered by the filter 203, the ratio of the number of particles contained in the filtered resist solution to the number of particles contained in the resist solution before filtration is constant unless the performance of the filter 203 stays unchanged, but increases when the performance of the filter 203 deteriorates.

Hence, in this embodiment, the foreign substance detectors 230, 231 are provided on the primary side and the secondary side of the filter 203 on the second supply pipe line 250b, respectively as explained above, and the controller M determines the performance of the filter 203 based on the detection result by the foreign substance detector 230 on the primary side and on the detection result by the foreign substance detector 231 on the secondary side.

For example, when the number of particles detected by the foreign substance detector 230 on the primary side is equal to or less than a certain level and when the ratio of the number of particles detected by the foreign substance detector 231 on the secondary side to the number of particles detected by the foreign substance detector 230 on the primary side is equal to or more than a predetermined value, the controller M determines that the removal performance of the filter 203 has deteriorated. When it is determined that the removal performance has deteriorated, the controller M makes a notification that the filter 203 should be replaced or a notification that the dummy dispense interval should be shortened, using a display or the like, or changes the dummy dispense interval to a short interval.

Note that, for example, when the number of particles detected by the foreign substance detector 230 on the primary side is more than the certain level, it is conceivable that the cleanliness of the resist solution bottle 201 is bad. Therefore, the controller M performs a control to make a notification that the chemical bottle should be replaced while performing a control so that the discharge operation is continued, or performs a control to make the same notification while performing a control so that the discharge operation is not performed.

Note that though the illustration and detailed explanation are omitted, foreign substance detectors may be provided on the primary side and the secondary side of the filter 203 also in the resist solution supply apparatuses in the first embodiment and the second embodiment and solution supply apparatuses in later-explained embodiments to perform determination as in this embodiment.

Though the coating solution is the resist solution in the explanation of the above first to fifth embodiments, the coating solution is not limited to this but may be a coating solution or the like for forming, for example, an SOC (Spin On Carbon) film, an SOD (Spin on Dielectric) film, or an SOG (Spin on Glass) film.

Sixth Embodiment

A solution supply apparatus according to this embodiment supplies a developing solution or the like composed of a non-polymer solution as the treatment solution unlike the solution supply apparatus according to the first embodiment or the like. Besides, the resist solution as the treatment solution is additionally supplied from the resist solution bottle to the solution supply apparatus in the first embodiment, but the developing solution or the like as the treatment solution is additionally supplied via an external pipe line laid in a space such as a factory where the solution supply apparatus is installed in this embodiment.

(Verification Test 3)

In the case where the treatment solution is additionally supplied to the solution supply apparatus via the external pipe line laid in the factory or the like, many particles may be contained in the treatment solution being the non-polymer solution such as the developing solution or the like discharged on the wafer at the time of start-up of the factory, immediately after the construction of the external pipe line, or the like. Because of the above or the like, the present inventors verified the number of particles in the treatment solution such as the developing solution or the like additionally supplied via the external pipe line and the influence of the number of particles exerted on the quality of the treatment solution to be supplied from the solution supply apparatus and discharged. Note that in this verification test, the same solution supply apparatus as a later-explained solution supply apparatus 400 in FIG. 26 was used.

Figure 25:
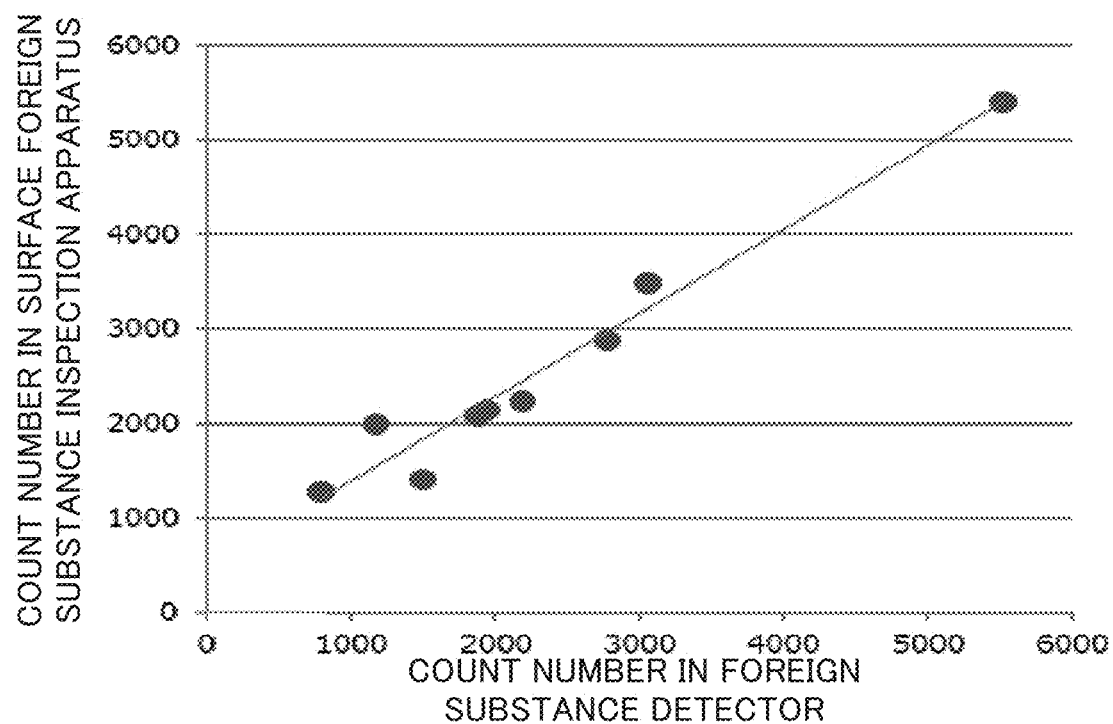
FIG. 25 is a graph illustrating a test result of a verification test 3.

FIG. 25 is a graph illustrating the result of the verification test 3. In the graph, the horizontal axis indicates the number of particles in the treatment solution to be additionally supplied via the external pipe line, that is, the number detected by the foreign substance detector which is provided on the upstream side of the filter in the solution supply apparatus and performs foreign substance detection by light. Besides, the vertical axis indicates the number of particles in the treatment solution additionally supplied via the external pipe line, supplied to the discharge nozzle via the filter, and discharged on the wafer, that is, the number observed by inspection by the surface foreign substance inspection apparatus. Note that the foreign substance detector detected large particles of 200 nm or more, and the surface foreign substance inspection apparatus detected small particles of 40 nm or more. Note that the treatment solution used in this verification test is a positive developing solution.

As illustrated in FIG. 25, even when the discharge of the treatment solution additionally supplied via the external pipe line is performed via the filter, small particles are contained in the discharged treatment solution. Further, the number of large particles contained in the treatment solution additionally supplied via the external pipe line and detected by the foreign substance detector and the number of small particles contained in the treatment solution discharged on the wafer via the filter and detected by the surface foreign substance inspection apparatus are in a proportional relationship.

Further, from the result of the above verification test, it is predicted that when particles as many as a predetermined number or more are contained in the treatment solution to be additionally supplied via the external pipe line, the filter cannot decrease the number of particles contained in the treatment solution down to an allowable range.

A sixth embodiment explained below is based on the result of the above study.

Figure 26:
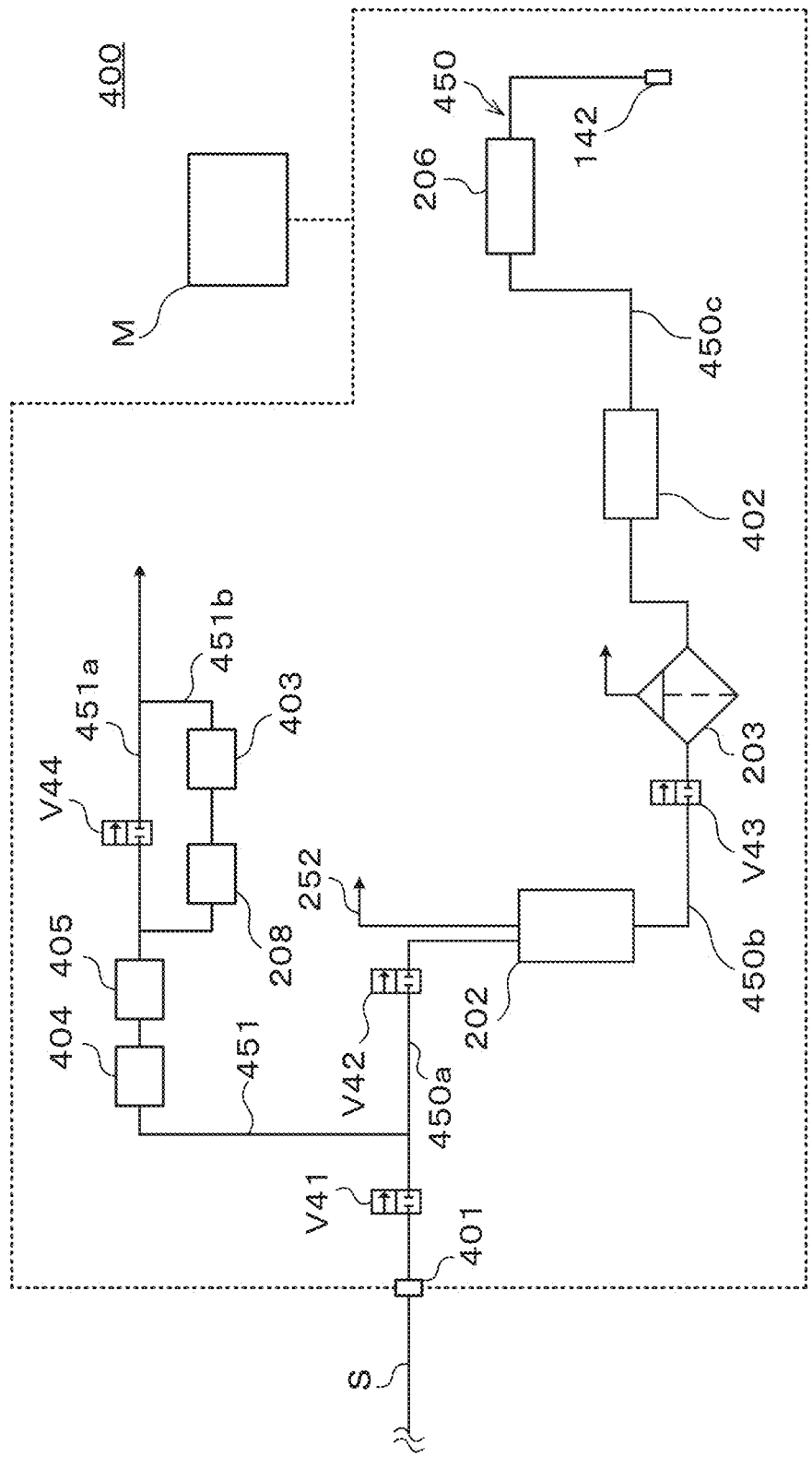
FIG. 26 is an explanatory view illustrating the outline of a configuration of a solution supply apparatus according to a sixth embodiment.

FIG. 26 is an explanatory view illustrating the outline of a configuration of the solution supply apparatus 400 according to this embodiment. Note that the solution supply apparatus 400 is provided, for example, in a not-illustrated chemical box. The chemical box is intended to supply various kinds of treatment solutions to solution treatment apparatuses.

The solution supply apparatus 400 in FIG. 26 includes a treatment solution supply pipe line 450 as a supply pipe line connected to the discharge nozzle 142. In this embodiment, the treatment solution supply pipe line 450 is connected, at its end part on the side opposite to the discharge nozzle 142, to an intake port 401 for the treatment solution. Further, the intake port 401 connected with the treatment solution supply pipe line 450 is connected to an external pipe line S which is laid in a space of a factory or the like where the solution supply apparatus 400 is installed.

Therefore, the treatment solution supply pipe line 450 is connected, at its end part on the side opposite to the discharge nozzle 142, to the external pipe line S.

To the treatment solution supply pipe line 450, a developing solution as a treatment solution is supplied via the external pipe line S.

Further, the treatment solution supply pipe line 450 is provided with a buffer tank 202, a filter 203, and a pump 204 in this order from the upstream side.

The treatment solution supply pipe line 450 includes a first supply pipe line 450a which connects the intake port 401 and the buffer tank 202, a second supply pipe line 450b which connects the buffer tank 202 and the pump 402 and is provided with the filer 203, and a third supply pipe line 450c which connects the pump 402 and the discharge nozzle 142.

The first supply pipe line 450a is provided with a main opening/closing valve V41 and an opening/closing valve V42 in this order from the upstream side.

The second supply pipe line 450b is provided with an opening/closing valve V43 between the buffer tank 202 and the filter 203.

The third supply pipe line 250c is provided with a supply control valve 206.

The buffer tank 202 temporarily stores the developing solution additionally supplied via the external pipe line S. The buffer tank 202 is provided with a liquid level sensor (not illustrated) which detects a storage remaining amount so that the main opening/closing valve V41 and the opening/ closing valve V42 are opened and closed according to the detection result by the liquid level sensor to start/stop the additional supply of the developing solution to the buffer tank 202.

The filter 203 filters the developing solution to remove particles therein.

The pump 402 is intended to suck and feed the developing solution, and is composed of, for example, diaphragm pump being a variable displacement pump.

The solution supply apparatus 400 further includes a branch pipe line 451 branching off from a branch point located on the first supply pipe line 450a which connects the intake port 401 and the buffer tank 202. The first supply pipe line 450a where the branch point from which the branch pipe line 451 branches off is located is intended to connect the buffer tank 202 on the upstream side of the filter 203 and the intake port 401. In other words, the branch point from which the branch pipe line 451 branches off is located between the buffer tank 202 on the upstream side of the filter 203 and the intake port 401.

Further, the branch pipe line 451 is provided with a foreign substance detector 208 in order to detect foreign substances contained in the developing solution in the branch pipe line 451. The size of the foreign substance being the detection target by the foreign substance detector 208 is at a 100 nm level or more.

Further, the branch pipe line 451 is branched into a plurality of pipe lines 451a, 451b. The pipe line 451a located at an upper part in the vertical direction of the plurality of pipe lines 451a, 451b is provided with an opening/closing valve V44. The pipe line 451b located at a lower part in the vertical direction of the plurality of pipe lines 451a, 451b is provided to connect a portion on the upstream side of the opening/closing valve V44 on the pipe line 451a and a portion on the downstream side of the opening/closing valve V44 on the pipe line 451a. This pipe line 451b is provided with the aforementioned foreign substance detector 208. Note that a flowmeter 403 is provided at a portion on the downstream side of the foreign substance detector 208 on the pipe line 451b.

Further, the branch pipe line 451 is provided, at its portion on the upstream side from the branch point into the plurality of pipe lines 451a, 451b, with a flow rate control valve 404 and a flowmeter 405 in this order from the upstream side.

Note that the developing solution supplied to the branch pipe line 451 is drained from the end portion on the side opposite to the first supply pipe line 450a.

Next, the operation of the solution supply apparatus 400 will be explained based on FIG. 27 to FIG. 33. Note that in the following drawings, thick lines are used to illustrate pipes through which the developing solution flows to thereby omit the explanation of the open/closed states of some of the valves.

(Start-Up of the External Pipe Line S)

Figure 27:
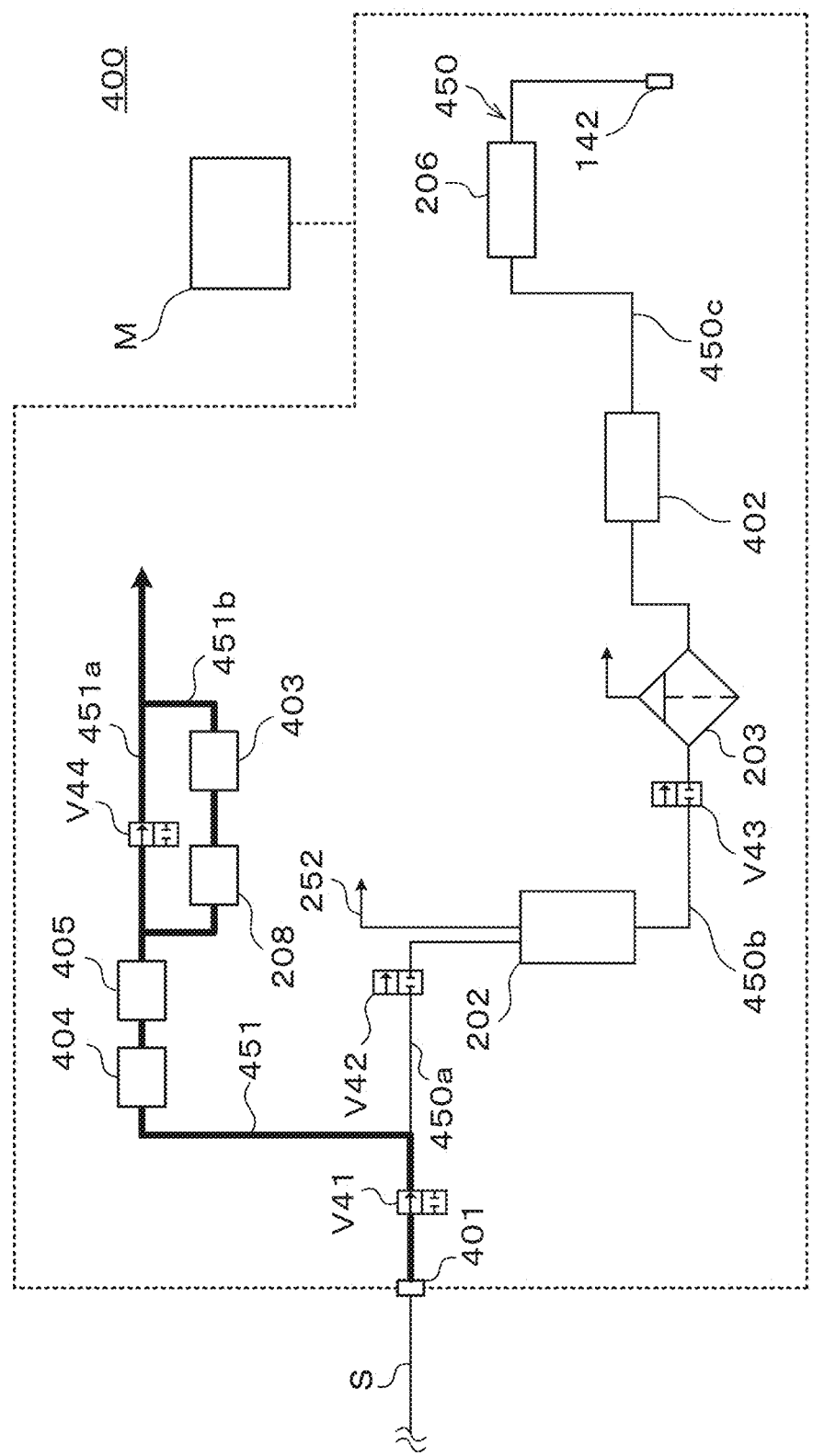
FIG. 27 illustrates a piping system for explaining the outline of the configuration of the solution supply apparatus and is an explanatory view of a step of starting-up an external pipe line.

As illustrated in FIG. 27, the main opening/closing valve V41 provided on the first supply pipe line 450a is brought into an open state based on the control signal from the controller M. In addition to this, the opening degree of the flow rate control valve 404 is increased, for example, into a full open state, and the opening/closing valve V44 provided on the pipe line 451a is brought into an open state. This drains the developing solution supplied and additionally supplied from the external pipe line S, via the branch pipe line 451 to perform purge.

(Start-Up Finish Determination)

Figure 28:
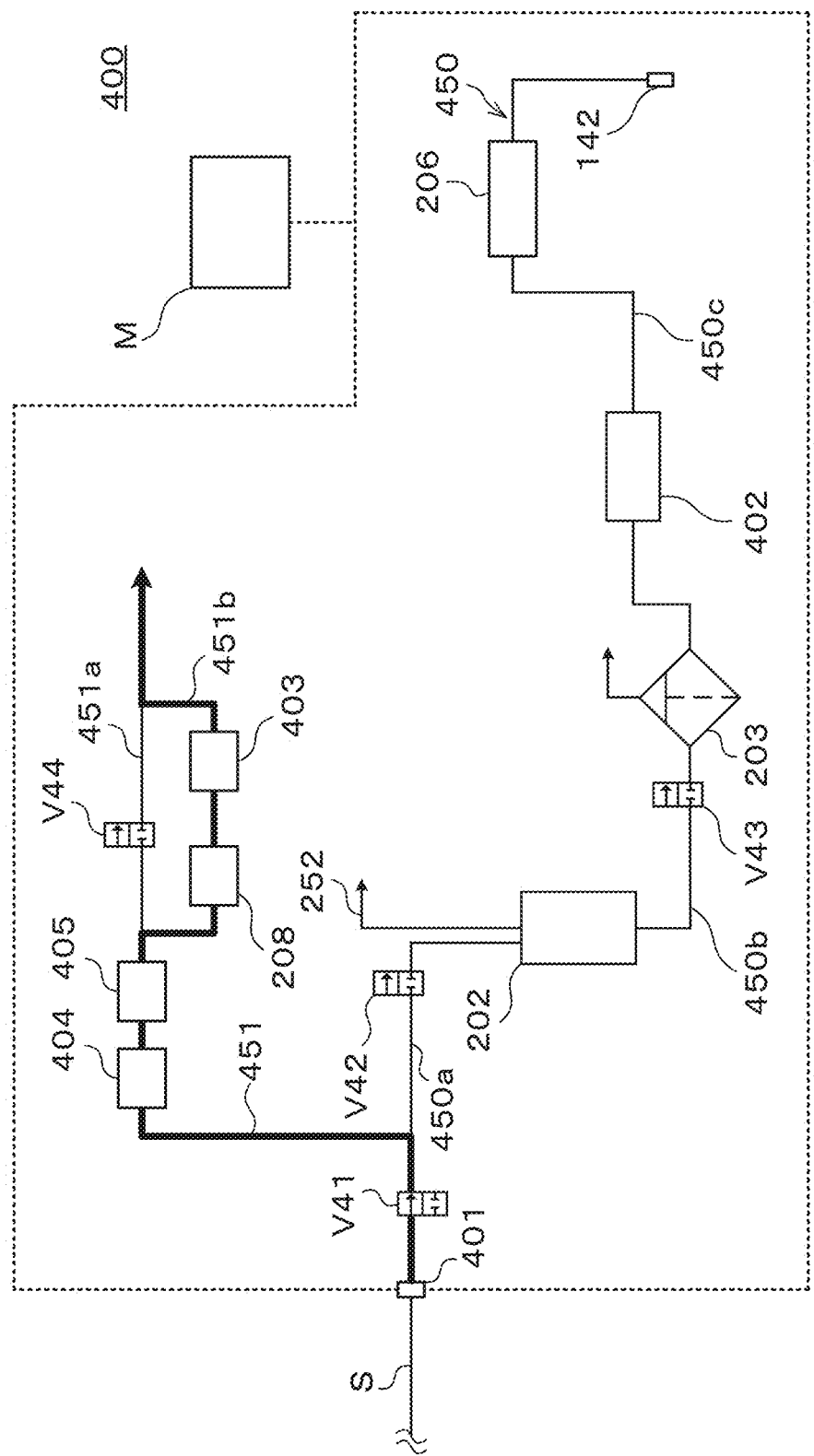
FIG. 28 illustrates the piping system for explaining the outline of the configuration of the solution supply apparatus and is an explanatory view of a start-up finish determination step.

For example, after a lapse of a predetermined time from start of the start-up processing of the external pipe line S, the opening/closing valve V44 provided on the pipe line 451a is brought into a closed state as illustrate in FIG. 28. In addition to this, the opening degree of the flow rate control valve 404 is adjusted based on the measurement result by the flowmeter 405 so that the developing solution at a predetermined flow rate (for example, 10 m/min) flows through the branch pipe line 451.

Then, the controller M performs determination of the state of the developing solution in the branch pipe line 451, more specifically, the state of the developing solution in the pipe line 451b based on the detection result by the foreign substance detector 208.

For example, when the number of foreign substances detected by the foreign substance detector 208 is equal to or more than a predetermined value and the state of the developing solution in the pipe line 451b, namely, the state of the developing solution additionally supplied via the external pipe line S is determined to be bad as a result of the determination, the solution supply apparatus 400 is returned to the state in FIG. 27 and the start-up processing of the external pipe line S is performed again.

For example, once the developing solution supplied from the external pipe line S is sufficiently drained by the start-up processing, the cleanliness of the developing solution additionally supplied via the external pipe line S increases, so that the number of foreign substances detected by the foreign substance detector 208 becomes less than the predetermined value. Then, the state of the developing solution in the pipe line 451b, namely, the state of the developing solution additionally supplied via the external pipe line S is determined to be good, and the additional supply of the developing solution to the buffer tank 202 is performed.

As in the above manner, when the state of the developing solution to be additionally supplied via the external pipe line S is determined to be bad, the additional supply of the developing solution to the buffer tank 202 is restricted in this embodiment.

Note that since the range of the flow rate of the developing solution at which an appropriate detection result is obtained is set in the foreign substance detector 208, the measurement of the flow rate by the flowmeter 403 is performed for confirmation whether the flow rate of the developing solution in the pipe line 451b falls within the above range, in determining the state of the developing solution.

(Additional Supply to the Buffer Tank 202)

Figure 29:
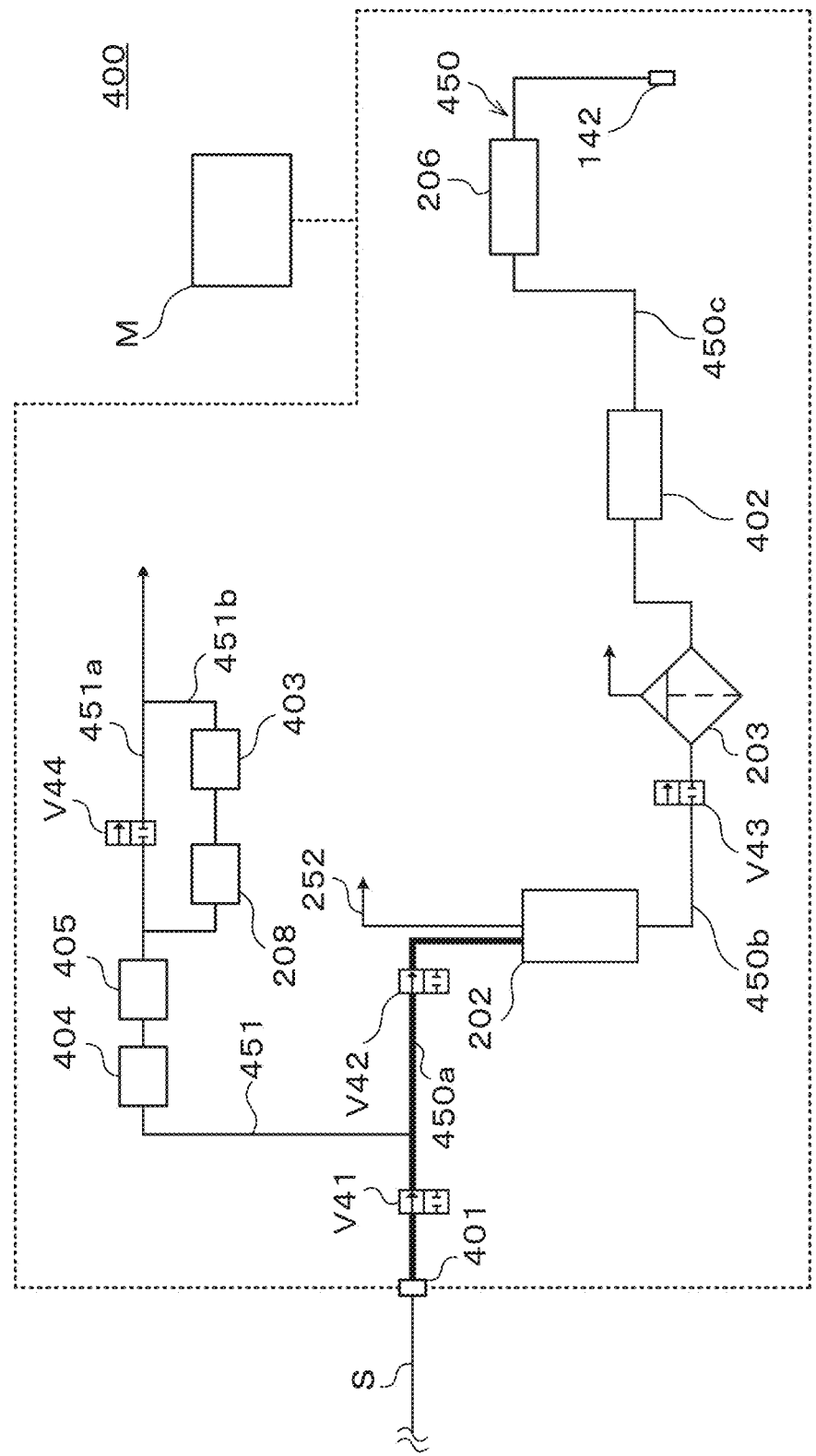
FIG. 29 illustrates the piping system for explaining the outline of the configuration of the solution supply apparatus and is an explanatory view of a step of additional supply to a buffer tank.

In additional supply to the buffer tank 202, the flow rate control valve 404 is brought into a closed state and the opening/closing valve 42 is brought into an open state as illustrated in FIG. 29. This additionally supplies the developing solution additionally supplied via the external pipe line S, to the buffer tank 202.

(Discharge)

Figure 30:
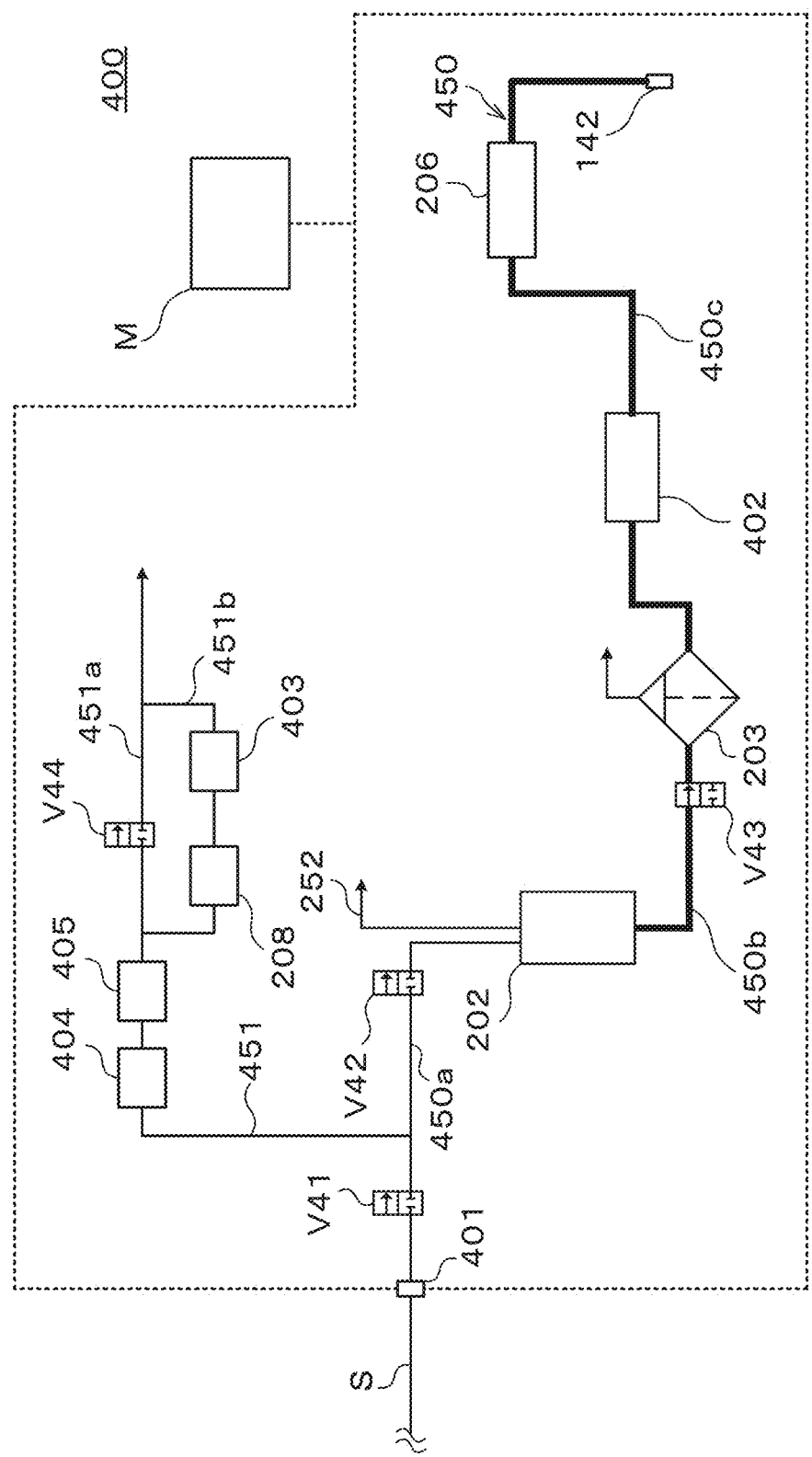
FIG. 30 illustrates the piping system for explaining the outline of the configuration of the solution supply apparatus and is an explanatory view of a step of discharge to the buffer tank.

Once a predetermined amount of the resist solution is additionally supplied into the buffer tank 202, the opening/closing valves V41, V42 are brought into a closed state as illustrated in FIG. 30. Then, the opening/closing valve V43 and the supply control valve 206 are brought into an open state and the pump 402 is driven. This discharges the developing solution in the buffer tank 202 to the wafer W via the discharge nozzle 142.

During normal operation, the above-explained step of additional supply to the buffer tank 202 and discharge step are repeated.

In this embodiment, the branch pipe line 451 branching off from the branch point located between the intake port 401 which is the end part on the external pipe line S side and the filter 203 as explained above. Then, the controller M determines the state of the developing solution to be additionally supplied via the external pipe line S based on the state of the developing solution in the branch pipe line 451. Further, when the state of the developing solution to be additionally supplied via the external pipe line S is bad as a result of the determination, the controller M outputs a control signal so that the developing solution is not additionally supplied to the buffer tank 202 but is drained.

Therefore, according to this embodiment, the buffer tank 202 and the portion on the downstream side of the buffer tank 202 of the solution supply apparatus 400 is never contaminated with the developing solution to be additionally supplied via the external pipe line S. Therefore, according to this embodiment, it is possible to supply a developing solution cleaner than that in the case of feeding the developing solution to the buffer tank 202 irrespective of the state of the developing solution to be additionally supplied via the external pipe line S. Further, according to this embodiment, the developing solution to be supplied can be made clean at all times.

Note that the branch point from which the branch pipe line 451 branches off is located, more specifically, between the buffer tank 202 on the upstream side of the filter 203 and the intake port 401 as explained above. Therefore, it is possible to more surely supply a clean developing solution to the buffer tank 202, and reduce the risk of making the developing solution stored in the buffer tank 202 into a defective solution.

Further, in this embodiment, whether the start-up of the external pipe line S has been completed is determined using the foreign substance detector 208 provided on the branch pipe line 451. A conceivable determination method other than the above is a method of discharging the developing solution additionally supplied via the external pipe line S onto the wafer via the discharge nozzle 142 without providing the branch pipe line 451 or the foreign substance detector 208 and determining the completion of the start-up based on the detection result of the discharged developing solution by the surface foreign substance inspection apparatus. As compared with this method, the determination method according to this embodiment does not require the discharge of the developing solution onto the wafer or the inspection using the surface foreign substance inspection apparatus. Therefore, the time required for the start-up of the external pipe line S can be reduced.

Note that the threshold value used for the determination whether the start-up of the external pipe line S has been completed is decided, for example, in the following manner. First, the correlation between the number of particles contained in the developing solution in the branch pipe line 451 detected by the foreign substance detector 208 and the number of particles contained in the developing solution discharged onto the wafer and detected by the surface foreign substance inspection apparatus is obtained. Then, the above threshold value is decided based on a management value set for the number of particles contained in the developing solution discharged onto the wafer and detectable by the surface foreign substance inspection apparatus and on the above correlation. Note that the above correlation is obtained for each factory (facility) where the solution supply apparatus 400 is installed and for each kind of treatment solution.

Further, the size of the foreign substance being the detection target by the foreign substance detector 208, which is used for the determination of the state of the developing solution to be additionally supplied via the external pipe line S, may be at a 100 nm level or more in this embodiment. Therefore, it is possible to use a less expensive foreign substance detector 208 than that in the case where the size of the foreign substance being the detection target is as small as at a 10 nm level, thus achieving a reduced cost.

In this embodiment, the pipe line 451*b* located at the lower part in the vertical direction of the plurality of pipe lines 451*a*, 451*b* is provided with the foreign substance detector 208. Therefore, when air bubbles are contained in the developing solution to be supplied to the branch pipe line 451, the air bubbles are guided to the pipe line 451*a* located at the upper part in the vertical direction and therefore never guided to the pipe line 451*b* and the foreign substance detector 208. Therefore, the air bubbles are never erroneously detected as particles in the foreign substance detector 208.

Note that since the air bubbles are accumulated in the pipe line 451*a*, the opening/closing valve V44 provided on the pipe line 451*a* is periodically brought into an open state.

Further, in the above example, only in the determination whether the start-up of the external pipe line S has been completed, the developing solution is made to flow to the branch pipe line 451 provided with the foreign substance detector 208 and the determination of the cleanliness of the developing solution to be additionally supplied from the external pipe line S is performed.

The determination of the cleanliness of the developing solution may be performed according to the timing of the additional supply of the developing solution to the buffer tank 202. For example, the determination of the cleanliness of the developing solution may be performed every time before the additional supply to the buffer tank 202 or may be performed every time a predetermined number of times of additional supply has elapsed.

Figure 31:
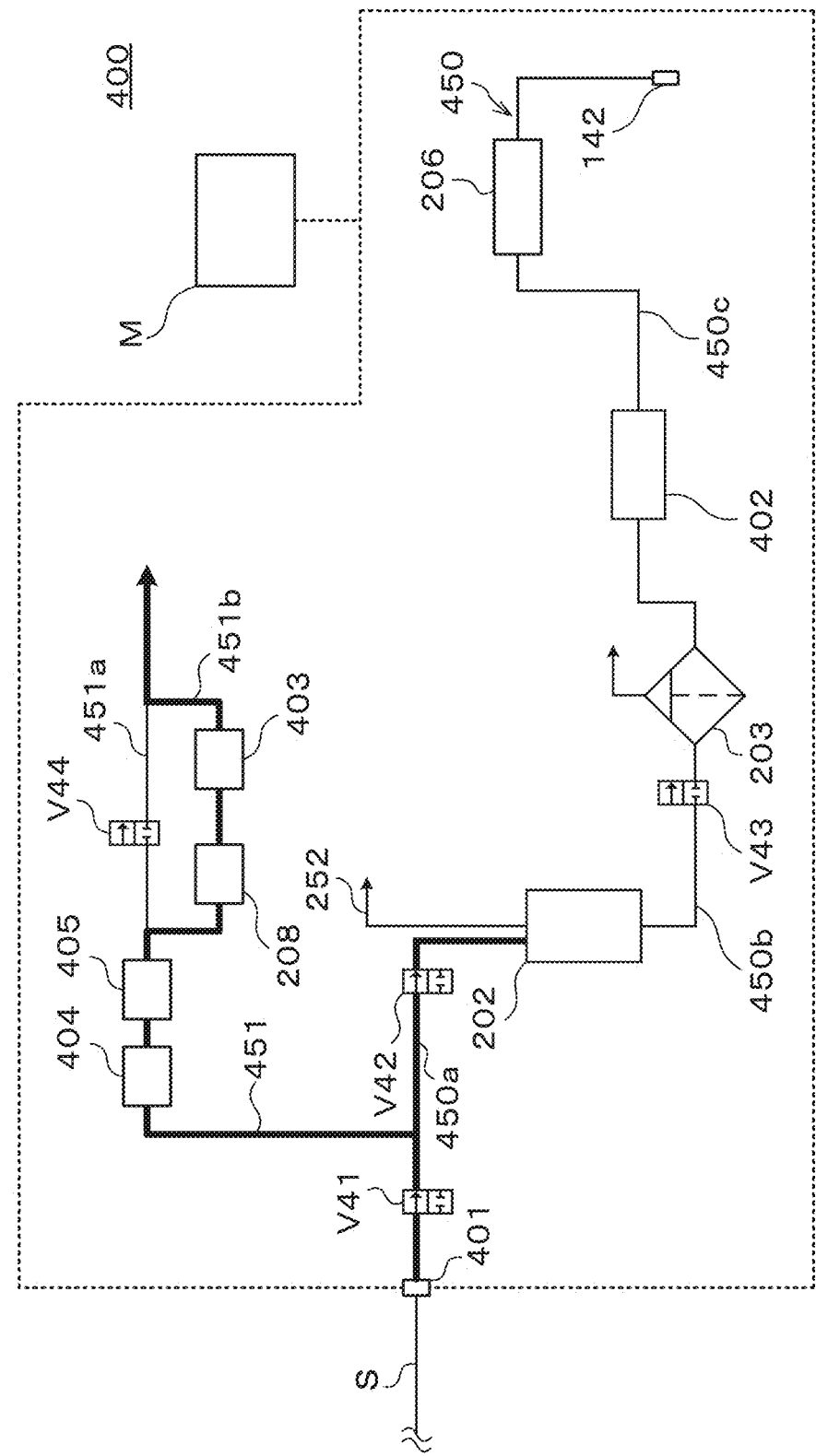
FIG. 31 illustrates the piping system for explaining the outline of the configuration of the solution supply apparatus and is an explanatory view of another example of a step of additional supply to the buffer tank.

Further, in the additional supply to the buffer tank 202, the developing solution from the external pipe line S may be made to flow to the branch pipe line 451 as illustrated in FIG. 31, and the determination of the cleanliness of the developing solution may be performed during the additional supply.

In this case, when the developing solution to be additionally supplied via the external pipe line S is determined to be bad as a result of the determination of the cleanliness, the additional supply of the developing solution to the buffer tank 202 is suspended. Then, the start-up processing of the external pipe line S, namely, purge may be performed again until the cleanliness becomes high again.

Note that the determination of the cleanliness of the developing solution from the external pipe line S may be performed periodically (for example, once in 10 minutes) irrespective of the timing of the additional supply to the buffer tank 202.

Further, when the developing solution is supplied to the branch pipe line 451 and the cleanliness of the developing solution from the external pipe line S is determined as explained above during the additional supply of the developing solution to the buffer tank 202, the opening degree of the flow rate control valve 404 is adjusted so that the flow rate of the developing solution flowing to the branch pipe line 451 is lower than the flow rate of the developing solution flowing to the buffer tank 202. This can prevent a decrease in efficiency of the additional supply to the buffer tank 202.

Note that when the state of the developing solution from the external pipe line S is determined to be bad, the controller M outputs the control signal so that the developing solution is drained in the above example. The controller M may output, in addition to the above signal or in place of the above control signal, a control signal so that the state is left to stand according to the state of the developing solution. More specifically, the controller M may output a control signal for making, via a display or the like, a notification that the developing solution from the external pipe line S is bad.

Besides, the foreign substance detector 208 is provided only on the branch pipe line 451 in this embodiment, but another foreign substance detector may be provided on the downstream side of the branch point from which the branch pipe line 451 branches off, more specifically, on the downstream side of the filter 203. Since the developing solution from which the another foreign substance detector detects foreign substances is the developing solution passed through the filter 203, the size of the foreign substance being the detection target by the another foreign substance detector is at a 10 nm level (10 to 80 nm) or more. The foreign substance detector 208 does not require to have a detection accuracy as high as that of the another foreign substance detector, and the size of the foreign substance being the detection target by the foreign substance detector 208 is, for example, at a 100 nm level or more as explained above. Hereinafter, the reason for adopting this configuration will be explained.

In the facility on the factory supply side which is not provided with means for suppressing foreign substances down to the degree of not exerting influence on the process, the number of detected foreign substances is less stable as the detection accuracy is higher. If the number of detected foreign substances is not stable, the determination of the cleanliness of the developing solution is difficult. Therefore, the detection target by the foreign substance detector 208 is set to a 100 nm level that is larger than that by the another foreign substance detector provided on the downstream side of the filter 203.

Note that the another foreign substance detector is provided, for example, between the filter 203 and the supply control valve 206.

Seventh Embodiment

Figure 32:
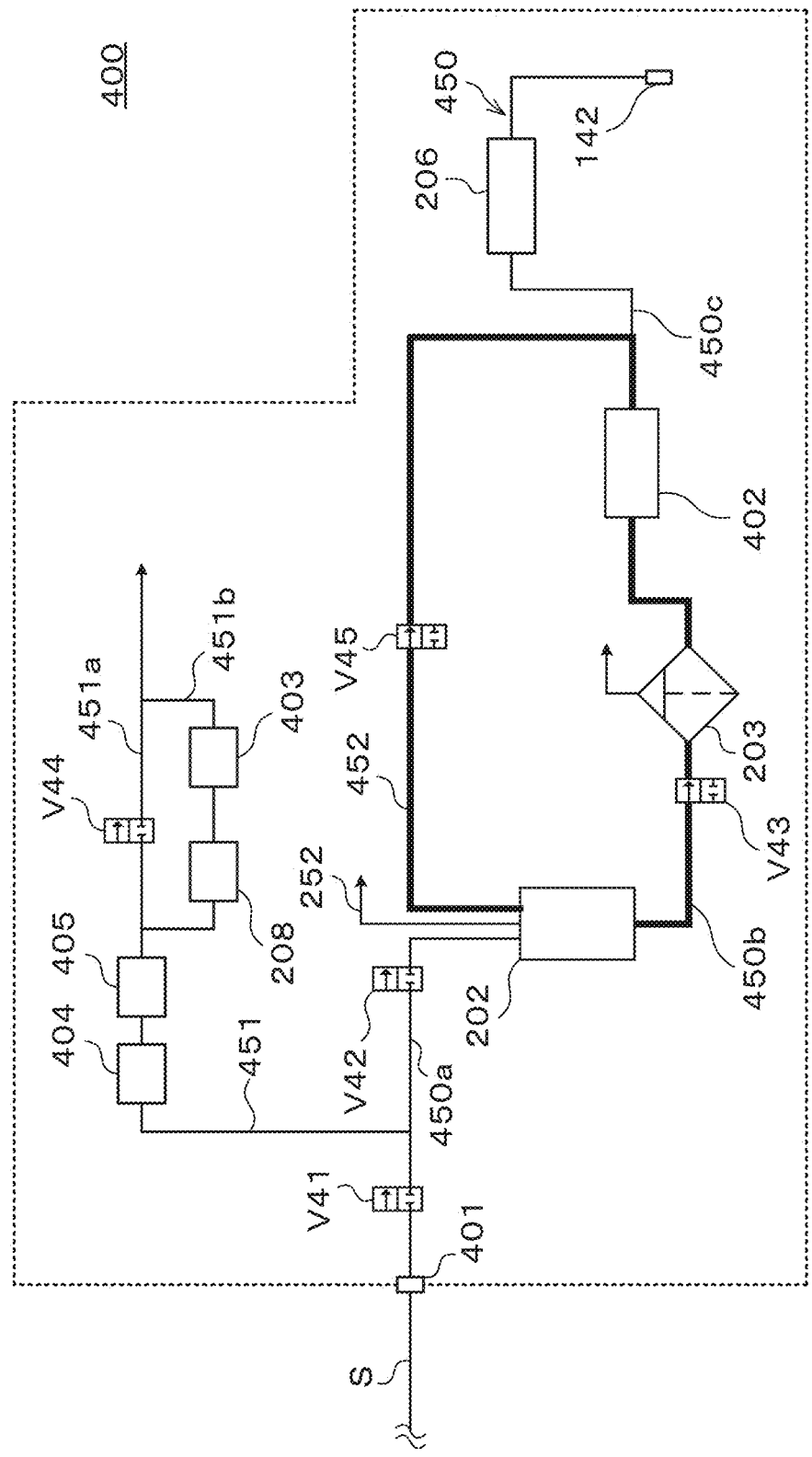
FIG. 32 is an explanatory view illustrating the outline of a configuration of a solution supply apparatus according to a seventh embodiment.

FIG. 32 is an explanatory view illustrating the outline of a configuration of a solution supply apparatus according to a seventh embodiment.

The solution supply apparatus 400 in this embodiment includes, as illustrated in FIG. 32, a return pipe line 452 in addition to the configuration of the solution supply apparatus according to the sixth embodiment. The return pipe line 452 is a pipe line which branches off from a branch point located on the upstream side of the supply control valve 206 on the third supply pipe line 450c and returns to the buffer tank 202.

The return pipe line 452 is provided with an opening/closing valve V45.

(Multifiltration Treatment)

In the solution supply apparatus in this embodiment, a multifiltration treatment step is performed after the step of additional supply of the developing solution to the buffer tank 202 and before the discharge step.

In the multifiltration treatment step, the opening/closing valve V43 and the opening/closing valve V44 are brought into an open state with the supply control valve 206 kept in a closed state. Then, the pump 402 is driven to circulate the developing solution in the buffer tank 202 via the return pipe line 452 while the developing solution is being filtered by the filter 203. By repeating the circulation, namely, by repeating the filtration by the filter 203, the developing solution in the buffer tank 202 increases in cleanliness.

In this embodiment, for example, when the developing solution from the external pipe line S is low in cleanliness but is not too low to be drained as a result of the determination based on the detection result by the foreign substance detector 208, the controller M performs the following control. For example, the controller M decides the number of times of filtration by the filter 203 at the above multifiltration treatment step according to the cleanliness. This can make the cleanliness of the developing solution in the buffer tank 202 suitable for the process.

Eighth Embodiment

Figure 33:
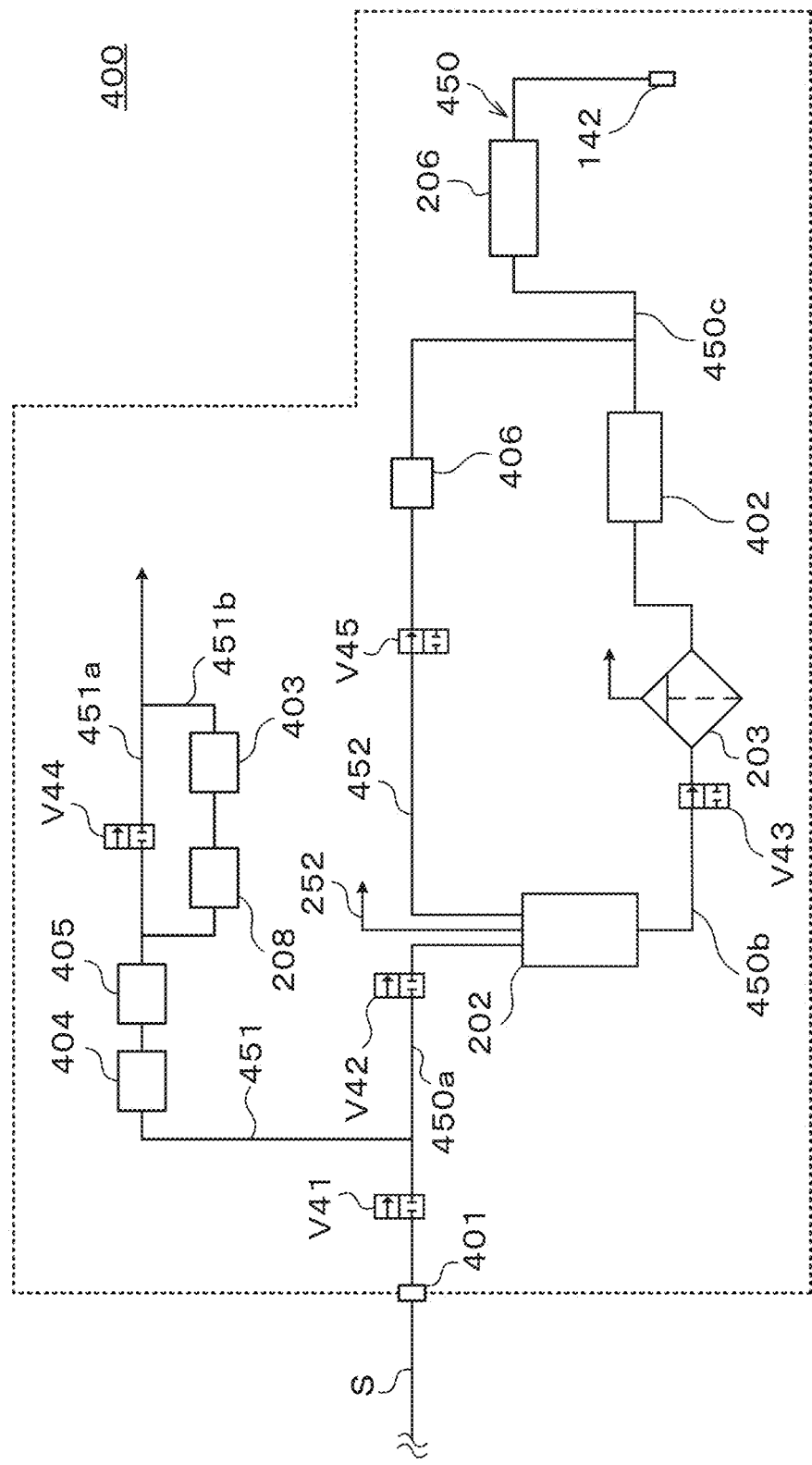
FIG. 33 is an explanatory view illustrating the outline of a configuration of a solution supply apparatus according to an eighth embodiment.

FIG. 33 is an explanatory view illustrating the outline of a configuration of a solution supply apparatus according to an eighth embodiment.

The solution supply apparatus 400 in this embodiment includes, as illustrated in FIG. 33, another foreign substance detector 406 in addition to the configuration of the solution supply apparatus according to the seventh embodiment. The foreign substance detector 406 is provided on the upstream side of a branch point located between the main opening/closing valve V41 and the opening/closing valve V42 on the first supply pipe line 450a, more specifically, on the return pipe line 452 through which the developing solution passed through the filter 203 passes. The foreign substance detector 406 and the foreign substance detector 208 have the same configuration.

In this embodiment, for example, when the state of the developing solution in the return pipe line 452 is determined to be bad as a result of the determination based on the detection result by the foreign substance detector 406, the controller M decides the condition of a treatment solution improving treatment according to the detection result by the foreign substance detector 208 provided on the branch pipe line 451.

More specifically, for example, when the state of the developing solution in the return pipe line 452 is determined to be bad and the number of particles equal to or more than the threshold value is detected by the foreign substance detector 208, the cause of the bad state of the developing solution in the return pipe line 452 can be thought to exist in the state of the external pipe line S. Therefore, in this case, the controller M outputs a control signal for performing the above step of starting-up the external pipe line S.

On the other hand, when that the state of the developing solution in the return pipe line 452 is determined to be bad and the number of particles equal to or more than the threshold value is not detected by the foreign substance detector provided on the branch pipe line 451, the cause of the bad state of the developing solution can be thought to exist in the solution supply apparatus 400. Therefore, in this case, the controller M outputs, for example, a control signal for performing the aforementioned multifiltration treatment step.

According to this embodiment, the place of the cause for generation of the foreign substances can be specified as explained above, so that the time required for re-cleaning the treatment solution to be supplied, namely, recovery can be reduced.

In the case where the branch pipe line 451 is provided and the foreign substance detector 208 is provided on the branch pipe line 451 as in the sixth to eighth embodiments, the controller M may specify a foreign substance occurrence mode based on the temporal change in the foreign substance detection result by the foreign substance detector 208 and perform a control according to the specified foreign substance occurrence mode. For example, when the number of particles detected by the foreign substance detector 208 gradually increases, the deterioration of the filter 203 can be thought to be the cause of the increase. Therefore, the controller M specifies this case as an unimprovable foreign substance occurrence mode in the purge of the external pipe line S and the above-explained multifiltration treatment. When the controller M specifies the unimprovable foreign substance occurrence mode as in the above manner, the controller M performs a control so that a notification to the effect is made via a display or the like.

When the foreign substance detector 406 which detects the foreign substances in the treatment solution filtered by the filter 203 is provided as in the eighth embodiment or the like, the controller M may specify a foreign substance occurrence mode based on the temporal change in the foreign substance detection result by the foreign substance detector 406 and perform a control according to the specified substance occurrence mode. For example, when the number of particles detected by the foreign substance detector 406 gradually increases, the deterioration of the filter provided on the external pipe line S can be through to be the cause of the increase. Therefore, the controller M specifies this case as an unimprovable foreign substance occurrence mode in the above-explained multifiltration treatment. When the controller M specifies the unimprovable foreign substance occurrence mode as in the above manner, the controller M performs a control so that a notification to the effect is made via a display or the like.

In the above explanation of the sixth to eighth embodiments, the treatment solution is the developing solution, but may be DIW or the like.

The above sixth to eighth embodiments are embodiments in which the treatment solution is supplied from the external pipe line, the branch point is provided at the position between the intake port 401 being the end part on the external pipe line S side and the filter 203 on the first supply pipe line 450a, and the branch pipe line 451 is connected to the branch point. In addition, the foreign substance detector 208 is provided on the branch pipe line 451.

Even in an embodiment in which the treatment solution is supplied not from the external pipe but from a treatment solution bottle such as a developing solution bottle or the like unlike the above sixth to eighth embodiments, a branch pipe line may be provided and the foreign substance detector 208 may be provided on the branch pipe line as in the above sixth to eighth embodiments. More specifically, a branch pipe line may be provided on the supply pipe line (see a code 250a in FIG. 6) connecting the treatment solution bottle and the buffer tank, and the foreign substance detector 208 may be provided on the branch pipe line. Further, whether to supply from the chemical bottle to the buffer tank may be determined based on the detection result by the foreign substance detector 208 as in the above sixth to eighth embodiments. This is because when the treatment solution is supplied from the treatment solution bottle to the buffer tank, the state of the treatment solution possibly changes at the replacement of the treatment solution bottle or stop of the treatment for a long period.

In other words, not only when the treatment solution is supplied from the external pipe line but also when the treatment solution is supplied from a container such as the chemical bottle or the like which is replaceable, the same effects as those in the sixth to eighth embodiments can be obtained.

Though the treatment object is the semiconductor wafer in the explanation, the treatment object is not limited to this but may be, for example, a glass substrate, an FPD (Flat Panel Display) substrate or the like.

The embodiments disclosed herein are merely examples in all respects and should not be considered to be restrictive. The above embodiments may be abbreviated, replaced, or changed in various forms without departing from the scope and spirit of the attached claims.

(1) A solution supply apparatus for supplying a treatment solution to a treatment solution discharger configured to discharge the treatment solution to a treatment object, the solution supply apparatus including:
  a supply pipe line connected to the treatment solution discharger;
  a filter provided on the supply pipe line and configured to filter the treatment solution to remove foreign substances; and
  a controller configured to perform a determination of a state of the treatment solution to be supplied to a primary side of the filter and, when the state of the treatment solution is determined to be bad, to output a control signal for restricting supply of the treatment solution to the primary side of the filter.

According to the (1), it is possible to supply a treatment solution having cleanliness suitable for manufacture of a micro semiconductor device.

(2) The solution supply apparatus according to the (1), wherein:
  the treatment solution is a coating solution for forming a coating film on the treatment object;
  the solution supply apparatus includes:
  a return pipe line configured to connect a portion on a secondary side of the filter on the supply pipe line and a portion on the primary side of the filter on the supply pipe line; and
  a drainage pipe line branched off from a branch point on the return pipe line and reaching a place different from the supply pipe line; and
  the controller is configured to:
  output a control signal for sending the coating solution filtered by the filter to the return pipe line;
  perform, as the determination, a determination of a state of the coating solution in the return pipe line;
  output a control signal for returning the coating solution in the return pipe line to the portion on the primary side of the filter on the supply pipe line when the state of the coating solution in the return pipe line is determined to be good; and
  output a control signal for draining the coating solution in the return pipe line from the drainage pipe line when the state of the coating solution in the return pipe line is determined to be bad.

According to the (2), the state of the coating solution fed to the return pipe line and filtered by the filter is determined, and the coating solution is returned to the primary side of the filter on the supply pipe line or drained based on the determination result. Therefore, it is possible to supply a cleaner coating solution while suppressing a consumption of the coating solution.

(3) The solution supply apparatus according to the (2), further including a foreign substance detector configured to detect foreign substances contained in the coating solution and provided on an upstream side of the branch point on the return pipe line, wherein the controller is configured to perform a determination of the state of the coating solution in the return pipe line based on a result of detection by the foreign substance detector.

(4) The solution supply apparatus according to the (2), wherein:

the controller is configured to:

output a control signal so that a dummy discharge is periodically performed from the treatment solution discharger; and perform a determination of the state of the coating solution in the return pipe line based on whether a period decided based on an interval of the dummy discharge has elapsed.

(5) The solution supply apparatus according to the (2), further including other foreign substance detectors configured to detect foreign substances contained in the coating solution and provided on both a primary side and a secondary side of the filter on the supply pipe line, wherein the controller is configured to perform a determination of a state of the filter based on results of detection by the other foreign substance detectors.

(6) The solution supply apparatus according to the (1), wherein:

the treatment solution is a coating solution for forming a coating film on the treatment object;

the supply pipe line is connected, at an end part on a side opposite to the treatment solution discharger, to a supply source storing the coating solution;

the solution supply apparatus further includes:

a drainage pipe line branched off from a branch point located on the primary side of the filter on the supply pipe line; and a foreign substance detector provided on an upstream side of the branch point on the supply pipe line and configured to detect foreign substances contained in the coating solution in the supply pipe line; and the controller is configured to:

perform, as the determination, a determination of a state of the supply source based on a result of detection by the foreign substance detector; and output a control signal for supplying the coating solution in the supply source to the primary side of the filter only when the state of the supply source is determined to be good.

According to the (6), the state of the coating solution in the coating solution supply source is determined based on the determination result by the foreign substance detector provided on the upstream side of the branch point to the exhaust pipe on the supply pipe line, and the coating solution is supplied to the downstream side of the supply pipe line or drained based on the determination result. Therefore, it is possible to supply a cleaner coating solution.

(7) The solution supply apparatus according to the (6), further including a circulation pipe line connecting a primary side and a secondary side of the foreign substance detector on the supply pipe line, wherein the controller is configured to:

output a control signal for returning the coating solution passed through the foreign substance detector to the primary side of the foreign substance detector on the supply pipe line via the circulation pipe line; and perform a determination of the state of the supply source based on results of detection in a plurality of times by the foreign substance detector.

(8) The solution supply apparatus according to the (6), further including other foreign substance detectors configured to detect foreign substances contained in the coating solution and provided on both a primary side and a secondary side of the filter on the supply pipe line, wherein the controller is configured to perform a determination of a state of the filter based on results of detection by the other foreign substance detectors.

(9) The solution supply apparatus according to the (1), wherein:

the supply pipe line is connected, at an end part on a side opposite to the treatment solution discharger, to an external pipe line laid in a space where the solution supply apparatus is installed;

the solution supply apparatus further includes a branch pipe line branched off from a branch point located between an end part on the external pipe line side on the supply pipe line and the filter; and the controller is configured to:

perform, as the determination, a determination of a state of the treatment solution to be additionally supplied to the solution supply apparatus via the external pipe line; and output a control signal for restricting supply of the treatment solution to be additionally supplied via the external pipe line, to a downstream side of the branch point on the supply pipe line, when the state of the treatment solution to be additionally supplied to the solution supply apparatus via the external pipe line is determined to be bad.

According to the (9), the state of the treatment solution additionally supplied from the external pipe line to the branch pipe line is determined, and the treatment solution is supplied to the downstream side of the branch point of the branch pipe line on the supply pipe line or drained based on the determination result. Therefore, it is possible to supply a cleaner treatment solution.

(10) The solution supply apparatus according to the (9), further including a foreign substance detector provided on the branch pipe line and configured to detect foreign substances contained in the treatment solution in the branch pipe line, wherein the controller is configured to perform a determination of a state of the treatment solution to be additionally supplied via the external pipe line based on a result of detection by the foreign substance detector.

(11) The solution supply apparatus according to the (10), further including another foreign substance detector configured to detect foreign substances contained in the treatment solution supplied to a downstream side of the branch point on the supply pipe line, wherein:

a size of the foreign substance of the detection target of the foreign substance detector is larger than that of the another foreign substance detector; and the controller is configured to perform the determination of the state of the treatment solution to be additionally supplied via the external pipe line based on a result of detection by the foreign substance detector of which the size of the foreign substance of the detection target is larger than that of the another foreign substance detector.

(12) The solution supply apparatus according to the (10), wherein the branch pipe line is branched into a plurality of pipe lines, and a pipe line located at a lower part in a vertical direction of the plurality of pipe lines is provided with the foreign substance detector.

(13) The solution supply apparatus according to the (9), wherein a flow rate of the treatment solution flowing to the branch pipe line is lower than a flow rate of the treatment solution flowing to the downstream side of the branch point of the supply pipe line.

(14) The solution supply apparatus according to the (9), further including a temporary storage configured to temporarily store the treatment solution, wherein the controller is configured to perform a determination of the state of the treatment solution to be additionally supplied via the external pipe line according to timing when supplying the treatment solution to be additionally supplied via the external pipe line, to the temporary storage.

(15) The solution supply apparatus according to the (9), wherein the controller is configured to decide a number of times of filtration by the filter for the treatment solution to be supplied to the treatment solution discharger according to the state of the treatment solution to be additionally supplied to the solution supply apparatus via the external pipe line.

(16) The solution supply apparatus according to the (9), wherein the controller is configured to output a control signal for making a notification of the state according to the state of the treatment solution to be additionally supplied to the solution supply apparatus via the external pipe line.

(17) The solution supply apparatus according to the (10), further including another foreign substance detector configured to detect foreign substances contained in the treatment solution supplied to the downstream side of the branch point on the supply pipe line, wherein the controller is configured to decide a condition of a treatment solution improving treatment according to a result of detection by the foreign substance detector provided on the branch pipe line when the state of the treatment solution is determined to be bad by the another foreign substance detector.

(18) The solution supply apparatus according to the (10), wherein the controller is configured to specify a foreign substance occurrence mode based on a temporal change in the result of detection by the foreign substance detector provided on the branch pipe line and perform a control according to the specified foreign substance occurrence mode.

(19) The solution supply apparatus according to the (17), wherein the controller is configured to specify a foreign substance occurrence mode based on a temporal change in a result of detection by the another foreign substance detector and perform a control according to the specified foreign substance occurrence mode.

(20) A solution supply method for supplying a treatment solution to a treatment solution discharger configured to discharge the treatment solution to a treatment object, the treatment solution discharger being connected with a supply pipe line, and the supply pipe line being provided with a filter configured to filter the treatment solution to remove foreign substances, the solution supply method including:

performing a determination of a state of the treatment solution to be supplied to a primary side of the filter;

supplying the treatment solution to the primary side of the filter when the state of the treatment solution is determined to be good; and draining the treatment solution when the state of the treatment solution is determined to be bad.

EXPLANATION OF CODES 142 discharge nozzle
200 resist solution supply apparatus
203 filter
250 coating solution supply pipe line
400 solution supply apparatus
450 treatment solution supply pipe line
M controller

What is claimed is:

1. A solution supply apparatus for supplying a treatment solution to a treatment solution discharger configured to discharge the treatment solution to a treatment object, the solution supply apparatus comprising:

a supply pipe line connected to the treatment solution discharger, wherein the supply pipe line is connected, at an end part on a side opposite to the treatment solution discharger, to an external pipe line laid in a space where the solution supply apparatus is installed;

a filter provided on the supply pipe line and configured to filter the treatment solution to remove foreign substances; wherein the solution supply apparatus further comprises a branch pipe line branched off from a branch point located between an end part on the external pipe line side on the supply pipe line and the filter;

a foreign substance detector provided on the branch pipe line and configured to detect foreign substances contained in the treatment solution in the branch pipe line;

another foreign substance detector configured to detect foreign substances contained in the treatment solution supplied to a downstream side of the filter on the supply pipe line, wherein:

a size of the foreign substance of the detection target of the foreign substance detector is larger than that of the another foreign substance detector; and a controller configured to perform a determination of a state of the treatment solution to be supplied to a primary side of the filter and, when the state of the treatment solution is determined to be bad, to output a control signal for restricting supply of the treatment solution to the primary side of the filter, wherein:

the controller is configured to:

perform, as the determination, a determination of a state of the treatment solution to be additionally supplied to the solution supply apparatus via the external pipe line; and output a control signal for restricting supply of the treatment solution to be additionally supplied via the external pipe line, to a downstream side of the branch point on the supply pipe line, when the state of the treatment solution to be additionally supplied to the solution supply apparatus via the external pipe line is determined to be bad, the controller is configured to perform the determination of a state of the treatment solution to be additionally supplied via the external pipe line based on a result of detection by the foreign substance detector, and the controller is configured to perform the determination of the state of the treatment solution to be additionally supplied via the external pipe line based on a result of detection by the foreign substance detector of which the size of the foreign substance of the detection target is larger than that of the another foreign substance detector.

2. The solution supply apparatus according to claim 1, wherein:

the treatment solution is a coating solution for forming a coating film on the treatment object;

the solution supply apparatus comprises:

a return pipe line configured to connect a portion on a secondary side of the filter on the supply pipe line and a portion on the primary side of the filter on the supply pipe line; and a drainage pipe line branched off from a branch point on the return pipe line and reaching a place different from the supply pipe line; and the controller is configured to:
output a control signal for sending the coating solution filtered by the filter to the return pipe line;
perform, as the determination, a determination of a state of the coating solution in the return pipe line;
output a control signal for returning the coating solution in the return pipe line to the portion on the primary side of the filter on the supply pipe line when the state of the coating solution in the return pipe line is determined to be good; and
output a control signal for draining the coating solution in the return pipe line from the drainage pipe line when the state of the coating solution in the return pipe line is determined to be bad.

3. The solution supply apparatus according to claim 2, further comprising an additional foreign substance detector configured to detect foreign substances contained in the coating solution and provided on an upstream side of the branch point on the return pipe line, wherein
the controller is configured to perform a determination of the state of the coating solution in the return pipe line based on a result of detection by the additional foreign substance detector.

4. The solution supply apparatus according to claim 2, wherein:
the controller is configured to:
output a control signal so that a dummy discharge is periodically performed from the treatment solution discharger; and
perform a determination of the state of the coating solution in the return pipe line based on whether a period decided based on an interval of the dummy discharge has elapsed.

5. The solution supply apparatus according to claim 2, further comprising other foreign substance detectors configured to detect foreign substances contained in the coating solution and provided on both a primary side and a secondary side of the filter on the supply pipe line, wherein
the controller is configured to perform a determination of a state of the filter based on results of detection by the other foreign substance detectors.

6. The solution supply apparatus according to claim 1, wherein:
the treatment solution is a coating solution for forming a coating film on the treatment object;
the supply pipe line is connected, at an end part on a side opposite to the treatment solution discharger, to a supply source storing the coating solution;
the solution supply apparatus further comprises:
a drainage pipe line branched off from a branch point located on the primary side of the filter on the supply pipe line; and
an additional foreign substance detector provided on an upstream side of the branch point on the supply pipe line and configured to detect foreign substances contained in the coating solution in the supply pipe line; and
the controller is configured to:
perform, as the determination, a determination of a state of the supply source based on a result of detection by the additional foreign substance detector; and
output a control signal for supplying the coating solution in the supply source to the primary side of the filter only when the state of the supply source is determined to be good.

7. The solution supply apparatus according to claim 6, further comprising a circulation pipe line connecting a primary side and a secondary side of the foreign substance detector on the supply pipe line, wherein
the controller is configured to:
output a control signal for returning the coating solution passed through the foreign substance detector to the primary side of the foreign substance detector on the supply pipe line via the circulation pipe line; and
perform the determination of the state of the supply source based on results of detection in a plurality of times by the foreign substance detector.

8. The solution supply apparatus according to claim 6, further comprising other foreign substance detectors configured to detect foreign substances contained in the coating solution and provided on both a primary side and a secondary side of the filter on the supply pipe line, wherein
the controller is configured to perform a determination of a state of the filter based on results of detection by the other foreign substance detectors.

9. The solution supply apparatus according to claim 1, wherein
the branch pipe line is branched into a plurality of pipe lines, and a pipe line located at a lower part in a vertical direction of the plurality of pipe lines is provided with the foreign substance detector.

10. The solution supply apparatus according to claim 1, wherein
a flow rate of the treatment solution flowing to the branch pipe line is lower than a flow rate of the treatment solution flowing to the downstream side of the branch point of the supply pipe line.

11. The solution supply apparatus according to claim 1, further comprising a temporary storage configured to temporarily store the treatment solution, wherein
the controller is configured to perform a determination of the state of the treatment solution to be additionally supplied via the external pipe line according to timing when supplying the treatment solution to be additionally supplied via the external pipe line, to the temporary storage.

12. A solution supply apparatus for supplying a treatment solution to a treatment solution discharger configured to discharge the treatment solution to a treatment object, the solution supply apparatus comprising:
a supply pipe line connected to the treatment solution discharger;
a filter provided on the supply pipe line and configured to filter the treatment solution to remove foreign substances; and
a controller configured to perform a determination of a state of the treatment solution to be supplied to a primary side of the filter and, when the state of the treatment solution is determined to be bad, to output a control signal for restricting supply of the treatment solution to the primary side of the filter,
wherein:
the supply pipe line is connected, at an end part on a side opposite to the treatment solution discharger, to an external pipe line laid in a space where the solution supply apparatus is installed;
the solution supply apparatus further comprises a branch pipe line branched off from a branch point located between an end part on the external pipe line side on the supply pipe line and the filter; and the controller is configured to:
perform, as the determination, a determination of a state of the treatment solution to be additionally supplied to the solution supply apparatus via the external pipe line; and
output a control signal for restricting supply of the treatment solution to be additionally supplied via the external pipe line, to a downstream side of the branch point on the supply pipe line, when the state of the treatment solution to be additionally supplied to the solution supply apparatus via the external pipe line is determined to be bad; wherein
the controller is configured to decide a number of times of filtration by the filter for the treatment solution to be supplied to the treatment solution discharger according to the state of the treatment solution to be additionally supplied to the solution supply apparatus via the external pipe line.

13. The solution supply apparatus according to claim 1, wherein
the controller is configured to output a control signal for making a notification of the state according to the state of the treatment solution to be additionally supplied to the solution supply apparatus via the external pipe line.

14. The solution supply apparatus according to claim 12, wherein:
the treatment solution is a coating solution for forming a coating film on the treatment object;
the solution supply apparatus comprises:
a return pipe line configured to connect a portion on a secondary side of the filter on the supply pipe line and a portion on the primary side of the filter on the supply pipe line; and
a drainage pipe line branched off from a branch point on the return pipe line and reaching a place different from the supply pipe line; and
the controller is configured to:
output a control signal for sending the coating solution filtered by the filter to the return pipe line;
perform, as the determination, a determination of a state of the coating solution in the return pipe line;
output a control signal for returning the coating solution in the return pipe line to the portion on the primary side of the filter on the supply pipe line when the state of the coating solution in the return pipe line is determined to be good; and
output a control signal for draining the coating solution in the return pipe line from the drainage pipe line when the state of the coating solution in the return pipe line is determined to be bad.

15. The solution supply apparatus according to claim 14, further comprising a foreign substance detector configured to detect foreign substances contained in the coating solution and provided on an upstream side of the branch point on the return pipe line, wherein
the controller is configured to perform a determination of the state of the coating solution in the return pipe line based on a result of detection by the foreign substance detector.

16. A solution supply apparatus for supplying a treatment solution to a treatment solution discharger configured to discharge the treatment solution to a treatment object, the solution supply apparatus comprising:
a supply pipe line connected to the treatment solution discharger, wherein the supply pipe line is connected, at an end part on a side opposite to the treatment solution discharger, to an external pipe line laid in a space where the solution supply apparatus is installed;
a filter provided on the supply pipe line and configured to filter the treatment solution to remove foreign substances, wherein the solution supply apparatus further comprises a branch pipe line branched off from a branch point located between an end part on the external pipe line side on the supply pipe line and the filter;
a foreign substance detector provided on the branch pipe line and configured to detect foreign substances contained in the treatment solution in the branch pipe line; and
a controller configured to perform a determination of a state of the treatment solution to be supplied to a primary side of the filter and, when the state of the treatment solution is determined to be bad, to output a control signal for restricting supply of the treatment solution to the primary side of the filter, wherein:
the controller is configured to:
perform, as the determination, a determination of a state of the treatment solution to be additionally supplied to the solution supply apparatus via the external pipe line; and
output a control signal for restricting supply of the treatment solution to be additionally supplied via the external pipe line, to a downstream side of the branch point on the supply pipe line, when the state of the treatment solution to be additionally supplied to the solution supply apparatus via the external pipe line is determined to be bad; and
the controller is configured to perform the determination of a state of the treatment solution to be additionally supplied via the external pipe line based on a result of detection by the foreign substance detector,
further comprising another foreign substance detector configured to detect foreign substances contained in the treatment solution supplied to the downstream side of the branch point on the supply pipe line, wherein
the controller is configured to decide a condition of a treatment solution improving treatment according to a result of detection by the foreign substance detector provided on the branch pipe line when the state of the treatment solution is determined to be bad by the another foreign substance detector.

17. The solution supply apparatus according to claim 16, wherein
the controller is configured to specify a foreign substance occurrence mode based on a temporal change in a result of detection by the another foreign substance detector and perform a control according to the specified foreign substance occurrence mode.

18. The solution supply apparatus according to claim 16, wherein:
the treatment solution is a coating solution for forming a coating film on the treatment object;
the solution supply apparatus comprises:
a return pipe line configured to connect a portion on a secondary side of the filter on the supply pipe line and a portion on the primary side of the filter on the supply pipe line; and
a drainage pipe line branched off from a branch point on the return pipe line and reaching a place different from the supply pipe line; and
the controller is configured to:
output a control signal for sending the coating solution filtered by the filter to the return pipe line;

perform, as the determination, a determination of a state of the coating solution in the return pipe line;

output a control signal for returning the coating solution in the return pipe line to the portion on the primary side of the filter on the supply pipe line when the state of the coating solution in the return pipe line is determined to be good; and output a control signal for draining the coating solution in the return pipe line from the drainage pipe line when the state of the coating solution in the return pipe line is determined to be bad.

19. A solution supply apparatus for supplying a treatment solution to a treatment solution discharger configured to discharge the treatment solution to a treatment object, the solution supply apparatus comprising:

a supply pipe line connected to the treatment solution discharger, wherein the supply pipe line is connected, at an end part on a side opposite to the treatment solution discharger, to an external pipe line laid in a space where the solution supply apparatus is installed;

a filter provided on the supply pipe line and configured to filter the treatment solution to remove foreign substances, wherein the solution supply apparatus further comprises a branch pipe line branched off from a branch point located between an end part on the external pipe line side on the supply pipe line and the filter;

a foreign substance detector provided on the branch pipe line and configured to detect foreign substances contained in the treatment solution in the branch pipe line; and a controller configured to perform a determination of a state of the treatment solution to be supplied to a primary side of the filter and, when the state of the treatment solution is determined to be bad, to output a control signal for restricting supply of the treatment solution to the primary side of the filter, wherein:

the controller is configured to:

perform, as the determination, a determination of a state of the treatment solution to be additionally supplied to the solution supply apparatus via the external pipe line; and output a control signal for restricting supply of the treatment solution to be additionally supplied via the external pipe line, to a downstream side of the branch point on the supply pipe line, when the state of the treatment solution to be additionally supplied to the solution supply apparatus via the external pipe line is determined to be bad; and the controller is configured to perform the determination of a state of the treatment solution to be additionally supplied via the external pipe line based on a result of detection by the foreign substance detector, wherein the controller is configured to specify a foreign substance occurrence mode based on a temporal change in the result of detection by the foreign substance detector provided on the branch pipe line and perform a control according to the specified foreign substance occurrence mode.

20. The solution supply apparatus according to claim 19, wherein:

the treatment solution is a coating solution for forming a coating film on the treatment object;

the solution supply apparatus comprises:

a return pipe line configured to connect a portion on a secondary side of the filter on the supply pipe line and a portion on the primary side of the filter on the supply pipe line; and a drainage pipe line branched off from a branch point on the return pipe line and reaching a place different from the supply pipe line; and the controller is configured to:

output a control signal for sending the coating solution filtered by the filter to the return pipe line;

perform, as the determination, a determination of a state of the coating solution in the return pipe line;

output a control signal for returning the coating solution in the return pipe line to the portion on the primary side of the filter on the supply pipe line when the state of the coating solution in the return pipe line is determined to be good; and output a control signal for draining the coating solution in the return pipe line from the drainage pipe line when the state of the coating solution in the return pipe line is determined to be bad.

\* \* \* \* \*